United States Patent
Yamazaki et al.

(10) Patent No.: US 8,987,730 B2
(45) Date of Patent: Mar. 24, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP); Satoru Saito, Tochigi (JP); Terumasa Ikeyama, Toride (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/751,767

(22) Filed: Jan. 28, 2013

(65) Prior Publication Data

US 2013/0200367 A1 Aug. 8, 2013

(30) Foreign Application Priority Data

Feb. 3, 2012 (JP) ................. 2012-022457

(51) Int. Cl.
*H01L 29/04* (2006.01)
*H01L 29/786* (2006.01)
*H01L 29/417* (2006.01)

(52) U.S. Cl.
CPC ...... *H01L 29/7869* (2013.01); *H01L 29/41733* (2013.01)
USPC ................. 257/43; 257/52; 257/72; 257/350; 257/59; 438/158

(58) Field of Classification Search
CPC ..... H01L 27/01; H01L 27/12; H01L 31/0392; H01L 29/786; H01L 21/44; H01L 21/84; H01L 31/112
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — David Vu
*Assistant Examiner* — Mouloucoulaye Inoussa
(74) *Attorney, Agent, or Firm* — Eric J. Robinson; Robinson Intellectual Property Law Office, P.C.

(57) ABSTRACT

An object of one embodiment of the present invention is to provide a highly reliable semiconductor device by giving stable electric characteristics to a transistor including an oxide semiconductor film. The semiconductor device includes a gate electrode layer over a substrate, a gate insulating film over the gate electrode layer, an oxide semiconductor film over the gate insulating film, a drain electrode layer provided over the oxide semiconductor film to overlap with the gate electrode layer, and a source electrode layer provided to cover an outer edge portion of the oxide semiconductor film. The outer edge portion of the drain electrode layer is positioned on the inner side than the outer edge portion of the gate electrode layer.

13 Claims, 23 Drawing Sheets

(56) References Cited

U.S. PATENT DOCUMENTS

| | | | |
|---|---|---|---|
| 5,847,413 A * | 12/1998 | Yamazaki et al. | 257/69 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0036072 A1 * | 2/2004 | Tsujimura et al. | 257/72 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0068335 A1 * | 3/2011 | Yamazaki et al. | 257/43 |
| 2011/0121887 A1 | 5/2011 | Kato et al. | |
| 2011/0248268 A1 * | 10/2011 | Dairiki et al. | 257/57 |
| 2013/0134422 A1 | 5/2013 | Tsubuku | |
| 2013/0135278 A1 | 5/2013 | Toyotaka | |
| 2013/0200366 A1 | 8/2013 | Koyama | |
| 2014/0021475 A1 * | 1/2014 | Moon et al. | 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-160469 | 6/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 ; SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H at al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H at al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y at al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H at al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H at al., "Polymer-Stabilized Liquid Crystal Blue Phases,", Nature Materials, Sep. 2, 2002, vol. 1, pp. 64-68.

Kimizuka.N. at al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H at al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanes Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

1200

SEMICONDUCTOR DEVICE

BACKGROUND OF THE INVENTION

1. Field of the Invention

The present invention relates to a semiconductor device and a manufacturing method thereof.

In this specification, a semiconductor device refers to a device which can function by utilizing semiconductor characteristics; a transistor, an electro-optical device, a semiconductor circuit, and an electronic device are all included in the category of the semiconductor device.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

Electric characteristics of a transistor in which a channel is formed in an oxide semiconductor film might change depending on processing conditions or heat treatment conditions. This change is probably caused by entry of impurities such as hydrogen in forming the oxide semiconductor film or by release of oxygen from the oxide semiconductor film. Further, it has been found that this change tends to be obvious at an end portion of the oxide semiconductor film. In other words, it has been found that in the transistor in which the channel is formed in the oxide semiconductor film, the end portion of the oxide semiconductor film becomes a low-resistance region and a parasitic channel of the transistor is easily formed in the region. Note that the transistor has a possibility that two kinds of channels are formed in accordance with a voltage between a gate and a source: a channel (also referred to as a first channel) formed in a region of an oxide semiconductor film, which overlaps with a gate and is on the shortest path between a source and a drain, and a parasitic channel (also referred to as a second channel) are formed.

In the transistor in which two kinds of channels are possibly formed, each threshold voltage (a voltage between the gate and the source at which the channel is formed) differs in many cases. Typically, the threshold voltage at which the first channel is formed is higher than the threshold voltage at which the second channel is formed. The current drive capability of the first channel is higher than that of the second channel. Thus, in the case where the gate voltage (the voltage between the gate and the source) of the transistor in an off state is increased, a current between the source and the drain changes in two stages. Specifically, a change in the first stage (an increase in the current between the source and the drain) is observed in the vicinity of the threshold voltage at which the second channel is formed, and then, a change in the second stage (an increase in the current between the source and the drain) is observed in the vicinity of the threshold voltage at which the first channel is formed.

In view of the above problem, an object is to provide a highly reliable semiconductor device in which a transistor using an oxide semiconductor film has stable electric characteristics.

A parasitic channel is formed at an end portion of the oxide semiconductor film due to a source and a drain of the transistor which are electrically connected to the end portion. In other words, when at least one of the source and the drain of the transistor is not electrically connected to the end portion, the parasitic channel is not formed at the end portion. Therefore, an object of one embodiment of the present invention is to provide a transistor having a structure in which at least one of a source and a drain of the transistor is not electrically connected to an end portion of an oxide semiconductor film.

One embodiment of the present invention is a semiconductor device including a gate electrode layer, a gate insulating film over the gate electrode layer, an oxide semiconductor film over the gate insulating film, a drain electrode layer being over the oxide semiconductor film and overlapping with the gate electrode layer, and a source electrode layer provided to cover an outer edge portion of the oxide semiconductor film. An outer edge portion of the drain electrode layer is positioned on an inner side than an outer edge portion of the gate electrode layer.

Another embodiment of the present invention is a semiconductor device including a gate electrode layer having an opening portion, a gate insulating film over the gate electrode layer, an oxide semiconductor film over the gate insulating film, a drain electrode layer being over the oxide semiconductor film and overlapping with an inner edge portion of the gate electrode layer, and a source electrode layer provided to cover an outer edge of the oxide semiconductor film. An outer edge portion of the drain electrode layer is positioned on an inner side than an outer edge portion of the gate electrode layer.

The gate electrode layer includes a first conductive layer, a second conductive layer, and a third conductive layer. As the first conductive layer and the third conductive layer, a barrier layer for blocking transfer of metal of the second conductive layer is preferably used. Further, each of the source electrode layer and the drain electrode layer includes a fourth conductive layer, a fifth conductive layer, and a sixth conductive layer. As the fourth conductive layer and the sixth conductive layer, a barrier layer for blocking transfer of metal of the fifth conductive layer is preferably used.

A planar shape of the gate electrode layer may be a rectangle.

A planar shape of the drain electrode layer may be a rectangle.

The oxide semiconductor film may include an amorphous part and a crystal part. In the crystal part, the c-axis may be aligned to the direction parallel to the normal vector of the surface where the oxide semiconductor film is formed or to the normal vector of the surface of the oxide semiconductor film.

The oxide semiconductor film can contain at least indium.

In addition, the semiconductor device may further include, over the oxide semiconductor film, the source electrode layer, and the drain electrode layer, an oxide insulating film including an oxygen excess region, a barrier film over the oxide insulating film, a planarization insulating film over the barrier film, and a pixel electrode layer which is in contact with the drain electrode layer through an opening portion formed in the oxide insulating film, the barrier film, and the planarization insulating film.

In accordance with one embodiment of the present invention, it is possible to provide a highly reliable semiconductor device by giving stable electric characteristics to a transistor using an oxide semiconductor film.

DETAILED DESCRIPTION OF THE INVENTION

Figure 1A:
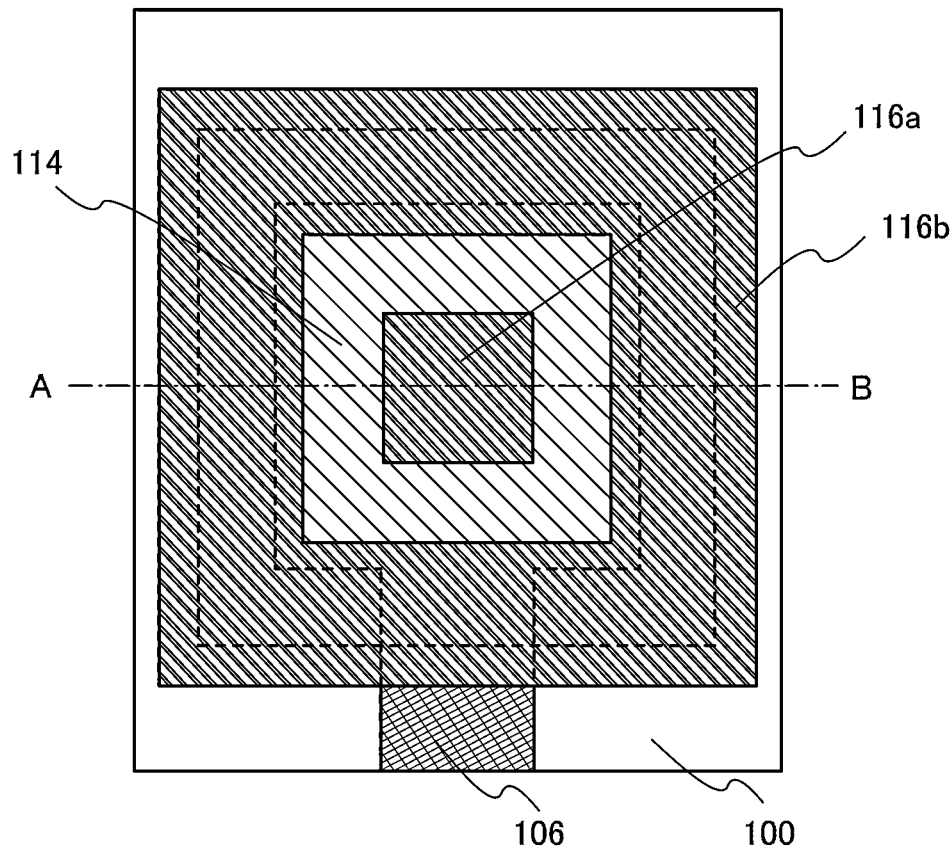
FIGS. 1A and 1B are a plan view and a cross-sectional view illustrating one embodiment of a semiconductor device.

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps or the stacking order of layers. In addition, the ordinal numbers in this specification do not denote particular names which specify the present invention.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" (or "source electrode layer") and a "drain" (or "drain electrode layer") are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object.

In this specification and the like, the phrase "transistor is on" (or "transistor is in an on state") means a state where the gate voltage of the transistor is higher than or equal to the threshold voltage. For example, in the case where an n-channel transistor has a plurality of threshold voltages, the state where the transistor is on measns a state where the gate voltage is higher than or equal to the lowest threshold voltage. Further, in the phrase "transistor is off" (or "transistor is in an off state") means a state where the gate voltage of the transistor is lower than the threshold voltage. Thus, the transistor having "normally-on" electric characteristics is in an on state when the gate voltage of the transistor is 0 V. In other words, the "normally-on transistor" is a transistor the threshold voltage of which is lower than or equal to 0 V. Alternatively, a transistor having "normally-off" electric characteristics is in an off state when the gate voltage of the transistor is 0 V. In other words, the "normally-off transistor" is a transistor the threshold voltage of which is higher than 0 V.

Embodiment 1

In this embodiment, structures of some embodiments of a semiconductor device will be described with reference to FIGS. 1A and 1B, FIGS. 2A and 2B, FIGS. 3A and 3B, FIGS. 4A and 4B, FIGS. 5A and 5B, and FIGS. 6A to 6C.

Figure 1B:
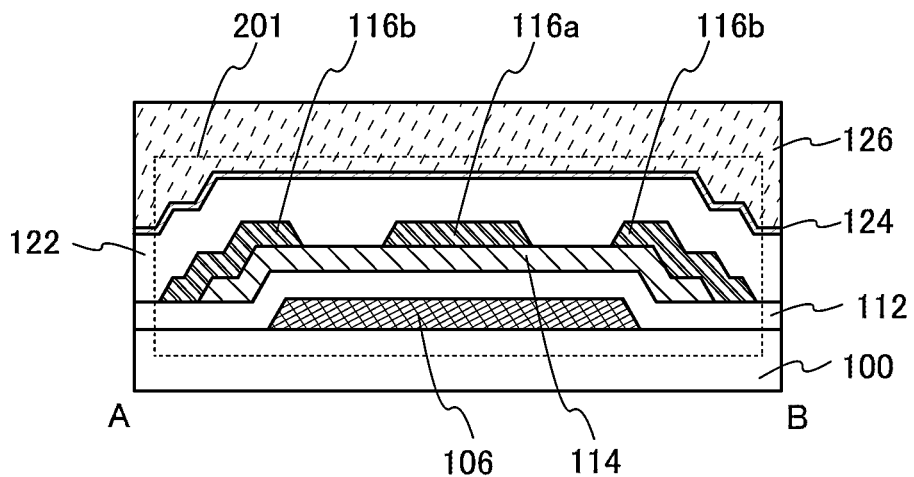

FIG. 1A is a plan view of a transistor 201, and FIG. 1B is a cross-sectional view taken along dashed-dotted line A-B in FIG. 1A. Note that some of components of the transistor 201 (e.g., a gate insulating film 112) are omitted in FIG. 1A to avoid complexity.

The transistor 201 illustrated in FIGS. 1A and 1B includes, over a substrate 100 having an insulating surface, a gate electrode layer 106, the gate insulating film 112 provided over the gate electrode layer 106, and an oxide semiconductor film 114 provided over the gate insulating film 112. In addition, over the oxide semiconductor film 114, a drain electrode layer 116a provided to overlap with the gate electrode layer 106 and a source electrode layer 116b provided to cover the outer edge portion of the oxide semiconductor film 114 are included. The outer edge portion of the drain electrode layer 116a is positioned on the inner side than the outer edge portion of the gate electrode layer 106.

Furthermore, over the transistor 201, an insulating film 122, an insulating film 124, and a planarization insulating film 126 may be provided.

With such a structure that the outer edge portion of the drain electrode layer 116a is positioned on the inner side than the outer edge portion of the gate electrode layer 106, the drain electrode layer 116a is not electrically connected to the outer edge portion of the oxide semiconductor film 114. Thus, the drain electrode layer 116a is not affected by the outer edge portion of the oxide semiconductor film 114. As a result, the threshold voltage of the transistor 201 can be prevented from shifting in the negative direction.

Further, as illustrated in FIGS. 1A and 1B, it is preferable that the source electrode layer 116b be provided to cover the outer edge portion of the oxide semiconductor film 114. The outer edge portion of the oxide semiconductor film 114 is covered with the source electrode layer 116b, whereby entry of impurities into the oxide semiconductor film 114 or release of oxygen from the oxide semiconductor film 114 can be prevented.

Note that with respect to the oxide semiconductor film, the following elements may serve as impurities: hydrogen, a metal element such as copper, an alkali metal element, or an alkaline earth metal element, an element that is not a constituent element of the oxide semiconductor film, and the like. In addition, a molecular including the above element (e.g., water or a hydrogen compound) or the like may also serve as an impurity. Therefore, in this specification and the like, impurities with respect to the oxide semiconductor film indicate the above element and molecular thereof.

The gate electrode layer 106 can be formed using a metal material such as molybdenum, titanium, tantalum, tungsten, aluminum, copper, chromium, neodymium, or scandium or an alloy material which contains any of these materials as a main component. Alternatively, the gate electrode layer 106 can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added. In addition, the gate electrode layer 106 is formed to have a single-layer structure or a stacked structure using any of the above conductive materials.

In the case where the gate electrode layer 106 has a single-layer structure, for example, a 100-nm-thick tungsten film can be used.

In the case where a copper film or an aluminum film is used for part of the gate electrode layer 106, a barrier layer is preferably provided to prevent copper or aluminum from reaching the oxide semiconductor film 114. As a barrier layer for blocking transfer of copper or aluminum, a tantalum nitride film, a tungsten film, a tungsten nitride film, a molybdenum film, a molybdenum nitride film, a titanium film, a titanium nitride film, a chromium film, or a chromium nitride film can be given. Any of the above films is selected as appropriate and provided to be in contact with the copper film or the aluminum film, so that copper or aluminum can be prevented from reaching the oxide semiconductor film 114.

In the case where the gate electrode layer 106 has a stacked structure including two layers, for example, a 30-nm-thick tantalum nitride film and a 200-nm-thick copper film can be stacked to form the gate electrode layer 106. With use of the copper film, wiring resistance can be reduced. Instead of the 30-nm-thick tantalum nitride film, a tungsten film, a tungsten nitride film, a molybdenum nitride film, or a titanium nitride film may be used.

In the case where the gate electrode layer 106 has a stacked layer including three layers, a 30-nm-thick tantalum nitride film, a 200-nm-thick copper film, and a 30-nm-thick tungsten film can be stacked to form the gate electrode layer 106. Further, instead of the 30-nm-thick tantalum nitride film, a tungsten film, a tungsten nitride film, a molybdenum nitride film, or a titanium nitride film may be used. Alternatively, instead of the 30-nm-thick tungsten film, a molybdenum film may be formed. With use of the copper film, wiring resistance can be reduced. With a structure in which the tungsten film or the molybdenum film is stacked over the copper film, copper can be prevented from reaching the oxide semiconductor film 114. In addition, tungsten and molybdenum have a relatively high work function; thus, it is preferable to use the tungsten film or the molybdenum film for the gate electrode layer 106 because the threshold voltage of the transistor is likely to be positive (i.e., a normally-off transistor is likely to be formed). Note that when the gate insulating film 112 has a function of preventing copper from reaching the oxide semiconductor film 114, either the tungsten film or the molybdenum film is not necessarily formed.

The gate insulating film 112 can be formed using silicon oxide, gallium oxide, aluminum oxide, silicon nitride, silicon oxynitride, aluminum oxynitride, or silicon nitride oxide. When the gate insulating film 112 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. The gate insulating film 112 can be formed to have a single-layer structure or a stacked structure using any of the above materials.

In the case where the gate insulating film 112 has a single-layer structure, a 200-nm-thick silicon oxynitride film may be used.

In the case where the gate insulating film 112 has a stacked structure, a 50-nm-thick silicon nitride film and a 200-nm-thick silicon oxynitride film may be stacked. With use of the silicon nitride film, penetration of metal (such as copper, sodium, or lithium), water, or the like from the substrate or the gate electrode layer 106 into an oxide semiconductor film formed later can be suppressed.

The oxide semiconductor film 114 contains at least indium. In particular, indium and zinc are preferably contained. Further, as a stabilizer for reducing variations in electric characteristics of the transistor, in addition to indium and/or zinc, one or more elements selected from gallium (Ga), tin (Sn), hafnium (Hf), aluminum (Al), and zirconium (Zr) are contained.

Note that here, for example, an In—Ga—Zn-based oxide means an oxide containing In, Ga, and Zn as its main component, in which there is no particular limitation on the ratio of In:Ga:Zn. The In—Ga—Zn-based oxide may contain a metal element other than In, Ga, and Zn.

The oxide semiconductor film 114 may be in a non-single-crystal state, for example. The non-single-crystal state is, for example, structured by at least one of c-axis aligned crystal (CAAC), polycrystal, microcrystal, and an amorphous part.

The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that in this embodiment, the case where the oxide semiconductor film 114 is a CAAC-OS film is described; however, the oxide semiconductor film 114 may be a single crystal, polycrystal, or amorphous film.

It is preferable that the oxide semiconductor film 114 be highly purified by reducing impurities and oxygen vacancies. The highly purified oxide semiconductor (purified OS) is an i-type (intrinsic) semiconductor or a substantially i-type semiconductor. Therefore, a transistor including the above oxide semiconductor in a region where a channel is formed has such characteristics that the amount of off-state current is extremely small and the threshold voltage is less likely to shift in the negative direction (i.e., normally-off characteristics are likely to be obtained).

Specifically, the concentration of hydrogen in the oxide semiconductor film 114 that is measured by secondary ion mass spectrometry (SIMS) is lower than $5\times10^{18}/cm^3$, preferably lower than or equal to $5\times10^{17}/cm^3$, further preferably lower than or equal to $1\times10^{16}/cm^3$. The carrier density of the oxide semiconductor film, which can be measured by Hall effect measurement, is lower than $1\times10^{14}/cm^3$, preferably lower than $1\times10^{12}/cm^3$, further preferably lower than $1\times10^{11}/cm^3$. Furthermore, the band gap of the oxide semiconductor is 2 eV or more, preferably 2.5 eV or more, further preferably 3 eV or more. When the oxide semiconductor that is highly purified by sufficiently reducing the impurity concentration and reducing oxygen vacancies is used for a channel formation region, the off-state current of the transistor can be decreased, and the threshold voltage can be less likely to shift in the negative direction (i.e., normally-off characteristics can be obtained).

When the amount of impurities and oxygen vacancies in the oxide semiconductor film 114 is reduced, generation of carriers can be suppressed. By suppressing an increase in carrier density, a shift of the threshold voltage in the negative direction can be decreased. Note that, at an end portion of the oxide semiconductor film 114, impurities tend to be concentrated and oxygen is easily released; accordingly, the carrier density tends to increase.

Thus, in the case where a source electrode and a drain electrode of a transistor are electrically connected to the outer edge portion of the oxide semiconductor film, current may flow through the outer edge portion of the oxide semiconductor film.

In one embodiment of the present invention, as illustrated in FIGS. 1A and 1B, the outer edge portion of the drain electrode layer 116a is positioned on the inner side than the outer edge portion of the gate electrode layer 106, so that the drain electrode layer 116a and the outer edge portion of the oxide semiconductor film 114 are not electrically connected. Thus, the drain electrode layer 116a is not affected by the outer edge portion of the oxide semiconductor film 114. As a result, the threshold voltage of the transistor 201 can be prevented from shifting in the negative direction.

The drain electrode layer 116a and the source electrode layer 116b can be formed using a metal material such as molybdenum, titanium, tantalum, tungsten, aluminum, copper, chromium, neodymium, or scandium or an alloy material containing any of these materials as its main component can be used. Alternatively, the drain electrode layer 116a and the source electrode layer 116b can be formed using a metal nitride material such as tungsten nitride, tantalum nitride, titanium nitride, or molybdenum nitride. Further alternatively, the drain electrode layer 116a and the source electrode layer 116b can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added. The drain electrode layer 116a and the source electrode layer 116b have either a single-layer structure or a stacked structure.

In the case where a copper film or an aluminum film is used for part of the drain electrode layer 116a and the source electrode layer 116b, it is preferable to provide a barrier layer for preventing copper or aluminum from reaching the oxide semiconductor film 114. As the barrier layer for blocking transfer of copper or aluminum, a tantalum nitride film, a tungsten film, a tungsten nitride film, a molybdenum film, a molybdenum nitride film, a titanium film, a titanium nitride film, a chromium film, or a chromium nitride film can be given. The barrier layer is formed using a film selected from the above-mentioned films as appropriate to be in contact with the copper film or the aluminum film, whereby copper or aluminum can be prevented from reaching the oxide semiconductor film 114.

In the transistor 201 illustrated in FIGS. 1A and 1B, planar shapes of the gate electrode layer 106, the oxide semiconductor film 114, the drain electrode layer 116a, and the source electrode layer 116b are rectangles. In addition, the term "rectangle" also includes a square.

Figure 2A:
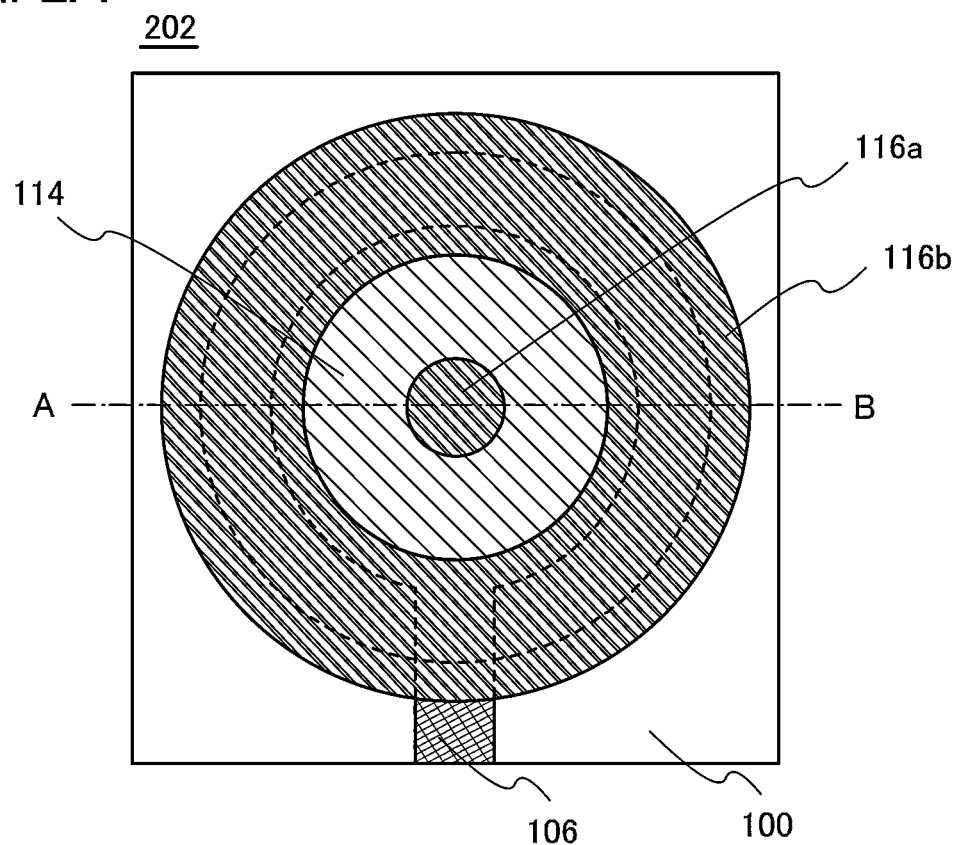
FIGS. 2A and 2B are a plan view and a cross-sectional view illustrating one embodiment of a semiconductor device.
Figure 2B:
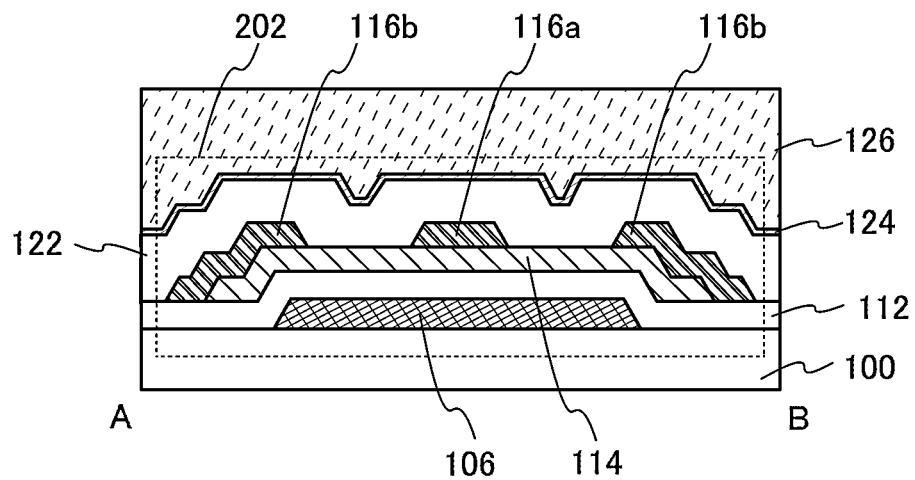

A transistor according to one embodiment of the present invention may be a transistor 202 illustrated in FIGS. 2A and 2B, in which planar shapes of the gate electrode layer 106, the oxide semiconductor film 114, the drain electrode layer 116a, and the source electrode layer 116b are circles, for example.

Figure 3A:
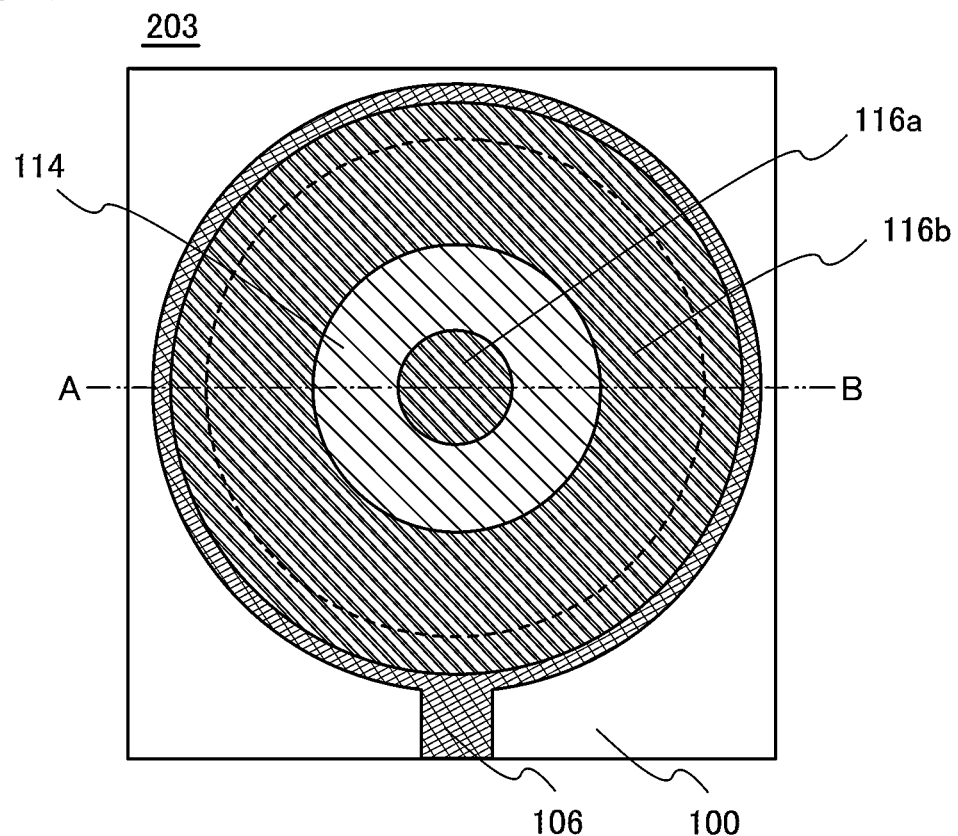
FIGS. 3A and 3B are a plan view and a cross-sectional view illustrating one embodiment of a semiconductor device.
Figure 3B:
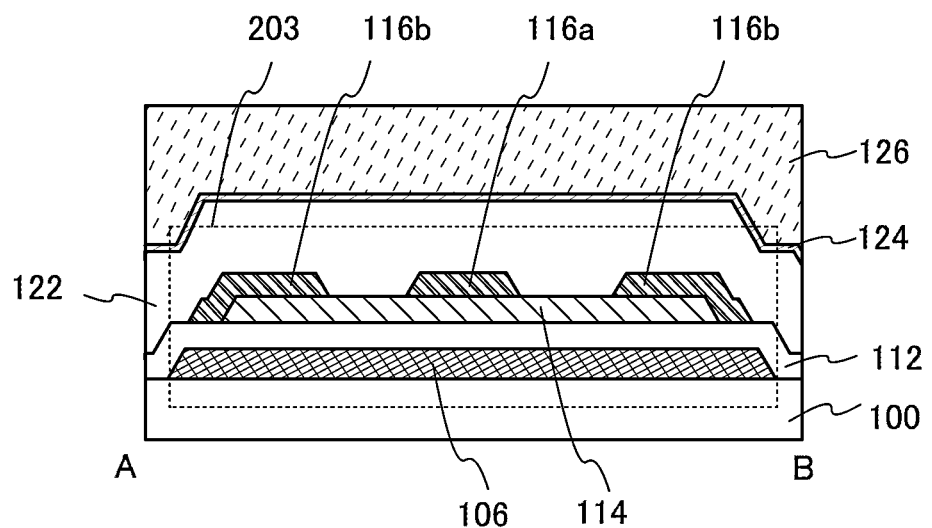

Further, as in a transistor 203 illustrated in FIGS. 3A and 3B, the outer edge portion of the gate electrode layer 106 may be positioned on the outer side than the outer edge portion of the oxide semiconductor film 114. In the structure illustrated in FIGS. 3A and 3B, light which is incident from the substrate 100 side to enter the oxide semiconductor film 114 is blocked by the gate electrode layer 106; thus, generation of carriers due to light is less likely to occur. In addition, the oxide semiconductor film 114 does not cover a projection and a depression formed by the gate electrode layer 106; such a structure is preferable because impurities (such as hydrogen or water, particularly) are less likely to be accumulated in the vicinity of the oxide semiconductor film 114. Although the source electrode layer 116b is provided to be in contact with the outer edge portion of the oxide semiconductor film 114, the structure is not limited thereto. The drain electrode layer 116a and the source electrode layer 116b may be provided on the inner side than the outer edge portion of the oxide semiconductor film 114.

Figure 4A:
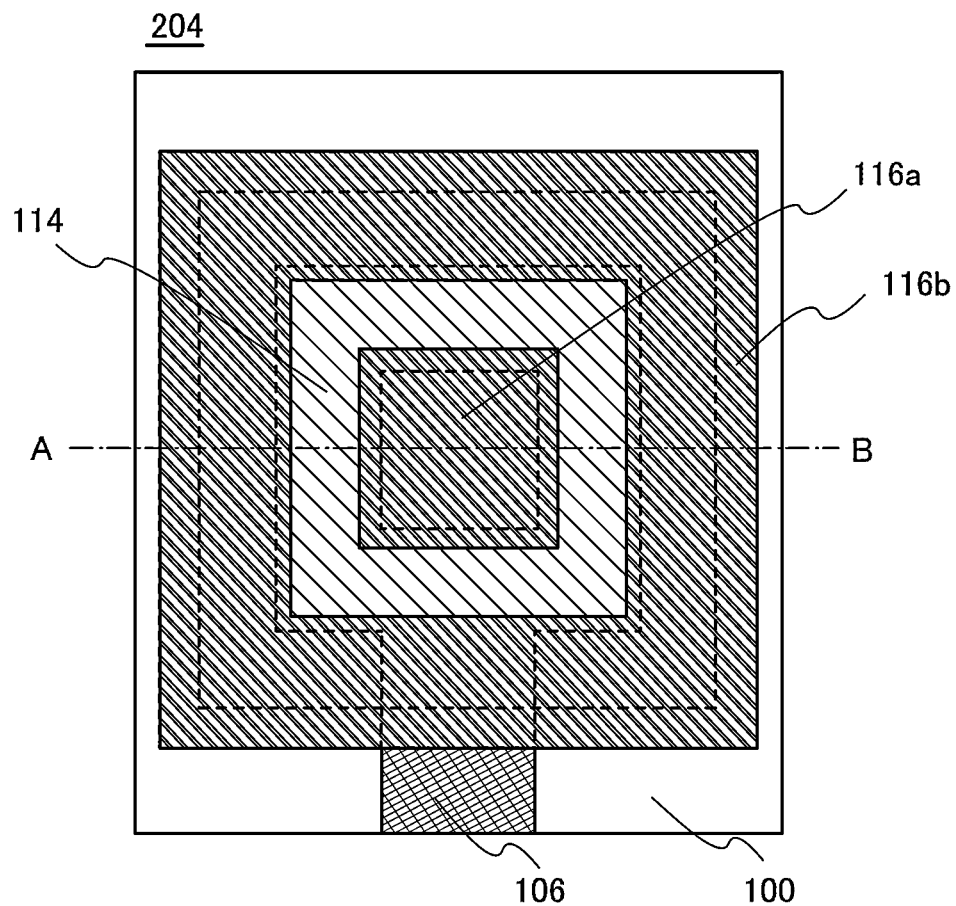
FIGS. 4A and 4B are a plan view and a cross-sectional view illustrating one embodiment of a semiconductor device.
Figure 4B:
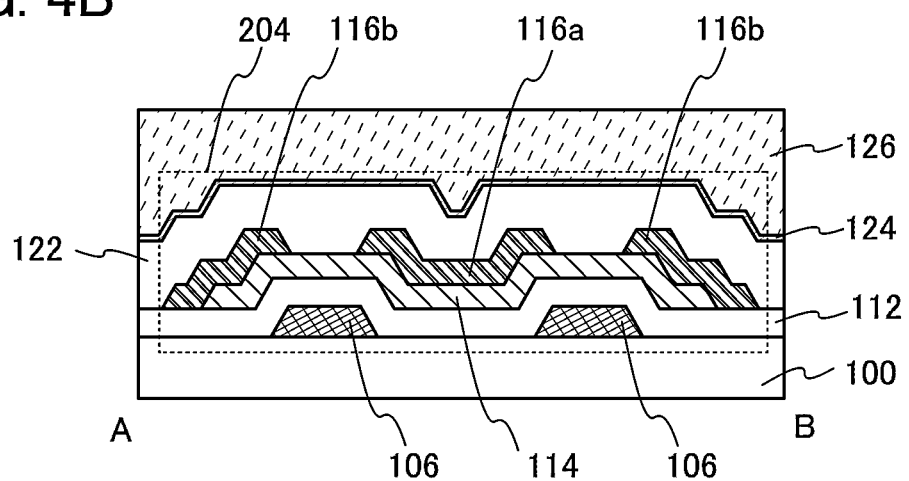

Further, as in a transistor 204 illustrated in FIGS. 4A and 4B, an opening portion may be provided in the gate electrode layer 106.

The transistor 204 illustrated in FIGS. 4A and 4B includes, over the substrate 100 having an insulating surface, the gate electrode layer 106 having an opening portion, the gate insulating film 112 provided over the gate electrode layer 106, and the oxide semiconductor film 114 provided over the gate insulating film 112. Further, over the oxide semiconductor film 114, the drain electrode layer 116a is provided to overlap with the inner edge portion of the gate electrode layer 106, and the source electrode layer 116b is provided to cover the outer edge portion of the oxide semiconductor film 114. The outer edge portion of the drain electrode layer 116a is positioned on the inner side than the outer edge portion of the gate electrode layer 106.

As illustrated in FIGS. 4A and 4B, an area where the drain electrode layer 116a and the gate electrode layer 106 overlap with each other is made small, whereby parasitic capacitance formed between the gate electrode layer 106 and the drain electrode layer 116a can be made small. To provide the drain electrode layer 116a to overlap with the inner edge portion of the gate electrode layer 106 can be expressed as to provide the drain electrode layer 116a to overlap with the opening portion in the gate electrode layer 106.

Figure 5A:
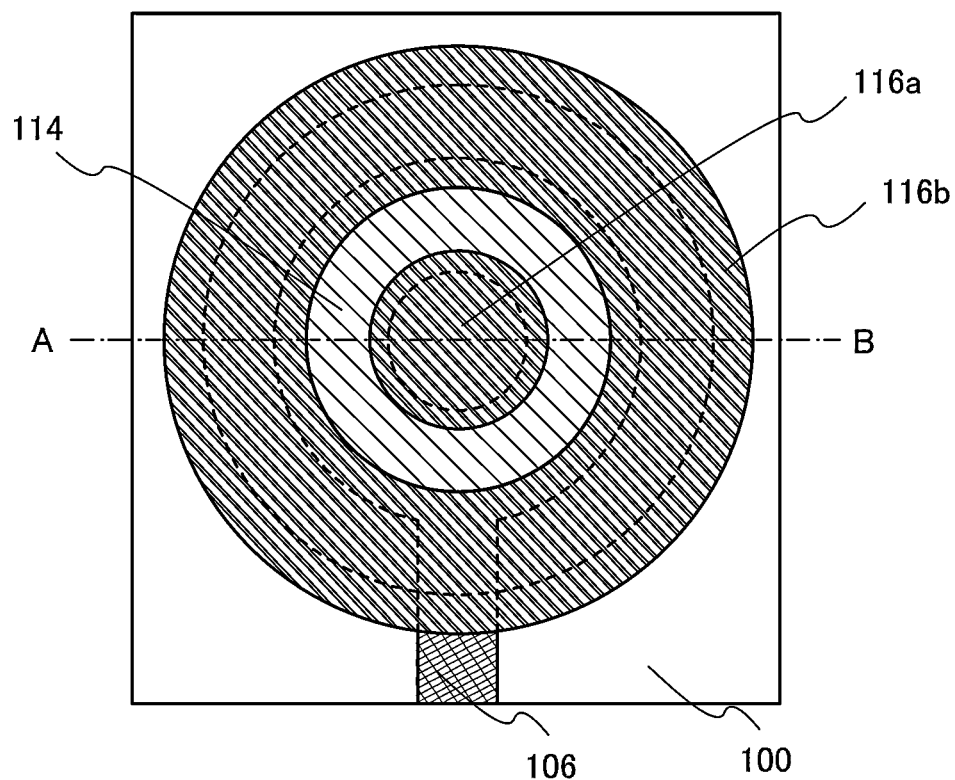
FIGS. 5A and 5B are a plan view and a cross-sectional view illustrating one embodiment of a semiconductor device.
Figure 5B:
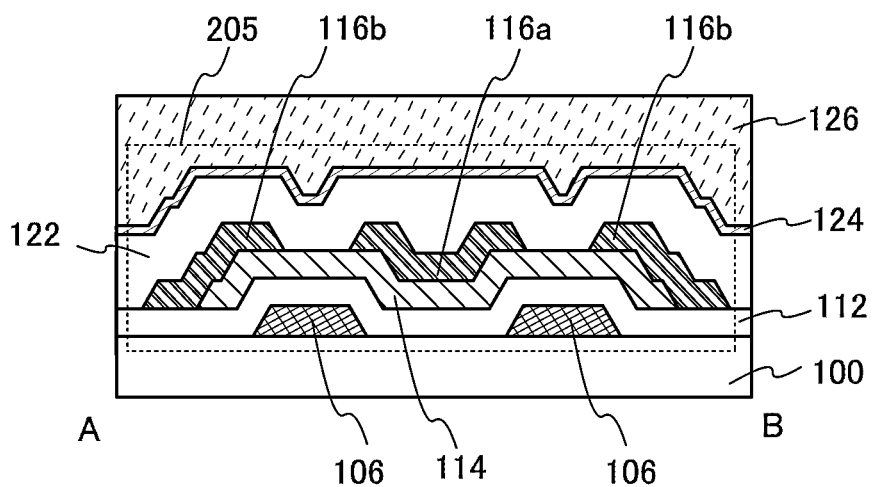

As in a transistor 205 illustrated in FIGS. 5A and 5B, the drain electrode layer 116a may be provided to be positioned on the inner side than the inner edge portion of the gate electrode layer 106, and the oxide semiconductor film 114, the drain electrode layer 116a, and the source electrode layer 116b may each have a circular shape.

Although not shown, the width of the gate electrode layer 106 may be expanded so that its outer edge be positioned at the outer edge of the oxide semiconductor film 114, and the drain electrode layer 116a may be provided to overlap with the inner edge portion of the gate electrode layer 106. Further, the oxide semiconductor film 114, the drain electrode layer 116a, and the source electrode layer 116b may each have a circular shape.

In a transistor having any of the structures illustrated in FIG. 1A to FIG. 5B, an increase in area can be suppressed even when the channel width is increased, unlike a transistor in which only one side of a drain electrode faces one side of a source electrode. Thus, any of the transistors illustrated in FIG. 1A to FIG. 5B is preferably used for a transistor with a large channel width, particularly.

Further, although in each of the transistor 201 to the transistor 205, the drain electrode layer 116a and the source electrode layer 116b have a single-layer structure, they are not limited thereto. For example, the drain electrode layer 116a and the source electrode layer 116b in which a plurality of layers are stacked may be employed, as illustrated in FIGS. 6A and 6B.

Figure 6A:
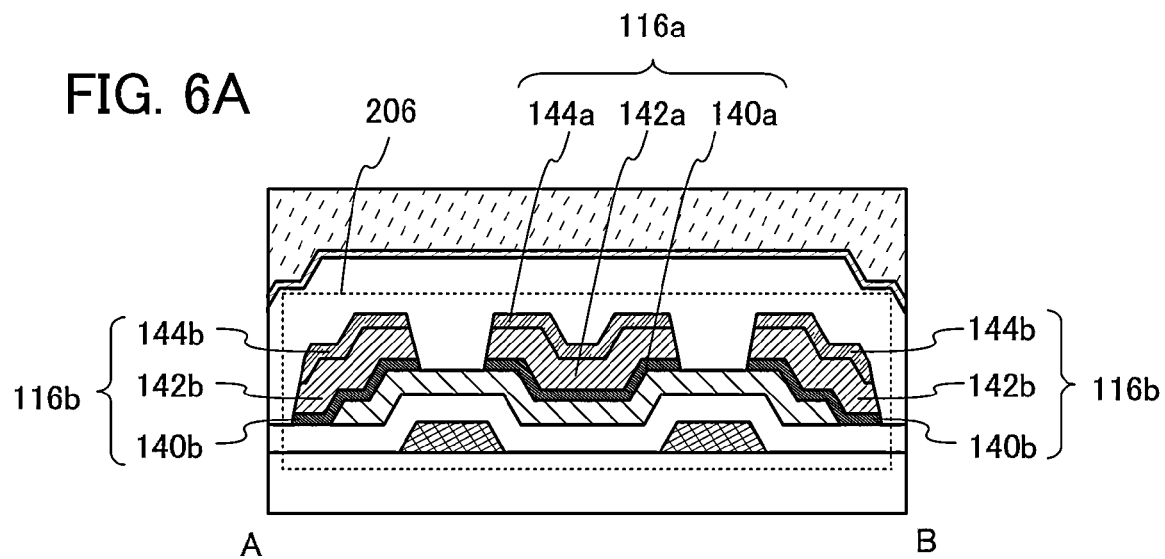
FIGS. 6A to 6C are each a cross-sectional view illustrating one embodiment of a semiconductor device.
Figure 6B:
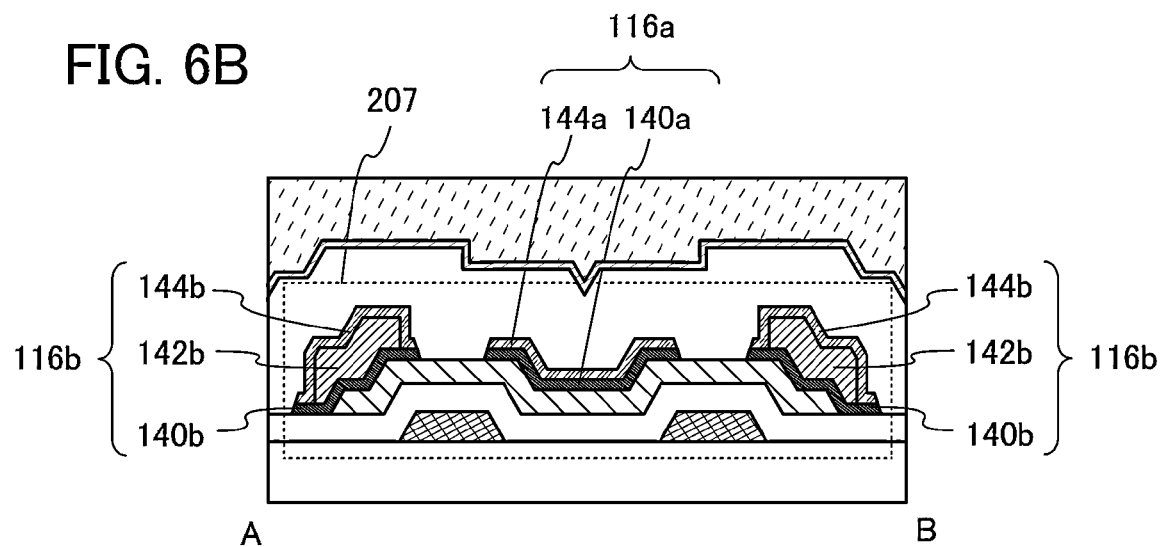

For example, as illustrated in FIG. 6A, the drain electrode layer 116a may be formed by stacking three layers of a conductive layer 140a, a conductive layer 142a, and a conductive layer 144a. Like the drain electrode layer 116a, the source electrode layer 116b may be formed by stacking three layers of a conductive layer 140b, a conductive layer 142b, and a conductive layer 144b.

For example, in a transistor 206 in FIG. 6A, a 50-nm-thick tungsten layer is used for the conductive layer 140a and the conductive layer 140b, a 400-nm-thick aluminum layer is used for the conductive layer 142a and the conductive layer 142b, and a 100-nm-thick titanium layer is used for the conductive layer 144a and the conductive layer 144b, and they are stacked, so that the drain electrode layer 116a and the source electrode layer 116b can be formed.

In the case where only copper is used for the drain electrode layer 116a and the source electrode layer 116b, for example, wiring resistance can be reduced. However, there is concern that adhesiveness with the oxide semiconductor film 114 is not be sufficiently obtained or that copper enters the oxide semiconductor film 114 and serves as an impurity degrading electric characteristics. Further, in the case where only aluminum is used for the drain electrode layer 116a and the source electrode layer 116b, wiring resistance can be reduced; however, there is concern that an aluminum oxide film is formed at an interface between the aluminum and the oxide semiconductor film 114, which causes difficulty in electrical connection.

Thus, copper or aluminum is used for the conductive layers 142a and 142b, and the conductive layers 140a and 140b and the conductive layers 144a and 144b are provided so that the conductive layers 142a and 142b are sandwiched therebetween. With such a structure, wiring resistance can be reduced, adhesiveness can be secured, and an impurity can be prevented from reaching the oxide semiconductor film 114, so that favorable electrical connection can be obtained.

Further, as illustrated in FIG. 6B, the source electrode layer 116b may have such a structure that the conductive layer 140b and the conductive layer 144b are provided to seal the conductive layer 142b. With such a structure, metal used for the conductive layer 142b can be further prevented from reaching the oxide semiconductor film 114. In this case, the conductive layer 140b and the conductive layer 144b function as a barrier layer with respect to the conductive layer 142b.

Note that although the drain electrode layer 116a in FIG. 6B has a two-layer structure including the conductive layer 140a and the conductive layer 144a, it is not limited thereto. Like the source electrode layer 116b, the drain electrode layer 116a may have a structure in which the conductive layer 142a is sealed with the conductive layer 140a and the conductive layer 144a.

For example, in a transistor 207 in FIG. 6B, tungsten, copper, tantalum nitride are stacked as the conductive layer 140b, the conductive layer 142b, and the conductive layer 144b, respectively, so that the source electrode layer 116b can be formed.

Furthermore, each of the conductive layer 140a, the conductive layer 140b, the conductive layer 142b, the conductive layer 144a, and the conductive layer 144b may have a stacked structure.

For example, the drain electrode layer 116a may have a structure in which a stack of tungsten and tungsten nitride is used for the conductive layer 140a, copper is used for the conductive layer 142a, and tantalum nitride is used for the conductive layer 144a.

The gate electrode layer 106 may have a stacked structure similar to the stacked structures of the source electrode layer 116b and the drain electrode layer 116a illustrated in FIGS. 6A and 6B.

Figure 6C:
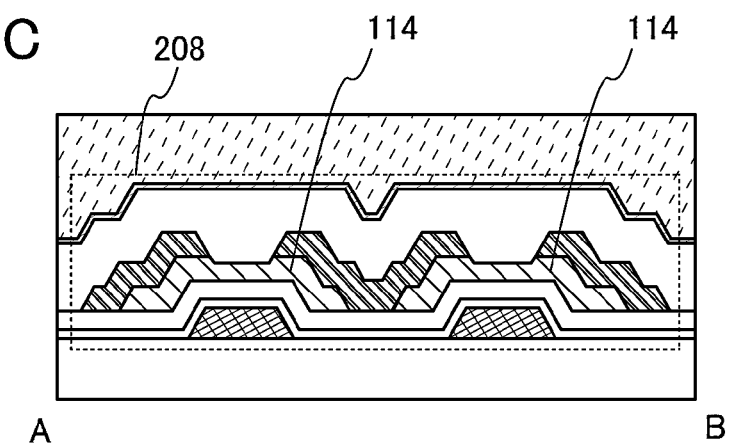

As in a transistor 208 illustrated in FIG. 6C, the thickness of the oxide semiconductor film 114 may be differ according to regions: the thicknesses of regions overlapping with the source electrode layer 116b and the drain electrode layer 116a are larger than the thickness of a region overlapping with neither the source electrode layer 116b nor the drain electrode layer 116a. Further, an opening portion may be provided at the center of the oxide semiconductor film 114.

Further, a transistor according to this embodiment may have characteristics obtained by combining part of characteristics of the transistor 201 to the transistor 208 in FIG. 1A to FIG. 6C.

Embodiment 2

In this embodiment, an example of a method for manufacturing the semiconductor device illustrated in FIGS. 1A and 1B will be described with reference to FIGS. 7A to 7E, FIGS. 8A to 8D, and FIGS. 9A to 9C. In addition, an example of a method for forming a wiring connection portion is illustrated on the right side in each of the drawings.

First, a substrate 100 having an insulating surface is prepared.

There is no particular limitation on the substrate that can be used as the substrate 100 as long as it has heat resistance enough to withstand heat treatment performed later. For example, a glass substrate of barium borosilicate glass, aluminoborosilicate glass, or the like, a ceramic substrate, a quartz substrate, a sapphire substrate, or the like can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100. Any of these substrates provided with a semiconductor element may be used as the substrate 100.

The semiconductor device may be manufactured using a flexible substrate as the substrate 100. To manufacture a flexible semiconductor device, the transistor 201 including the oxide semiconductor film 114 may be directly formed over a flexible substrate; or alternatively, the transistor 201 including the oxide semiconductor film 114 may be formed over a substrate and then separated and transferred to a flexible substrate. Note that in order to separate the transistor from the formation substrate and transfer it to the flexible substrate, a separation layer (e.g., tungsten) is preferably provided between the formation substrate and the transistor 201 including the oxide semiconductor film 114.

Next, an insulating film functioning as a base film may be formed over the substrate 100. The insulating film can be formed by a PECVD method or a sputtering method to have a single-layer structure or a stacked structure using an oxide insulating material of silicon oxide, silicon oxynitride, aluminum oxide, aluminum oxynitride, hafnium oxide, gallium oxide, or the like; a nitride insulating material of silicon nitride, silicon nitride oxide, aluminum nitride, or aluminum nitride oxide; or a mixed material of any of the above materials.

As the insulating film, a stacked structure including a silicon nitride film and a silicon oxynitride film is preferably used, for example. With use of the silicon nitride film, metal, hydrogen, or the like can be prevented from reaching an oxide semiconductor film formed in a later step from the substrate.

Next, a conductive film which is to be a gate electrode layer (including a wiring formed using the same layer as the gate electrode layer) is formed over the substrate 100.

The conductive film can be formed by a sputtering method or a PECVD method. For formation of the conductive film, a metal material such as molybdenum, titanium, tantalum, tungsten, aluminum, copper, chromium, neodymium, or scandium, or an alloy material containing any of these materials as a main component can be used. Further, the conductive film can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added. In addition, the conductive film is formed to have a single-layer structure or a stacked structure using any of the above conductive materials.

In the case where the conductive film is formed with a single-layer structure, a 100-nm-thick tungsten film may be formed, for example.

In the case where the conductive film is formed to have a stacked structure including two layers, a 30-nm-thick tantalum nitride film and a 200-nm-thick copper film may be stacked, for example. With use of the copper film, wiring resistance can be reduced. Instead of the 30-nm-thick tantalum nitride film, a tungsten film, a tungsten nitride film, a molybdenum nitride film, or a titanium nitride film may be used. Further, instead of the 200-nm-thick copper film, a tungsten film may be used.

In the case where the conductive film has a stacked structure including three layers, a 30-nm-thick tantalum nitride film, a 200-nm-thick copper film, and a 30-nm-thick tungsten film may be stacked. Further, instead of the 30-nm-thick tantalum nitride film, a tungsten film, a tungsten nitride film, a molybdenum nitride film, or a titanium nitride film may be used. Alternatively, instead of the 30-nm-thick tungsten film, a molybdenum film may be formed. With use of the copper film, wiring resistance can be reduced. With a structure in which the tungsten film or the molybdenum film is stacked over the copper film, copper can be prevented from reaching the oxide semiconductor film 114.

In addition, tungsten and molybdenum have a relatively high work function; thus, it is preferable to use the tungsten film or the molybdenum film for the gate electrode layer because the threshold voltage of the transistor is likely to be positive (i.e., a normally-off transistor is likely to be formed). Note that when the gate insulating film formed in a later step has a function of preventing copper from reaching the oxide semiconductor film 114, either the tungsten film or the molybdenum film is not necessarily formed.

Figure 7A:
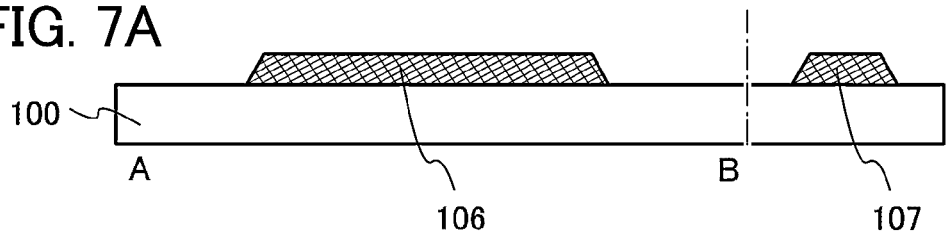
FIGS. 7A to 7E are cross-sectional views illustrating one embodiment of a method for manufacturing a semiconductor device.

Next, by a photolithography step, a resist mask is formed over the conductive film, and selective etching is performed, so that the gate electrode layer 106 is formed as illustrated in FIG. 7A. In this embodiment, a stacked layer of a 30-nm-thick tantalum nitride film and a 200-nm-thick copper film is formed as the gate electrode layer 106.

After the gate electrode layer 106 is formed, the resist mask is removed. Note that the conductive film may be etched using either dry etching or wet etching, or using both dry etching and wet etching.

When the resist mask is removed, contamination may be generated in some cases. Treatment for removing the generated contamination (the treatment is also referred to as impurity-removing treatment) may be performed. For the impurity-removing treatment, plasma treatment using oxygen, dinitrogen monoxide, or a rare gas (typically argon); solution treatment using diluted hydrofluoric acid, water, a developer, or a TMAH solution; or the like can be favorably employed.

Further, in the step of forming the gate electrode layer 106, a wiring 107 can also be formed in a wiring connection portion.

Next, heat treatment may be performed on the substrate 100 and the gate electrode layer 106. For example, the heat treatment may be performed with an electric furnace at a temperature higher than or equal to 350° C. and lower than or equal to 500° C. for 30 minutes to 1 hour. The heat treatment enables removal of hydrogen, water, or the like in the substrate 100 or the gate electrode layer 106.

Further, a heat treatment apparatus used is not limited to an electric furnace, and a device for heating a process object by heat conduction or heat radiation from a heating element such as a resistance heating element may be alternatively used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. For example, in the case of using a GRTA apparatus, the heat treatment may be performed at 650° C. for 1 minute to 5 minutes.

Figure 7B:
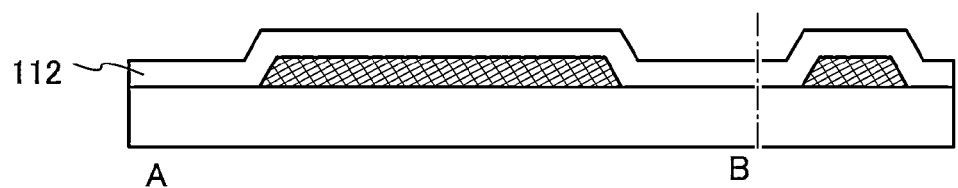

Next, as illustrated in FIG. 7B, the gate insulating film 112 is formed over the gate electrode layer 106.

To improve the coverage with the gate insulating film 112, planarization treatment may be performed on a surface of the gate electrode layer 106. In the case of using a thin insulating film as the gate insulating film 112 in particular, it is preferable that the flatness of the surface of the gate electrode layer 106 be good.

The gate insulating film 112 is formed to have a thickness greater than or equal to 1 nm and less than or equal to 300 nm by a sputtering method, a molecular beam epitaxy (MBE) method, a CVD method such as a LPCVD method, a PECVD method, or a mist CVD method, a pulsed laser deposition method, an atomic layer deposition (ALD) method, or the like as appropriate.

The gate insulating film 112 can be formed using silicon oxide, gallium oxide, aluminum oxide, silicon nitride, silicon oxynitride, aluminum oxynitride, or silicon nitride oxide. When the gate insulating film 112 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, the amount of gate leakage current can be reduced. The gate insulating film 112 can be formed to have a single-layer structure or a stacked structure using any of the above materials.

In the case where the gate insulating film 112 is formed with a single-layer structure, a 200-nm-thick silicon oxynitride film may be formed, for example.

Alternatively, in the case where the gate insulating film 112 is formed with a stacked structure, for example, a 50-nm-thick silicon nitride film and a 200-nm-thick silicon oxynitride film may be formed. With use of the silicon nitride film, metal (such as copper, sodium, or lithium), water, or the like can be prevented from entering an oxide semiconductor film formed in a later step from the substrate or the gate electrode layer 106.

The 50-nm-thick silicon nitride film in this case can be formed, for example, by a PECVD method under the following conditions: the gas flow ratio of $SiH_4/N_2$ is 50 sccm/5000 sccm; the deposition power when the electrode area is 6000 $cm^2$ is 150 W (RF); the deposition pressure is 40 Pa; and the substrate temperature is 350° C. The 200-nm-thick silicon oxynitride film can be formed, for example, by a PECVD method under the following conditions: the gas flow rate ratio of $SiH_4/N_2O$ is 20 sccm/3000 sccm; the deposition power when the electrode area is 6000 $cm^2$ is 100 W (RF); the deposition pressure is 40 Pa; and the substrate temperature is 350° C.

Further, the RF power supply (power supply output) may be made higher. For example, the RF power supply when the electrode area is 6000 $cm^2$ may be 300 W or higher, 500 W or higher, or 1000 W or higher. By increasing the RF power supply (power supply output), the dense gate insulating film 112 can be formed, which can prevent entry of impurities into the oxide semiconductor film formed in a later step.

Next, the substrate 100, the gate electrode layer 106, and the gate insulating film 112 may be subjected to heat treatment. For example, the heat treatment may be performed with a GRTA apparatus at 650° C. for 1 minute to 10 minutes. Alternatively, depending on an electric furnace, the heat treatment may be performed at a temperature higher than or equal to 350° C. and lower than or equal to 500° C. for 30 minutes to 1 hour. The heat treatment enables removal of hydrogen, water, or the like contained in the gate insulating film 112.

Next, treatment for adding oxygen (also referred to as oxygen addition treatment or oxygen implantation treatment) may be performed on the gate insulating film 112. By oxygen addition treatment, an oxygen excess region is formed in the gate insulating film 112.

Oxygen contains at least any of an oxygen radical, ozone, an oxygen atom, and an oxygen ion (an oxygen molecular ion and/or an oxygen cluster ion). By the oxygen addition treatment performed on the dehydrated or dehydrogenated gate insulating film 112, oxygen can be contained in the gate insulating film 112 to compensate for oxygen which has been released by the above heat treatment, and an oxygen excess region can be formed.

Addition of oxygen to the gate insulating film 112 can be performed by an ion implantation method, an ion doping method, a plasma immersion ion implantation method, plasma treatment, or the like, for example. Note that for the ion implantation method, a gas cluster ion beam may be used. The oxygen addition treatment may be performed for the entire surface of the substrate 100 by one step or may be performed using a linear ion beam (an ion beam of which irradiation surface is a linear shape), for example. In the case where the linear ion beam is used, the substrate or the ion beam is relatively moved (scanned), whereby oxygen can be added to the entire surface of the gate insulating film 112. Further, as plasma treatment, ashing treatment may be used.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., argon) may be contained in a gas for supplying oxygen.

Further, in the case where an ion implantation method is used for adding oxygen, the dose of the oxygen is preferably greater than or equal to $1\times10^{13}$ ions/$cm^2$ and less than or equal to $5\times10^{16}$ ions/$cm^2$. The content of oxygen in the gate insulating film 112 after the oxygen addition treatment preferably exceeds that of the stoichiometric composition of the gate insulating film 112. Note that such a region containing oxygen in excess of the stoichiometric composition may exist in part of the gate insulating film 112. The depth at which oxygen is implanted may be adjusted as appropriate by implantation conditions.

The gate insulating film 112 containing excess oxygen, which serves as an oxygen supply source, may be provided so as to be in contact with an oxide semiconductor film 113 formed later, whereby oxygen is released from the gate insulating film 112 by heat treatment performed in a later step and can be supplied to the oxide semiconductor film 113. Thus, oxygen vacancies in the oxide semiconductor film 113 can be reduced.

Note that the timing of oxygen addition treatment performed on the gate insulating film 112 may be before the gate insulating film 112 is heated or before and after the gate insulating film 112 is heated.

Figure 7C:
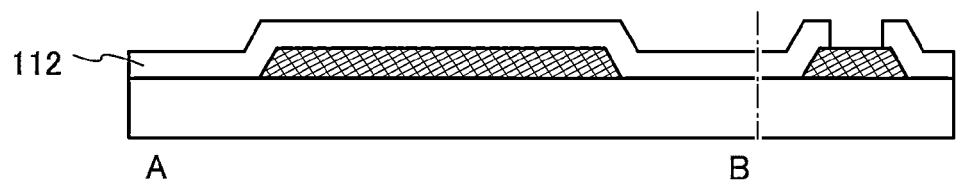

Next, by a photolithography step, a resist mask is formed over the gate insulating film 112, and selective etching is performed, so that an opening is formed in a region that is to be a wiring connection portion of the gate insulating film 112 as illustrated in FIG. 7C.

Figure 7D:
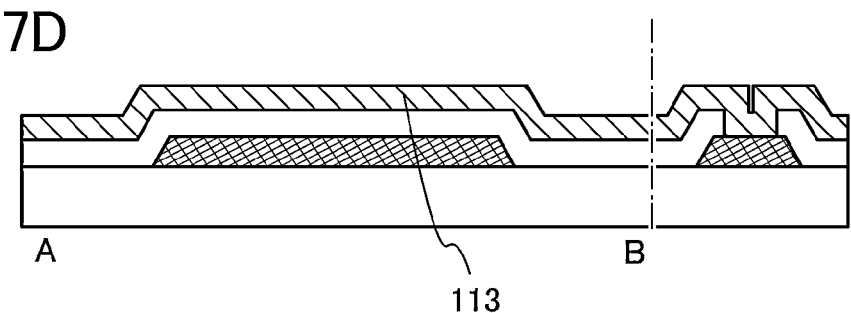

Next, the oxide semiconductor film 113 is formed over the gate insulating film 112 (see FIG. 7D).

The oxide semiconductor film 113 can be formed by a sputtering method, a molecular beam epitaxy (MBE) method, a CVD method such as a LPCVD method, a PECVD method, or a mist CVD method, a pulsed laser deposition method, an atomic layer deposition (ALD) method, or the like as appropriate.

An oxide semiconductor used for the semiconductor film 113 contains at least indium (In). In particular, In and zinc (Zn) are preferably contained. The oxide semiconductor preferably contains, in addition to In and/or Zn, gallium (Ga) serving as a stabilizer that reduces variations in electrical characteristics among transistors using the above-described oxide. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that although the oxide semiconductor film 113 with a single-layer structure is formed in FIG. 7D, an oxide semiconductor film with a stacked structure may be formed. For example, oxide semiconductor films whose constituent elements are different may be stacked, oxide semiconductor films which contain the same constituent elements but have different compositions from each other may be stacked, or oxide semiconductor films whose hydrogen concentrations are different from each other may be stacked.

Further, the oxide semiconductor film 113 is preferably a CAAC-OS (c-axis aligned crystalline oxide semiconductor) film. Further, the oxide semiconductor film 113 may be single crystal or polycrystalline (also referred to as polycrystal).

In an oxide semiconductor film having a crystal part as the CAAC-OS film, defects in the bulk can be further reduced and when a surface flatness is improved, carrier mobility higher than that of an oxide semiconductor in an amorphous state can be obtained. In order to improve the surface flatness, the oxide semiconductor film 113 is preferably formed on a flat surface. Specifically, the oxide semiconductor film is preferably formed on a surface with an average surface roughness (Ra) less than or equal to 1 nm, preferably less than or equal to 0.3 nm, further preferably less than or equal to 0.1 nm.

Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

In order to improve the planarity of the surface where the oxide semiconductor film 113 is formed, planarization treatment is preferably performed on a region which is in the gate insulating film 112 and which is in contact with the oxide semiconductor film 113. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. With the reverse sputtering, particle substances (also referred to as particles or dust) attached to the top surface of the gate insulating film 112 can be removed.

As the planarization treatment, polishing treatment, dry etching treatment, or plasma treatment may be performed plural times, or these treatments may be performed in combination. In the case where the treatments are performed in combination, there is no particular limitation on the order of steps and the order can be set as appropriate depending on the roughness of the surface of the gate insulating film 112.

The thickness of the oxide semiconductor film 113 is preferably greater than or equal to 1 nm and less than or equal to 200 nm, further preferably greater than or equal to 5 nm and less than or equal to 50 nm. The oxide semiconductor film 113 can be deposited by a sputtering method, an MBE method, a CVD method, a pulsed laser deposition method, an ALD method, or the like as appropriate.

Further, the concentration of hydrogen or water contained in the oxide semiconductor film 113 is preferably as low as possible. This is because if the concentration of hydrogen is high, by a bond of hydrogen and an element contained in an oxide semiconductor, electrons serving as carriers are generated in some cases.

Therefore, in order to make the oxide semiconductor film 113 contain impurities as little as possible in the step for forming the oxide semiconductor film 113, it is preferable to preheat the substrate provided with the gate insulating film 112 in a preheating chamber of a sputtering apparatus as pretreatment for formation of the oxide semiconductor film 113 so that impurities in the substrate and the gate insulating film 112 are detached and removed. As an evacuation unit, a cryopump is preferably provided in the preheating chamber.

The oxide semiconductor film 113 is preferably formed under such a condition that much oxygen is contained (for example, by a sputtering method in an atmosphere where the proportion of oxygen is 30% to 100%) so as to be a film containing much oxygen (preferably including a region containing oxygen in excess of the stoichiometric composition of the oxide semiconductor in a crystalline state).

It is preferable to use a high purity gas from which impurities are removed for formation of the oxide semiconductor film 113.

The substrate is held in a deposition chamber kept under reduced pressure. Then, while remaining moisture in the deposition chamber is removed, a gas containing fewer impurities is introduced, and with use of a target described below, the oxide semiconductor film 113 is deposited over the substrate 100 at a temperature higher than or equal to 130° C. and lower than or equal to 700° C. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In particular, with use of a cryopump or a cold trap, remaining moisture is efficiently removed, for example, so that the concentration of impurities in the oxide semiconductor film 113 deposited in the deposition chamber can be reduced.

In this embodiment, a 35-nm-thick In—Ga—Zn-based oxide film (IGZO film) is formed as the oxide semiconductor film 113 by a sputtering method with a sputtering apparatus including an AC power supply device. In this embodiment, an In—Ga—Zn-based oxide target having an atomic ratio where In:Ga:Zn=3:1:2 is used. The deposition conditions are as follows: the atmosphere is oxygen and argon (the proportion of oxygen is 50%); the pressure is 0.4 Pa; the electric power when the electrode area is 6000 cm$^2$ is 0.5 kW; and the substrate temperature is 200° C.

It is preferable to form the gate insulating film 112 and the oxide semiconductor film 113 successively without being exposed to the air. Successive formation of the gate insulating film 112 and the oxide semiconductor film 113 so as not to expose the gate insulating film 112 to the air can prevent impurities from being adsorbed to the surface of the gate insulating film 112.

Further, heat treatment for removal of excess hydrogen including water or a hydroxyl group (dehydration or dehydrogenation) may be performed on the oxide semiconductor film 113. The temperature of the heat treatment is higher than or equal to 300° C. and lower than or equal to 700° C., or lower than the strain point of the substrate. The heat treatment can be performed under reduced pressure, or in an oxygen atmosphere, a nitrogen atmosphere, or the like. Note that an oxidation gas atmosphere can also be regarded as an oxygen atmosphere. For example, an atmosphere which contains an oxidation gas including oxygen, dinitrogen monoxide, and ozone; or ultra dry air (the moisture amount is less than or equal to 20 ppm (–55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be used.

In this embodiment, with use of an electric furnace which is one of heat treatment apparatuses, the oxide semiconductor film 113 is subjected to heat treatment at 450° C. in a nitrogen atmosphere for one hour and then at 450° C. in a mixed atmosphere of nitrogen and oxygen for one hour.

Further, a heat treatment apparatus used is not limited to an electric furnace, and a device for heating a process object by heat conduction or heat radiation from a heating element such as a resistance heating element may be alternatively used. For example, an RTA apparatus such as a GRTA apparatus or an LRTA apparatus can be used. For example, as the heat treatment, GRTA may be performed as follows. The substrate is put in an inert gas heated at a high temperature of 650° C. to 700° C., is heated for several minutes, and is taken out from the inert gas.

Note that in the heat treatment, it is preferable that water, hydrogen, and the like be not contained in nitrogen, oxygen, or a rare gas such as helium, neon, or argon. The purity of gas which is introduced into the heat treatment apparatus is preferably set to be higher than or equal to 6N (99.9999%), further preferably higher than or equal to 7N (99.99999%) (that is, the impurity concentration is lower than or equal to 1 ppm, preferably lower than or equal to 0.1 ppm).

Further, after heat treatment under reduced pressure or in an inert atmosphere, the oxide semiconductor film 113 may be heated in an oxygen atmosphere. In the case where in addition to removal of impurities in the oxide semiconductor film 113, oxygen vacancies are caused by the heat treatment performed under reduced pressure or in an inert atmosphere, such oxygen vacancies in the oxide semiconductor film 113 can be reduced by heat treatment performed later in an oxygen atmosphere.

The heat treatment for dehydration or dehydrogenation may be performed before or after the oxide semiconductor film is processed into an island shape. The heat treatment for dehydration or dehydrogenation may be performed plural times, and may also serve as another heat treatment. By performing heat treatment on the oxide semiconductor film 113, the crystallinity in the oxide semiconductor film 113 can be increased.

When the heat treatment for dehydration or dehydrogenation is performed in the state where the gate insulating film 112 is covered with the oxide semiconductor film 113 which is not processed to have an island shape, oxygen contained in the gate insulating film 112 can be prevented from being released to the outside by the heat treatment.

Figure 7E:
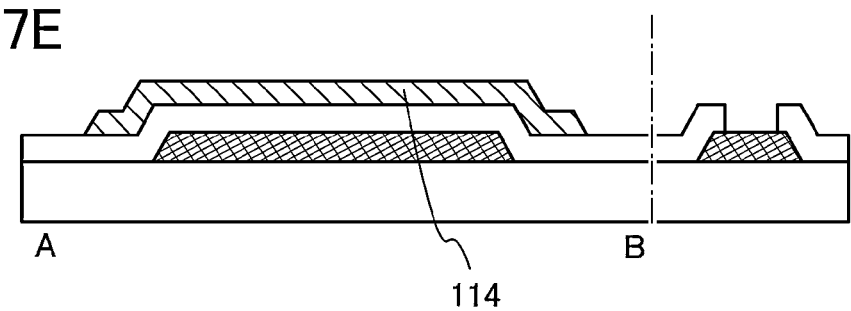

Next, by a photolithography step, a resist mask is formed over the oxide semiconductor film 113, and selective etching is performed on the oxide semiconductor film 113, so that an island-shaped oxide semiconductor film 114 is formed as illustrated in FIG. 7E. After the island-shaped oxide semiconductor film 114 is formed, the resist mask is removed. A resist mask which is used in the formation of the island-shaped oxide semiconductor film 114 may be formed by an ink-jet method. When a resist mask is formed by an inkjet method, photomasks are not used; thus, the manufacturing cost can be reduced.

The etching of the oxide semiconductor film 113 may be performed by dry etching, wet etching, or both of them. For example, an etchant used for wet etching of the oxide semiconductor film 113, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film 113 may be etched by a dry etching method using an inductively coupled plasma (ICP) etching method.

In etching the oxide semiconductor film 113, it is preferable that the etching selectivity be set to high so as not to etch the gate insulating film 112 excessively.

Figure 8A:
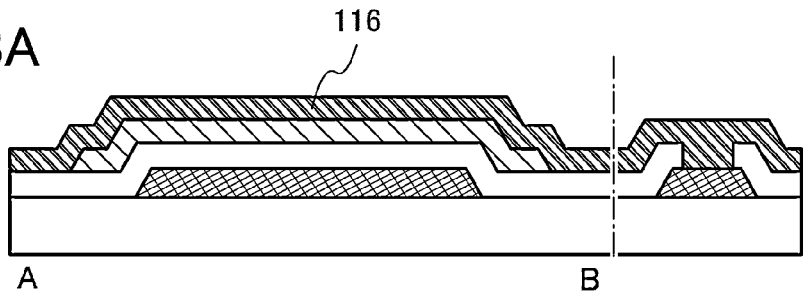
FIGS. 8A to 8D are cross-sectional views illustrating one embodiment of a method for manufacturing a semiconductor device.

Next, a conductive film 116 that is to be a source electrode layer and a drain electrode layer (including a wiring formed using the same layer as the source and drain electrode layers) in a later step is formed over the gate insulating film 112 and the oxide semiconductor film 114 (see FIG. 8A).

The conductive film 116 can be formed by a sputtering method or a PECVD method. The conductive film 116 can be formed using a metal material such as molybdenum, titanium, chromium, tantalum, tungsten, aluminum, copper, neodymium, or scandium, or an alloy material containing any of these materials as a main component. Further, the conductive film 116 can be formed using a metal nitride material such as tungsten nitride, tantalum nitride, titanium nitride, or molybdenum nitride. Further alternatively, the conductive film 116 can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added. The conductive film 116 is formed with a single-layer structure or a stacked structure.

In this embodiment, the conductive film 116 is formed with a three-layer structure of a 50-nm-thick tungsten film, a 400-nm-thick copper film, and a 100-nm-thick nitride tantalum film.

Figure 8B:
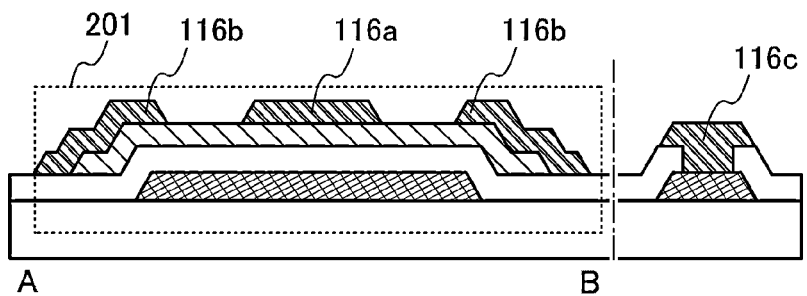

Next, by a photolithography step, a resist mask is formed over the conductive film 116, and selective etching is performed, so that the source electrode layer 116b and the drain electrode layer 116a are formed as illustrated in FIG. 8B. Through this step, the oxide semiconductor film 114 is partly exposed.

Through this step, the outer edge portion of the drain electrode layer 116a is positioned on the inner side than the outer edge portion of the gate electrode layer 106. With such a structure that the outer edge portion of the drain electrode layer 116a is positioned on the inner side than the outer edge portion of the gate electrode layer 106, the drain electrode layer 116a can be prevented from being electrically connected to the end portion of the oxide semiconductor film 114.

Further, it is preferable to form the source electrode layer 116b to cover the outer edge portion of the oxide semiconductor film 114. With the source electrode layer 116b covering the outer edge portion of the oxide semiconductor film 114, entry of impurities into the outer edge portion of the oxide semiconductor film 114 and release of oxygen from the oxide semiconductor film 114 can be prevented.

After the source electrode layer 116b and the drain electrode layer 116a are formed as described above, the resist mask is removed.

In addition, in the step of forming the source electrode layer 116b and the drain electrode layer 116a, a wiring 116c electrically connected to the wiring 107 can be formed in the wiring connection portion.

Note that on the surface of the oxide semiconductor film 114 which is exposed by formation of the source electrode layer 116b and the drain electrode layer 116a, a constituent element of the source electrode layer 116b and the drain electrode layer 116a, an element existing in a treatment chamber, or a constituent element of an etching gas used for the etching may be attached as impurities.

Such attachment of the impurities tends to bring an increase in off-state current of the transistor or deterioration of the electric characteristics of the transistor. In addition, a parasitic channel is likely to be generated in the oxide semiconductor film 114, and thus electrodes which should be electrically isolated might be electrically connected through the oxide semiconductor film 114.

Thus, after the etching for forming the source electrode layer 116b and the drain electrode layer 116a is finished, cleaning treatment for removing the impurities attached on the surface and side surface of the oxide semiconductor film 114 (impurity-removing treatment) may be performed.

The impurity-removing treatment can be performed by plasma treatment or treatment using a solution. As the plasma treatment, oxygen plasma treatment, dinitrogen monoxide plasma treatment, or the like can be used. In addition, a rare gas (typically argon) may be used in the plasma treatment.

Further, for the cleaning treatment using a solution, an alkaline solution such as a TMAH solution, water, or an acidic solution such as diluted hydrofluoric acid can be used. For example, in the case where a diluted hydrofluoric acid solution is used, 50 wt % hydrofluoric acid is diluted with water 100 times to 100000 times, preferably 1000 times to 100000 times. That is, diluted hydrofluoric acid having a concentration of $5\times10^{-4}$ wt % to 0.5 wt %, preferably $5\times10^{-4}$ wt % to $5\times10^{-2}$ wt %, is used for the cleaning treatment. By the cleaning treatment, the above-described impurities attached on the surface of the exposed oxide semiconductor film 114 can be removed.

Further, by the impurity-removing treatment using a diluted hydrofluoric acid solution, the exposed surface of the oxide semiconductor film 114 can be etched. In other words, impurities attached on the exposed surface of the oxide semiconductor film 114 or impurities taken inside and in the vicinity of the surface of the oxide semiconductor film 114 can be removed with part of the oxide semiconductor film 114. Thus, like the oxide semiconductor film 114 in the transistor 208 illustrated in FIG. 6C, regions in the oxide semiconductor film 114 overlapping with the source electrode layer 116b and the drain electrode layer 116a have a larger thickness than a region in the oxide semiconductor film 114 overlapping with neither the source electrode layer 116b nor the drain electrode layer 116a.

By performing the impurity-removing treatment, the chlorine concentration at the surface of the oxide semiconductor layer, at a concentration peak obtained by SIMS, can be reduced to be lower than or equal to $1\times10^{19}/cm^3$ (preferably lower than or equal to $5\times10^{18}/cm^3$, further preferably lower than or equal to $1\times10^{18}/cm^3$). The boron concentration can be reduced to be lower than or equal to $1\times10^{19}/cm^3$ (preferably lower than or equal to $5\times10^{18}/cm^3$, further preferably lower than or equal to $1\times10^{18}/cm^3$). The aluminum concentration can be reduced to be lower than or equal to $1\times10^{19}/cm^3$ (preferably lower than or equal to $5\times10^{18}/cm^3$, further preferably lower than or equal to $1\times10^{18}/cm^3$).

Through the above steps, the transistor 201 can be manufactured (see FIG. 8B).

Next, the insulating film 122 is formed over the transistor 201. The insulating film 122 may be formed in one step or through a plurality of steps. Further, films formed using different materials may be stacked to form the insulating film 122. In this embodiment, the insulating film 122 in which two layers of an insulating layer 118 and an insulating layer 120 are stacked is formed.

Figure 8C:
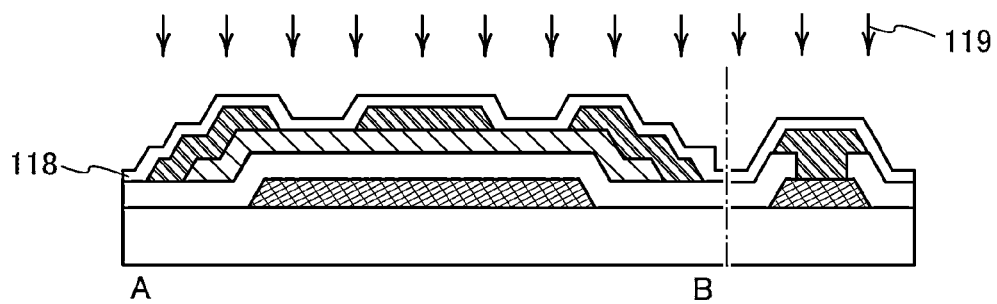

First, the insulating layer 118 is formed over the source electrode layer 116b and the drain electrode layer 116a to be partly in contact with the oxide semiconductor film 114 (see FIG. 8C). The thickness of the insulating layer 118 is 20 nm to 50 nm. The insulating layer 118 can be formed using a material and a method similar to those of the gate insulating film 112. For example, silicon oxide, silicon oxynitride, or the like formed by a sputtering method or a CVD method can be used for the insulating layer 118.

In this embodiment, a silicon oxynitride film with a thickness of 30 nm to 50 nm formed by a PECVD method is used as the insulating layer 118. The conditions for forming the insulating layer 118, for example, may be as follows: the gas flow rate ratio of $SiH_4/N_2O$ is 20 sccm/3000 sccm; the pressure is 40 Pa; the RF power supply (power supply output) when the electrode area is 6000 $cm^2$ is 100 W; and the substrate temperature is 350° C.

Next, oxygen 119 is added to the insulating layer 118, whereby the insulating layer 118 contains excess oxygen. At least one of an oxygen radical, ozone, an oxygen atom, and an oxygen ion (including a molecular ion and a cluster ion) is included in the oxygen 119. The oxygen 119 is added by oxygen addition treatment.

The oxygen 119 may be added to the entire area of the insulating layer 118 at a time. Alternatively, a linear ion beam is used for adding the oxygen 119. In the case of using the linear ion beam, the substrate 100 or the ion beam is relatively moved (scanned), whereby the oxygen 119 can be added into the entire area of the insulating layer 118.

As a supply gas of the oxygen 119, a gas containing oxygen atoms can be used; for example, an $O_2$ gas, an $N_2O$ gas, a $CO_2$ gas, a CO gas, or an $NO_2$ gas can be used. Note that a rare gas (e.g., an Ar gas) may be contained in the supply gas of the oxygen 119.

For example, in the case where oxygen is added by an ion implantation method, the dosage of the oxygen 119 is preferably greater than or equal to $1\times10^{13}$ ions/$cm^2$ and less than or equal to $5\times10^{16}$ ions/$cm^2$, and it is preferable that the oxygen content of the insulating layer 118 be in substantially excess of that of the stoichiometric composition. Note that such a region containing oxygen in excess of the stoichiometric composition exists in at least part of the insulating layer 118. The depth at which the oxygen 119 is implanted may be adjusted as appropriate by implantation conditions.

In this embodiment, the oxygen 119 is added by plasma treatment performed in an oxygen atmosphere. Note that it is preferable that the insulating layer 118 include impurities as little as possible because it is in contact with the oxide semiconductor film 114. Thus, it is preferable to perform heat treatment for removing excess hydrogen (including water or a hydroxyl group) in the insulating layer 118 before oxygen is added. The temperature of the heat treatment for dehydration or dehydrogenation is higher than or equal to 300° C. and lower than or equal to 700° C., or lower than the strain point of the substrate. The heat treatment for dehydration or dehydrogenation can be performed in a manner similar to that of the above heat treatment.

Plasma treatment for adding the oxygen 119 (oxygen plasma treatment) is performed under conditions where the oxygen flow rate is 250 sccm, the bias power is 4500 W, and the pressure is 15 Pa. In this oxygen plasma treatment, part of the oxygen 119 added to the insulating layer 118 enters the oxide semiconductor film 114 through the insulating layer 118. The oxygen 119 added to the oxide semiconductor film 114 passes through the insulating layer 118, whereby the surface of the oxide semiconductor film 114 is less damaged by plasma, and accordingly, reliability of the semiconductor device can be improved. The insulating layer 118 is preferably formed to have a thickness greater than 10 nm and less than 100 nm. When the thickness of the insulating layer 118 is less than or equal to 10 nm, the oxide semiconductor film 114 is easily damaged in the oxygen plasma treatment. Alternatively, when the thickness of the insulating layer 118 is greater than or equal to 100 nm, the oxygen 119 added by the oxygen plasma treatment might be insufficiently supplied to the oxide semiconductor film 114. The heat treatment for dehydration or dehydrogenation of the insulating layer 118 and/or addition of the oxygen 119 may be performed plural times. The insulating layer 118 to which the oxygen 119 is added can function as an oxygen supply layer.

Figure 8D:
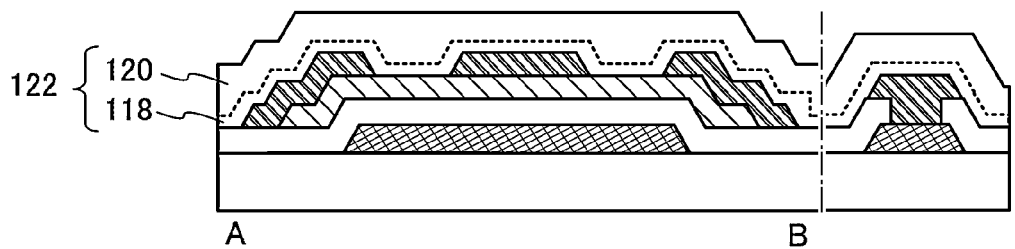

Next, the insulating layer 120 is formed over the insulating layer 118 to have a thickness of 200 nm to 500 nm (see FIG. 8D). The insulating layer 120 can be formed using a material and a method similar to those of the gate insulating layer 112. For example, silicon oxide, silicon oxynitride, or the like formed by a sputtering method or a CVD method can be used as the insulating layer 120.

In this embodiment, a silicon oxynitride layer with a thickness of 370 nm is formed by a PECVD method as the insulating layer 120. The deposition conditions of the insulating layer 120, for example, can be as follows: the gas flow rate ratio of $SiH_4$ to $N_2O$ is 30 sccm/4000 sccm; the pressure is 200 Pa; the RF power supply (power supply output) when the electrode area is 6000 $cm^2$ is 150 W; and the substrate temperature is 220° C. to 350° C.

Further, the RF power supply (power supply output) can be made higher. For example, the RF power supply when the electrode area is 6000 $cm^2$ may be 300 W or higher, 500 W or higher, or 1000 W or higher. By increasing the RF power supply (power supply output), the dense insulating layer 120 can be formed.

Note that after the insulating layer 120 is formed, heat treatment may be performed in an inert gas atmosphere, an oxygen atmosphere, or a mixed atmosphere containing an inert gas and oxygen at a temperature higher than or equal to 250° C. and lower than or equal to 650° C., preferably higher than or equal to 300° C. and lower than or equal to 600° C. Specifically, the heat treatment may be performed in a mixed atmosphere containing nitrogen and oxygen. Alternatively, heat treatment may be performed in a nitrogen atmosphere and then in a mixed atmosphere containing nitrogen and oxygen. By this heat treatment, the oxygen included in the insulating layer 118 is diffused at the interface between the insulating layer 118 and the oxide semiconductor film 114, and supplied to the oxide semiconductor film 114, so that oxygen vacancies in the oxide semiconductor film 114 can be filled.

Further, oxygen may be added to the insulating layer 120, so that the insulating layer 120 may be in an oxygen excess state. Addition of oxygen to the insulating layer 120 may be performed in a manner similar to that of addition of oxygen to the insulating layer 118. After the oxygen is added to the insulating layer 120, heat treatment may be performed in an inert gas atmosphere, an oxygen atmosphere, or a mixed atmosphere containing an inert gas and oxygen at a temperature higher than or equal to 250° C. and lower than or equal to 650° C., preferably higher than or equal to 300° C. and lower than or equal to 600° C.

Next, an aluminum film is formed over the insulating film 122.

The aluminum film is preferably formed by a sputtering method, an evaporation method, a CVD method, or the like. In addition, the thickness of the aluminum film is preferably greater than or equal to 3 nm and less than or equal to 20 nm (further preferably greater than or equal to 3 nm and less than or equal to 10 nm, still further preferably greater than or equal to 4 nm and less than or equal to 5 nm).

Note that as the aluminum film, an aluminum film to which titanium or magnesium is added may be used. Alternatively, as the aluminum film, a stacked layer including an aluminum film and either a titanium film or a magnesium film may be used.

Figure 9A:
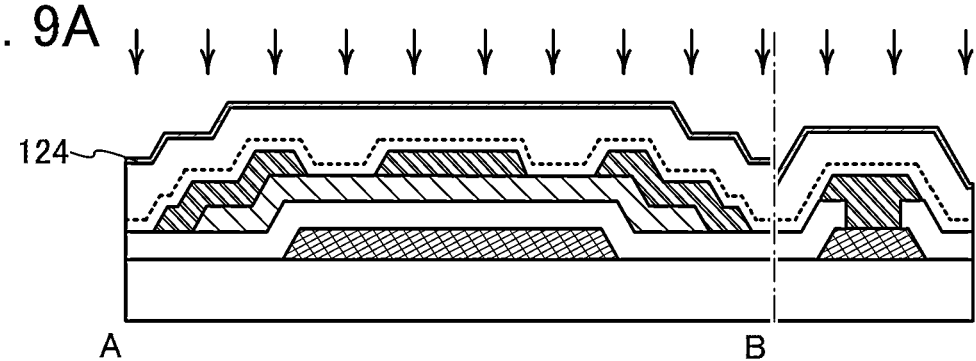
FIGS. 9A to 9C are cross-sectional views illustrating one embodiment of a method for manufacturing a semiconductor device.

Next, as illustrated in FIG. 9A, oxygen addition treatment is performed on the aluminum film. For the oxygen addition treatment, the case where oxygen addition treatment is performed on the insulating film 122 may be referred to; thus, detailed description is skipped. The oxygen addition treatment is performed on the aluminum film, whereby an aluminum oxide film which is an oxide of the aluminum film is formed. The aluminum oxide film is used as the insulating film 124.

The insulating film 124 functions as a barrier film which prevents impurities from entering the transistor 201 and prevents oxygen in the insulating film 122 from being released outside.

After the oxygen is added to the insulating film 122 and the aluminum film, heat treatment may be performed. The temperature of the heat treatment may be higher than or equal to 250° C. and lower than or equal to 600° C., for example, 300° C.

In the transistor including an oxide semiconductor, oxygen is supplied from the insulating film to the oxide semiconductor film, whereby the interface state density between the oxide semiconductor film and the insulating film can be reduced. As a result, carrier trapping at the interface between the oxide semiconductor film and the insulating film due to the operation of a transistor, or the like can be suppressed, and thus, a transistor with high reliability can be obtained.

The dehydration or dehydrogenation treatment for the insulating film 122 and the insulating film 124 and/or the oxygen addition treatment may be performed plural times.

The insulating film 124 provided over and in contact with the insulating film 122 is a film obtained by oxidizing an aluminum film. When an aluminum oxide film is formed by oxidization of an aluminum film, productivity can be increased as compared with the case where an aluminum oxide film is formed by a sputtering method. Further, the oxidation of the aluminum film and the oxygen addition treatment on the insulating film 122 may be performed in one step, which makes a process to be simplified. As a result, the manufacturing cost can be reduced.

In the case where an oxide insulating film (e.g., a silicon oxide film or a silicon oxynitride film) is used as the insulating film 122, oxygen is one of main components in the oxide insulating film. Thus, it is difficult to accurately measure the concentration of oxygen in the oxide insulating film by using a method such as SIMS. That is, it is difficult to judge whether oxygen is intentionally added to the oxide insulating film or not. Further, the same can be applied to the case where oxygen contained excessively in the insulating film 122 is supplied to the oxide semiconductor film 114 in a later step.

As for oxygen, it is known that oxygen contains isotopes such as $^{17}O$ and $^{18}O$ and the proportions of $^{17}O$ and $^{18}O$ in all of the oxygen atoms in nature is about 0.038% and about 0.2%, respectively. That is to say, it is possible to measure the concentrations of these isotopes in the insulating film in contact with the oxide semiconductor film or the oxide semiconductor film by a method such as SIMS; therefore, the oxygen concentration in the insulating film in contact with the oxide semiconductor film or the oxide semiconductor film may be able to be estimated more accurately by measuring the concentrations of these isotopes. Thus, the concentration of the isotope may be measured to determine whether oxygen is intentionally added to the insulating film in contact with the oxide semiconductor film.

Over the insulating film 124, an insulating film functioning as an interlayer insulating film (such as a protective insulating film or a planarization insulating film) may be formed. With the interlayer insulating film (protective insulating film or planarization insulating film), stress on the insulating film 124 which is a thin film can be reduced. Thus, damage on the insulating film 124 can be prevented.

The protective insulating film can be formed using a material and a method similar to those of the insulating film 122. For example, a silicon oxide film is formed to have a thickness of 400 nm by a sputtering method. Heat treatment may be performed after formation of the protective insulating film. For example, heat treatment is performed at 300° C. for one hour in a nitrogen atmosphere.

Figure 9B:
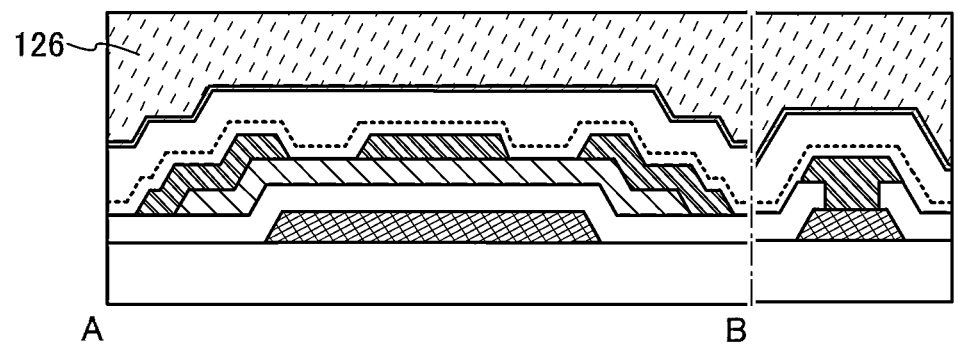

In this embodiment, as illustrated in FIG. 9B, a planarization insulating film 126 is formed over the insulating film 124. With the planarization insulating film 126, surface unevenness due to the transistor 201 can be reduced. As the planarization insulating film 126, an organic material such as a polyimide resin, an acrylic resin, or a benzocyclobutene resin can be used. Other than such organic materials, it is also possible to use a low-dielectric constant material (a low-k material) or the like. Note that the planarization insulating film 126 may be formed by stacking a plurality of insulating films formed using these materials.

For example, a 1.5-μm-thick acrylic resin film may be formed as the planarization insulating film 126. The acrylic resin film can be formed in such a manner that an acrylic resin is applied by a coating method and then baked (e.g., at 250° C. for one hour in a nitrogen atmosphere).

Heat treatment may be performed after the planarization insulating film 126 is formed. For example, heat treatment is performed at 250° C. for one hour in a nitrogen atmosphere.

As described above, heat treatment may be performed after the transistor 201 is formed. Heat treatment may be performed plural times.

Figure 9C:
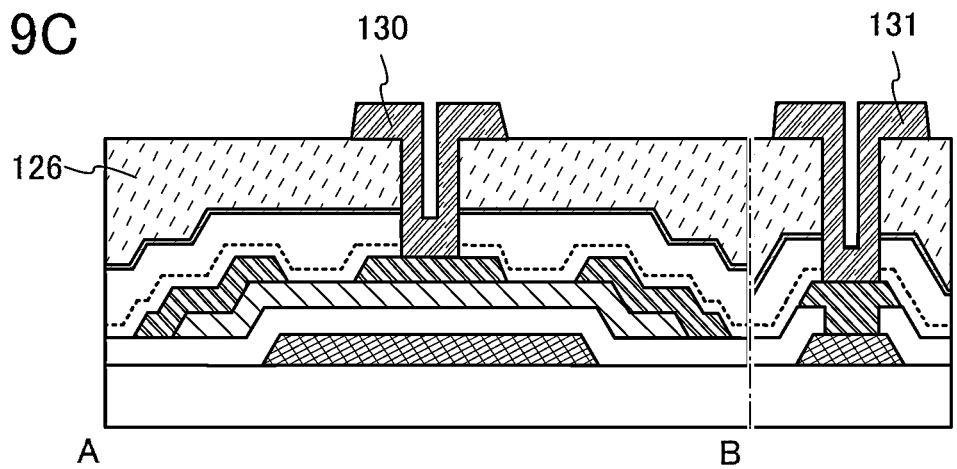

Next, as illustrated in FIG. 9C, an opening portion is formed in the planarization insulating film 126, and an electrode 130 electrically connected to the drain electrode layer 116a is formed. For formation of the electrode 130, a material and a method similar to those of the gate electrode layer 106 can be used. Further, in the same step, a wiring 131 electrically connected to the wiring 116c can be formed in the wiring connection portion.

Through the above steps, a semiconductor device including the transistor 201 can be manufactured.

According to one embodiment of the present invention, a highly reliable semiconductor device in which the transistor 201 including an oxide semiconductor film has stable electric characteristics can be provided.

Although in this embodiment, a method for manufacturing the transistor 201 illustrated in FIGS. 1A and 1B is described in detail, the transistors 202 to 208 illustrated in FIGS. 2A to 6C can be manufactured referring to the method for manufacturing the transistor 201.

For example, the transistor 202 in FIGS. 2A and 2B, the transistor 203 in FIGS. 3A and 3B, the transistor 204 in FIGS. 4A and 4B, and the transistor 205 in FIGS. 5A and 5B can be manufactured by changing the top surface shapes of the gate electrode layer 106, the oxide semiconductor film 114, the drain electrode layer 116a, the source electrode layer 116b, and the like.

The drain electrode layer 116a and the source electrode layer 116b of the transistor 206 in FIG. 6A can be formed by etching a plurality of conductive layers with use of one mask.

The drain electrode layer 116a and the source electrode layer 116b of the transistor 207 in FIG. 6B can be formed by etching a plurality of conductive layers through the following steps, for example.

First, a conductive layer that is to be the conductive layer 140a and the conductive layer 140b is formed.

Next, a conductive layer that is to be the conductive layer 142b is formed and then etched by wet etching, so that the conductive layer 142b is formed.

Then, a conductive layer that is to be the conductive layers 144a and 144b is formed, and the conductive layer that is to be the conductive layers 140a and 140b and the conductive layer that is to be the conductive layers 144a and 144b are etched by dry etching, so that the conductive layers 140a and 140b and the conductive layers 144a and 144b are formed.

The dry etching for forming the conductive layer 140a and the conductive layer 140b and the dry etching for forming the conductive layer 144a and the conductive layer 144b can be performed with one mask. A mask used for the wet etching for forming the conductive layer 142b may be different from the mask used for the dry etching for forming the conductive layers 140a and 140b and the conductive layers 144a and 144b.

Through the above steps, the conductive layer 140b and the conductive layer 144b can be formed to surround the conductive layer 142b. With such a structure, metal used for the conductive layer 142b can be prevented from reaching the oxide semiconductor film 114.

Further, any of the stacked structures of the source electrode layer 116b and the drain electrode layer 116a illustrated in FIGS. 6A and 6B may be applied to the gate electrode layer 106.

The structures, methods, and the like described in this embodiment can be combined as appropriate with any of the other structures, methods, and the like described in the other embodiments.

Embodiment 3

In this embodiment, a display device according to one embodiment of the present invention will be described. Note that as a transistor provided in the display device, any of the transistors described in the above embodiment can be used. The transistors described in the above embodiment have stable electric characteristics; thus, reliability of the display device can be improved.

In a display device according to one embodiment of the present invention, any of the transistors described in the above embodiment may be used for part of a driver circuit and/or part of a pixel. Note that for only either the driver circuit or only the pixel, any of the transistors described in the above embodiment may be used. In a transistor provided in the driver circuit, a large amount of current is required to flow, and thus, a transistor with a large channel width is provided for the driver circuit in many cases. It is particularly preferable to employ the transistor described in the above embodiment for the driver circuit because using such transistors is effective in reduction of the driver circuit area.

<Configuration Example of Display Device>

Figure 10:
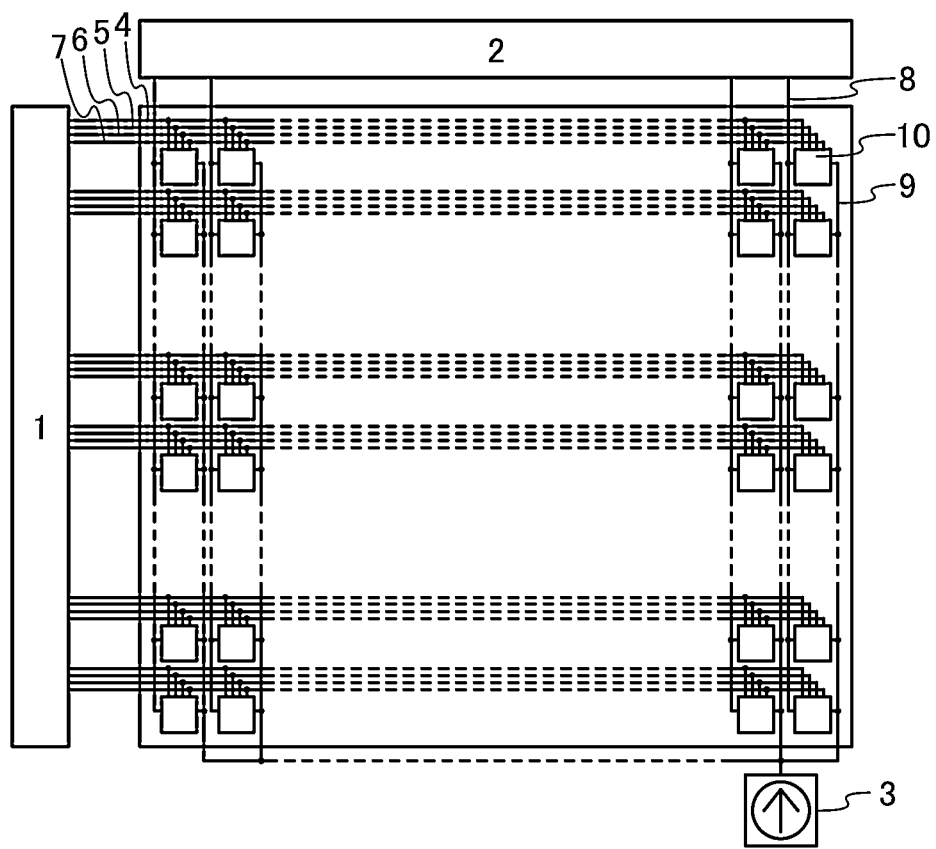
FIG. 10 illustrates a configuration example of a display device.

FIG. 10 illustrates a configuration example of a display device. The display device in FIG. 10 includes a plurality of pixels 10 arranged in m rows and n columns; a scan line driver circuit 1; a signal line driver circuit 2; a current source 3; m scan lines 4, m scan lines 5, m scan lines 6, and m reverse scan lines 7 which are electrically connected to the pixels 10 arranged on the respective rows and whose potentials are controlled by the scan line driver circuit 1; n signal lines 8 which are electrically connected to the pixels 10 arranged on the respective columns and whose potentials are controlled by the signal line driver circuit 2; and a power supply line 9 which is provided with a plurality of branch lines and is electrically connected to the current source 3.

<Configuration Example of Scan Line Driver Circuit>

Figure 11:
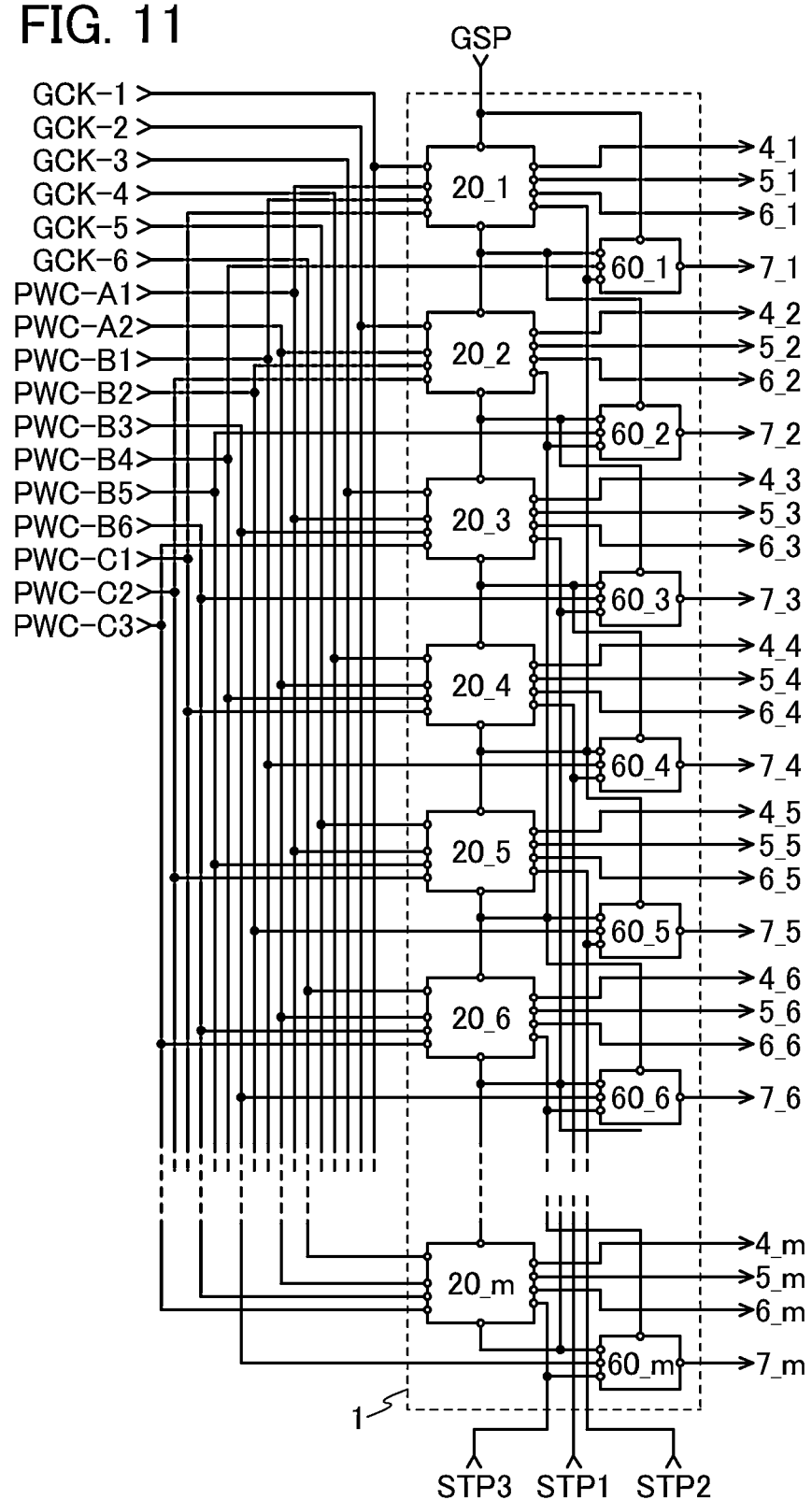
FIG. 11 illustrates a configuration example of a scan line driver circuit.

FIG. 11 illustrates a configuration example of the scan line driver circuit 1 illustrated in FIG. 10. The scan line driver circuit 1 in FIG. 11 includes wirings that supply first to sixth clock signals (GCK-1 to GCK-6) for the scan line driver circuit; wirings that supply first and second pulse width control signals A (PWC-A1 and PWC-A2); wirings that supply first to sixth pulse width control signals B (PWC-B1 to PWC-B6); wirings that supply first to third pulse width control signals C (PWC-C1 to PWC-C3); first to m-th pulse output circuits 20_1 to 20_m that are electrically connected to the pixels 10 arranged on the first to m-th rows through scan lines 4_1 to 4_m, scan lines 5_1 to 5_m, and scan lines 6_1 to 6_m; and first to m-th inverted pulse output circuits 60_1 to 60_m that are electrically connected to the pixels 10 arranged on the first to m-th rows through reverse scan lines 7_1 to 7_m.

The first to m-th pulse output circuits 20_1 to 20_m are configured to sequentially shift a shift pulse in response to a scan line driver circuit start pulse GSP which is input to the first pulse output circuit 20_1. Specifically, after the scan line driver circuit start pulse (GSP) is input to the first pulse output circuit 20_1, the first pulse output circuit 20_1 outputs a shift pulse to the second pulse output circuit 20_2. Next, after the shift pulse output from the first pulse output circuit 20_1 is input to the second pulse output circuit 20_2, the second pulse output circuit 20_2 outputs a shift pulse to the third pulse output circuit 20_3. After that, operations similar to the above operations are repeated until a shift pulse is input to the m-th pulse output circuit 20_m.

The first to m-th pulse output circuits 20_1 to 20_m are configured to output selection signals to respective scan lines 4_1 to 4_m, respective scan lines 5_1 to 5_m, and respective scan lines 6_1 to 6_m, when the scan line driver circuit start pulse (GSP) or a shift pulse is input. Note that the selection signals refer to signals for turning on switches whose switching is controlled by potentials of respective scan lines 4_1 to 4_m, respective scan lines 5_1 to 5_m, and respective scan lines 6_1 to 6_m.

Figure 12:
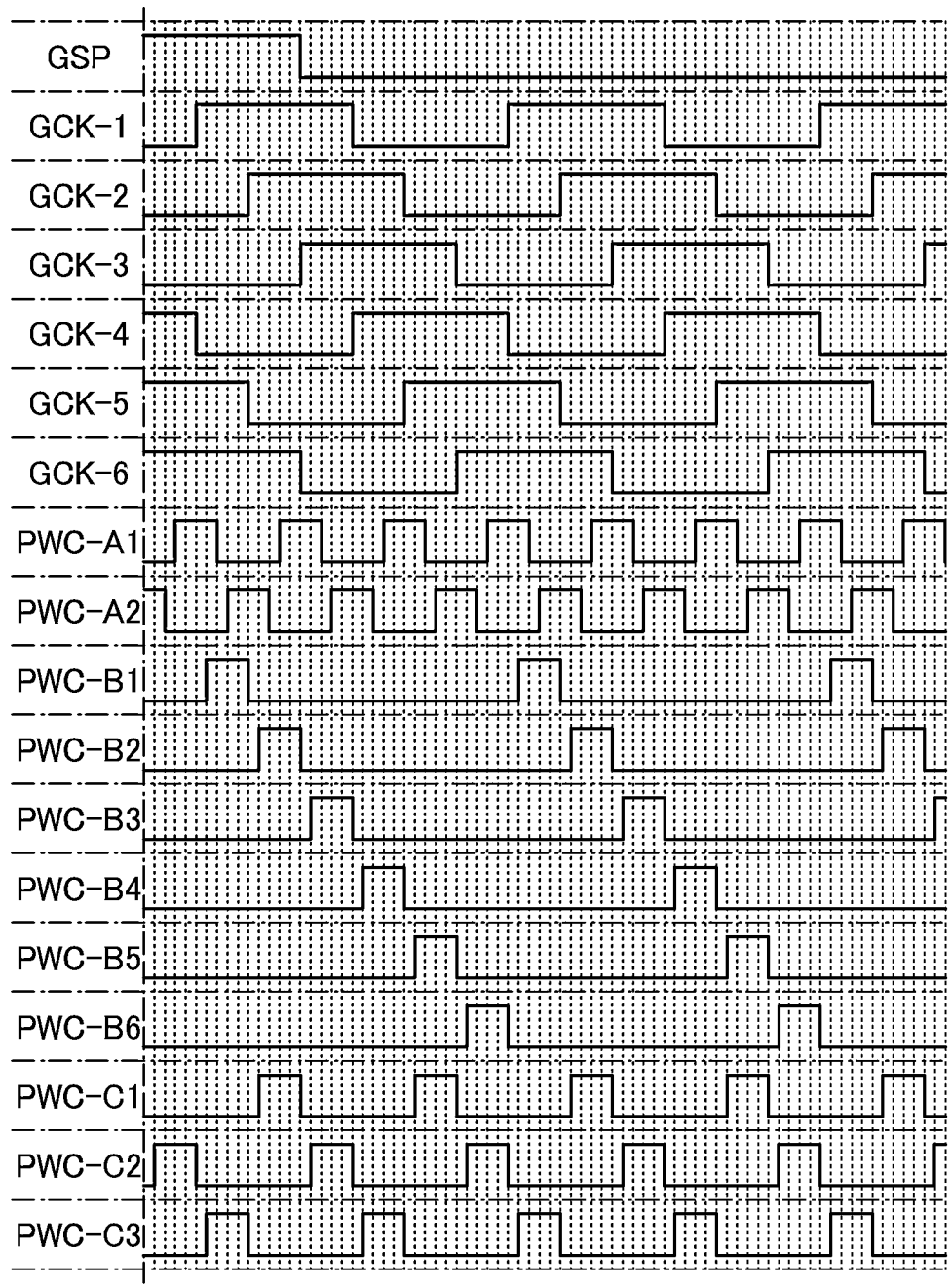
FIG. 12 shows an example of waveforms of a variety of signals.

FIG. 12 shows specific examples of waveforms of the above-described signals.

The first clock signal (GCK-1) for the scan line driver circuit in FIG. 12 periodically alternates between a high-level potential (high power supply potential (Vdd)) and a low-level potential (low power supply potential (Vss)), and has a duty ratio of 1/2. The second clock signal (GCK-2) has a phase shifted by 1/6 period from the first clock signal (GCK-1); the third clock signal (GCK-3) has a phase shifted by 1/3 period from the first clock signal (GCK-1); the fourth clock signal (GCK-4) has a phase shifted by 1/2 period from the first clock signal (GCK-1); the fifth clock signal (GCK-5) has a phase shifted by 2/3 period from the first clock signal (GCK-1); and the sixth clock signal (GCK-6) has a phase shifted by 5/6 period from the first clock signal (GCK-1).

The first pulse width control signal A (PWC-A1) in FIG. 12 periodically alternates between the high-level potential (high power supply potential (Vdd)) and the low-level potential (low power supply potential (Vss)) and has a duty ratio of 2/5. The second pulse width control signal A (PWC-A2) has a phase shifted by 1/2 period from the first pulse width control signal A (PWC-A1).

The first pulse width control signal B (PWC-B1) in FIG. 12 periodically alternates between the high-level potential (high power supply potential (Vdd)) and the low-level potential (low power supply potential (Vss)) and has a duty ratio of 2/15. The second pulse width control signal B (PWC-B2) has a phase shifted by 1/6 period from the first pulse width control signal B (PWC-B1); the third pulse width control signal B (PWC-B3) has a phase shifted by 1/3 period from the first pulse width control signal B (PWC-B1); the fourth pulse width control signal B (PWC-B4) has a phase shifted by 1/2 period from the first pulse width control signal B (PWC-B1); the fifth pulse width control signal B (PWC-B5) has a phase shifted by 2/3 period from the first pulse width control signal B (PWC-B1); and the sixth pulse width control signal B (PWC-B6) has a phase shifted by 5/6 period from the first pulse width control signal B (PWC-B1).

The first pulse width control signal C (PWC-C1) in FIG. 12 periodically alternates between the high-level potential (high power supply potential (Vdd)) and the low-level potential (low power supply potential (Vss)) and has a duty ratio of 4/15. The first pulse width control signal C (PWC-C1) can also be expressed as a signal which is at the high-level potential in a period when the second pulse width control signal B (PWC-B2) is at the high-level potential and in a period when the fifth pulse width control signal B (PWC-B5) is at the high-level potential. The second pulse width control signal C (PWC-C2) has a phase shifted by 1/3 period from the first pulse width control signal C (PWC-C1); and the third pulse width control signal C (PWC-C3) has a phase shifted by 2/3 period from the first pulse width control signal C (PWC-C1).

In the display device in FIG. 11, the same configuration can be applied to the first to m-th pulse output circuits 20_1 to 20_m. Note that electrical connections of a plurality of terminals included in the pulse output circuit differ depending on the pulse output circuits. Specific connections will be described with reference to FIG. 11 and FIG. 13A.

Each of the first to m-th pulse output circuits 20_1 to 20_m has terminals 21 to 30. The terminals 21 to 25 and 29 are input terminals, and the terminals 26 to 28 and 30 are output terminals.

First, the terminal 21 is described. The terminal 21 of the first pulse output circuit 20_1 is electrically connected to a wiring that supplies the scan line driver circuit start pulse (GSP). The terminals 21 of the second to m-th pulse output circuits 20_2 to 20_m are electrically connected to the respective terminals 30 of the respective previous-stage pulse output circuits.

Next, the terminal 22 is described. The terminal 22 of the (6a-5)-th pulse output circuit 20_6a-5 (a is a natural number less than or equal to m/6) is electrically connected to the wiring that supplies the first clock signal (GCK-1). The terminal 22 of the (6a-4)-th pulse output circuit 20_6a-4 is electrically connected to the wiring that supplies the second clock signal (GCK-2). The terminal 22 of the (6a-3)-th pulse output circuit 20_6a-3 is electrically connected to the wiring that supplies the third clock signal (GCK-3). The terminal 22 of the (6a-2)-th pulse output circuit 20_6a-2 is electrically connected to the wiring that supplies the fourth clock signal (GCK-4). The terminal 22 of the (6a-1)-th pulse output circuit 20_6a-1 is electrically connected to the wiring that supplies the fifth clock signal (GCK-5). The terminal 22 of the 6a-th pulse output circuit 20_6a is electrically connected to the wiring that supplies the sixth clock signal (GCK-6).

Then, the terminal 23 is described. The terminal 23 of the (6a-5)-th pulse output circuit 20_6a-5, the terminal 23 of the (6a-3)-th pulse output circuit 20_6a-3, and the terminal 23 of the (6a-1)-th pulse output circuit 20_6a-1 are electrically connected to the wiring that supplies the first pulse width control signal A (PWC-A1). The terminal 23 of the (6a-4)-th pulse output circuit 20_6a-4, the terminal 23 of the (6a-2)-th pulse output circuit 20_6a-2, and the terminal 23 of the 6a-th pulse output circuit 20_6a are electrically connected to the wiring that supplies the second pulse width control signal A (PWC-A2).

Next, the terminal 24 is described. The terminal 24 of the (6a-5)-th pulse output circuit 20_6a-5 is electrically connected to the wiring that supplies the first pulse width control signal B (PWC-B1). The terminal 24 of the (6a-4)-th pulse output circuit 20_6a-4 is electrically connected to the wiring that supplies the second pulse width control signal B (PWC-B2). The terminal 24 of the (6a-3)-th pulse output circuit 20_6a-3 is electrically connected to the wiring that supplies the third pulse width control signal B (PWC-B3). The terminal 24 of the (6a-2)-th pulse output circuit 20_6a-2 is electrically connected to the wiring that supplies the fourth pulse width control signal B (PWC-B4). The terminal 24 of the (6a-1)-th pulse output circuit 20_6a-1 is electrically connected to the wiring that supplies the fifth pulse width control signal B (PWC-B5). The terminal 24 of the 6a-th pulse output circuit 20_6a is electrically connected to the wiring that supplies the sixth pulse width control signal B (PWC-B6).

Then, the terminal 25 is described. The terminal 25 of the (6a-5)-th pulse output circuit 20_6a-5 and the terminal 25 of the (6a-2)-th pulse output circuit 20_6a-2 are electrically connected to the wiring that supplies the first pulse width control signal C (PWC-C1). The terminal 25 of the (6a-4)-th pulse output circuit 20_6a-4 and the terminal 25 of the (6a-1)-th pulse output circuit 20_6a-1 are electrically connected to the wiring that supplies the second pulse width control signal C (PWC-C2). The terminal 25 of the (6a-3)-th pulse output circuit 20_6a-3 and the terminal 25 of the 6a-th pulse output circuit 20_6a are electrically connected to the wiring that supplies the third pulse width control signal C (PWC-C3).

Next, the terminal 26 is described. The terminal 26 of the x-th pulse output circuit 20_x (x is a natural number less than or equal to m) is electrically connected to the scan line 4_x in the x-th row.

Next, the terminal 27 is described. The terminal 27 of the x-th pulse output circuit 20_x is electrically connected to the scan line 5_x in the x-th row.

The terminal 28 is described. The terminal 28 of the x-th pulse output circuit 20_x is electrically connected to the scan line 6_x in the x-th row.

The terminal 29 is described. The terminal 29 of the y-th pulse output circuit 20_y (y is a natural number less than or equal to (m−3)) is electrically connected to the terminal 30 of the (y+3)-th pulse output circuit 20_y+3. The terminal 29 of the (m−2)-th pulse output circuit 20_m−2 is electrically connected to a wiring that supplies a stop signal (STP1) for the (m−2)-th pulse output circuit. The terminal 29 of the (m−1)-th pulse output circuit 20_m−1 is electrically connected to a wiring that supplies a stop signal (STP2) for the (m−1)-th pulse output circuit. The terminal 29 of the m-th pulse output circuit 20_m is electrically connected to a wiring that supplies a stop signal (STP3) for the m-th pulse output circuit. In the case where a (m+1)-th pulse output circuit is provided, the stop signal (STP1) for the (m−2)-th pulse output circuit corresponds to a signal output from the terminal 30 of the (m+1)-th pulse output circuit. In the case where a (m+2)-th pulse output circuit is provided, the stop signal (STP2) for the (m−1)-th pulse output circuit corresponds to a signal output from the terminal 30 of the (m+2)-th pulse output circuit. In the case where a (m+3)-th pulse output circuit is provided, the stop signal (STP3) for the m-th pulse output circuit corresponds to a signal output from the terminal 30 of the (m+3)-th pulse output circuit. Specifically, for example, the (m+1)-th to (m+3)-th pulse output circuits are actually provided as dummy circuits, or the signal is directly input from an external portion; thus such signals can be obtained.

The connection relation of the terminal 30 of each pulse output circuit is described above. Therefore, the description is omitted here by referring to the above description.

In the display device in FIG. 11, the same configuration can be applied to the first to m-th inverted pulse output circuits 60_1 to 60_m. However, electrical connection relations of a plurality of terminals included in the inverted pulse output circuit differ depending on the inverted pulse output circuit. Specific connections will be described with reference to FIG. 11 and FIG. 13B.

Each of the first to m-th inverted pulse output circuits 60_1 to 60_m has terminals 61 to 65. The terminals 61 to 64 are input terminals, and the terminal 65 is an output terminal.

First, the terminal 61 is described. The terminal 61 of the first inverted pulse output circuit 60_1 is electrically connected to a wiring that supplies the scan line driver circuit start pulse (GSP). The terminals 61 of the second to m-th inverted pulse output circuits 60_2 to 60_m are electrically connected to the respective terminals 30 of the respective previous-stage pulse output circuits.

Next, the terminal 62 is described. The terminal 62 of the x-th inverted pulse output circuit 60_x is electrically connected to the terminal 30 of the x-th pulse output circuit 20_x.

Then, the terminal 63 is described. The terminal 63 of the (6a-5)-th inverted pulse output circuit 60_6a-5 is electrically connected to the wiring that supplies the fourth pulse width control signal B (PWC-B4). The terminal 63 of the (6a-4)-th inverted pulse output circuit 60_6a-4 is electrically connected to the wiring that supplies the fifth pulse width control signal B (PWC-B5). The terminal 63 of the (6a-3)-th inverted pulse output circuit 60_6a-3 is electrically connected to the wiring that supplies the sixth pulse width control signal B (PWC-B6). The terminal 63 of the (6a-2)-th inverted pulse output circuit 60_6a-2 is electrically connected to the wiring that supplies the first pulse width control signal B (PWC-B1). The terminal 63 of the (6a-1)-th inverted pulse output circuit 60_6a-1 is electrically connected to the wiring that supplies the second pulse width control signal B (PWC-B2). The terminal 63 of the 6a-th inverted pulse output circuit 60_6a is electrically connected to the wiring that supplies the third pulse width control signal B (PWC-B3).

The terminal 64 is described. The terminal 64 of the y-th inverted pulse output circuit 60_y is electrically connected to the terminal 30 of the (y+3)-th pulse output circuit 20_y+3. The terminal 64 of the (m−2)-th inverted pulse output circuit 60_m−2 is electrically connected to the wiring that supplies a stop signal (STP1) for the (m−2)-th pulse output circuit. The terminal 64 of the (m−1)-th inverted pulse output circuit 60_m−1 is electrically connected to the wiring that supplies a stop signal (STP2) for the (m−1)-th pulse output circuit. The terminal 64 of the m-th inverted pulse output circuit 60_m is electrically connected to the wiring that supplies a stop signal (STP3) for the m-th pulse output circuit. Then, the terminal 65 is described. The terminal 65 of the x-th inverted pulse output circuit 60_x is electrically connected to the inverted scan line 7_x in the x-th row.

<Configuration Example of Pulse Output Circuit>

Figure 13A:
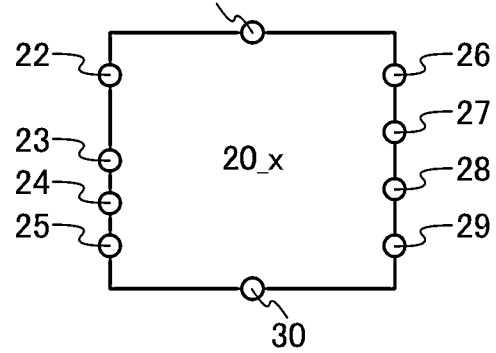
FIG. 13A illustrates terminals of a pulse output circuit.
Figure 14A:
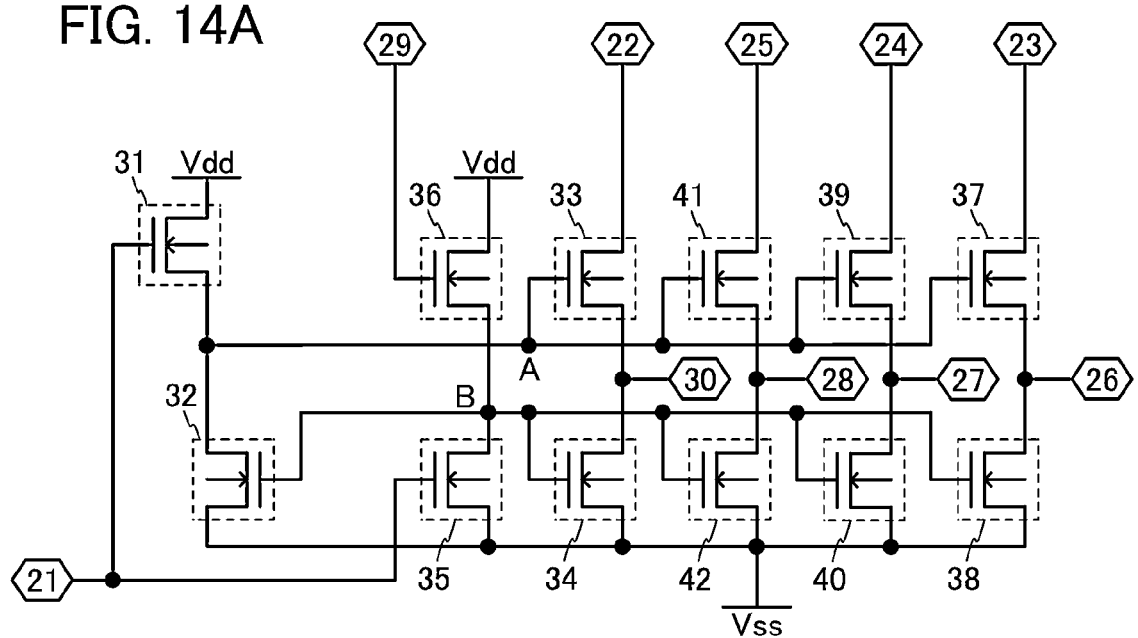
FIG. 14A illustrates a configuration example of a pulse output circuit.

FIG. 14A illustrates a configuration example of the pulse output circuit illustrated in FIG. 11 and FIG. 13A. The pulse output circuit illustrated in FIG. 14A includes transistors 31 to 42.

One of a source and a drain of the transistor 31 is electrically connected to a wiring that supplies the high power supply potential (Vdd) (hereinafter also referred to as a high power supply potential line). A gate of the transistor 31 is electrically connected to the terminal 21.

One of a source and a drain of the transistor 32 is electrically connected to a wiring that supplies the low power supply potential (Vss) (hereinafter also referred to as low power supply potential line); and the other of the source and the drain of the transistor 32 is electrically connected to the other of the source and the drain of the transistor 31.

One of a source and a drain of the transistor 33 is electrically connected to the terminal 22. The other of the source and the drain of the transistor 33 is electrically connected to the terminal 30. A gate of the transistor 33 is electrically connected to the other of the source and the drain of the transistor 31 and the other of the source and the drain of the transistor 32.

One of a source and a drain of the transistor 34 is electrically connected to the low power supply potential line; the other of the source and the drain of the transistor 34 is electrically connected to the terminal 30; and a gate of the transistor 34 is electrically connected to a gate of the transistor 32.

One of a source and a drain of the transistor 35 is electrically connected to the low power supply potential line; the other of the source and the drain of the transistor 35 is electrically connected to the gate of the transistor 32 and the gate of the transistor 34; and a gate of the transistor 35 is electrically connected to the terminal 21.

One of a source and a drain of the transistor 36 is electrically connected to the high power supply potential line; the other of the source and the drain of the transistor 36 is electrically connected to the gate of the transistor 32, the gate of the transistor 34, and the other of the source and the drain of the transistor 35; and a gate of the transistor 36 is electrically connected to the terminal 29.

One of a source and a drain of the transistor 37 is electrically connected to the terminal 23; the other of the source and the drain of the transistor 37 is electrically connected to the terminal 26; and a gate of the transistor 37 is electrically connected to the other of the source and the drain of the transistor 31, the other of the source and the drain of the transistor 32, and the gate of the transistor 33.

One of a source and a drain of the transistor 38 is electrically connected to the low power supply potential line; the other of the source and the drain of the transistor 38 is electrically connected to the terminal 26; and a gate of the transistor 38 is electrically connected to the gate of the transistor 32, the gate of the transistor 34, the other of the source and the drain of the transistor 35, and the other of the source and the drain of the transistor 36.

One of a source and a drain of the transistor 39 is electrically connected to the terminal 24; the other of the source and the drain of the transistor 39 is electrically connected to the terminal 27; and a gate of the transistor 39 is electrically connected to the other of the source and the drain of the transistor 31, the other of the source and the drain of the transistor 32, the gate of the transistor 33, and the gate of the transistor 37.

One of a source and a drain of the transistor 40 is electrically connected to the low power supply potential line; the other of the source and the drain of the transistor 40 is electrically connected to the terminal 27; and a gate of the transistor 40 is electrically connected to the gate of the transistor 32, the gate of the transistor 34, the other of the source and the drain of the transistor 35, the other of the source and the drain of the transistor 36, and the gate of the transistor 38.

One of a source and a drain of the transistor 41 is electrically connected to the terminal 25; the other of the source and the drain of the transistor 41 is electrically connected to the terminal 28; and a gate of the transistor 41 is electrically connected to the other of the source and the drain of the transistor 31, the other of the source and the drain of the transistor 32, the gate of the transistor 33, the gate of the transistor 37, and the gate of the transistor 39.

One of a source and a drain of the transistor 42 is electrically connected to the low power supply potential line; the other of the source and the drain of the transistor 42 is electrically connected to the terminal 28; and a gate of the transistor 42 is electrically connected to the gate of the transistor 32, the gate of the transistor 34, the other of the source and the drain of the transistor 35, the other of the source and the drain of the transistor 36, the gate of the transistor 38, and the gate of the transistor 40.

Note that in the following description, a node where the other of the source and the drain of the transistor 31, the other of the source and the drain of the transistor 32, the gate of the transistor 33, the gate of the transistor 37, the gate of the transistor 39, and the gate of the transistor 41 are electrically connected is referred to as a node A. A node where the gate of the transistor 32, the gate of the transistor 34, the other of the source and the drain of the transistor 35, the other of the source and the drain of the transistor 36, the gate of the transistor 38, the gate of the transistor 40, and the gate of the transistor 42 are electrically connected is referred to as a node B.

<Operation Example of Pulse Output Circuit>

Figure 14B:
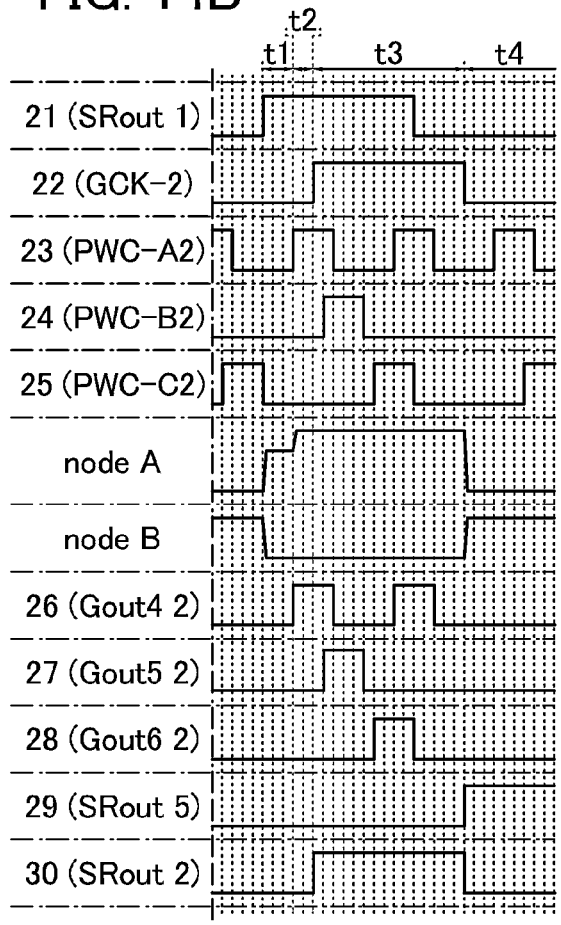
FIG. 14B shows an operation example thereof.

Operation example of the above pulse output circuit is described with reference to FIG. 14B. FIG. 14B shows signals input to the respective terminals of the second pulse output circuit 20_2 at the time when a shift pulse is input from the first pulse output circuit 20_1, potentials of the signals output from the respective terminals, and potentials of the nodes A and B. Note that in FIG. 14B, Gout4 represents a signal output from any of the pulse output circuits to the corresponding scan line 4, Gout5 represents a signal output from any of the pulse output circuits to the corresponding scan line 5, Gout6 represents a signal output from any of the pulse output circuits to the corresponding scan line 6, and SRout represents a signal output from any of the pulse output circuits to the next-stage pulse output circuit.

First, the case where a shift pulse is input from the first pulse output circuit 20_1 to the second pulse output circuit 20_2 is described with reference to FIG. 14B.

In a period t1, the high-level potential (high power supply potential (Vdd)) is input to the terminal 21. Thus, the transistors 31 and 35 are turned on, so that the potential of the node A is raised to a high-level potential (a potential lower than the high power supply potential (Vdd) by the threshold voltage of the transistor 31), and the potential of the node B is decreased to the low power supply potential (Vss). Accordingly, the transistors 33, 37, 39, and 41 are turned on, and the transistors 32, 34, 38, 40 and 42 are turned off. Thus, in the period t1, a signal output from the terminal 26 is input to the terminal 23, a signal output from the terminal 27 is input to the terminal 24, a signal output from the terminal 28 is input to the terminal 25, and a signal output from the terminal 30 is input to the terminal 22. Here, in the period t1, the signals input to the terminals 22 to 25 are at the low-level potential (low power supply potential (Vss)). Thus, in the period t1, the second pulse output circuit 20_2 outputs the low-level potential (low power supply potential (Vss)) to the terminal 21 of the third pulse output circuit 20_3 and the scan lines 4_2, 5_2, and 6_2 in the second row in a pixel portion.

In a period t2, the high-level potential (high power supply potential (Vdd)) is input to the terminal 23. Note that the potential of the node A (potential of the source of the transistor 31) is increased to a high-level potential (potential lower than the high power supply potential (Vdd) by the threshold voltage of the transistor 31) in the period t1. Therefore, the transistor 31 is off. At this time, the input of the high-level potential (high power supply potential (Vdd)) to the terminal 23 further raises the potential of the node A (a potential of the gate of the transistor 37) owing to the capacitive coupling between the gate and the source of the transistor 37 (bootstrapping). Owing to the bootstrapping, the potential of the signal output from the terminal 26 is not lower than the high-level potential (high power supply potential (Vdd)) input to the terminal 23 (a signal which is the same or substantially the same as the signal input to the terminal 23 is output from the terminal 26). Accordingly, in the period t2, the second pulse output circuit 20_2 outputs the high-level potential (high power supply potential (Vdd)=a selection signal) to the scan line 4_2 in the second row in the pixel portion. In addition, the second pulse output circuit 20_2 outputs the low-level potential (low power supply potential (Vss)) to the terminal 21 of the third pulse output circuit 20_3 and the scan lines 5_2 and 6_2 in the second row in the pixel portion.

In a period t3, the high-level potential (high power supply potential (Vdd)) is input to at least the terminal 22. Thus, the potential of the node A remains higher than that in the period t1 as in the period t2. Accordingly, a signal which is the same or substantially the same as the signal input to the terminal 23 is output from the terminal 26; a signal which is the same or substantially the same as the signal input to the terminal 24 is output from the terminal 27; a signal which is the same or substantially the same as the signal input to the terminal 25 is output from the terminal 28; and a signal which is the same or substantially the same as the signal input to the terminal 22 is output from the terminal 30. That is to say, in the period t3, the second pulse output circuit 202 outputs a signal which is the same or substantially the same as the signal input to the terminal 22 to the terminal 21 of the third pulse output circuit 20_3, a signal which is the same or substantially the same as the signal input to the terminal 23 to the scan line 4_2, a signal which is the same or substantially the same as the signal input to the terminal 24 to the scan line 5_2, and a signal which is the same or substantially the same as the signal input to the terminal 25 to the scan line 6_2.

In a period t4, a high-level potential (high power supply potential (Vdd)) is input to the terminal 29. Thus, the transistor 36 is turned on, so that the potential of the node B is raised to a high-level potential (a potential lower than the high power supply potential (Vdd) by the threshold voltage of the transistor 36). That is, the transistors 32, 34, 38, 40, 42 are turned on. The potential of the node A is decreased to the low-level potential (low power supply potential (Vss)) accordingly. As a result, the transistors 33, 37, 39, and 41 are turned off. Thus, in the period t4, all the signals output from the terminals 26, 27, 28, and 30 are at the low power supply potential (Vss). In other words, in the period t4, the second pulse output circuit 20_2 outputs the low power supply potential (Vss) to the terminal 21 of the third pulse output circuit 20_3, and the scan lines 4_2, 5_2, and 6_2 in the second row in the pixel portion.

<Configuration Example of Inverted Pulse Output Circuit>

Figure 13B:
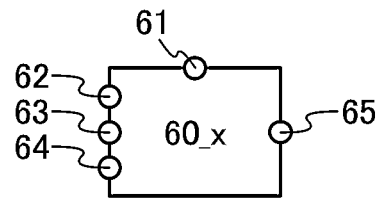
FIG. 13B illustrates terminals of an inverted pulse output circuit.
Figure 15A:
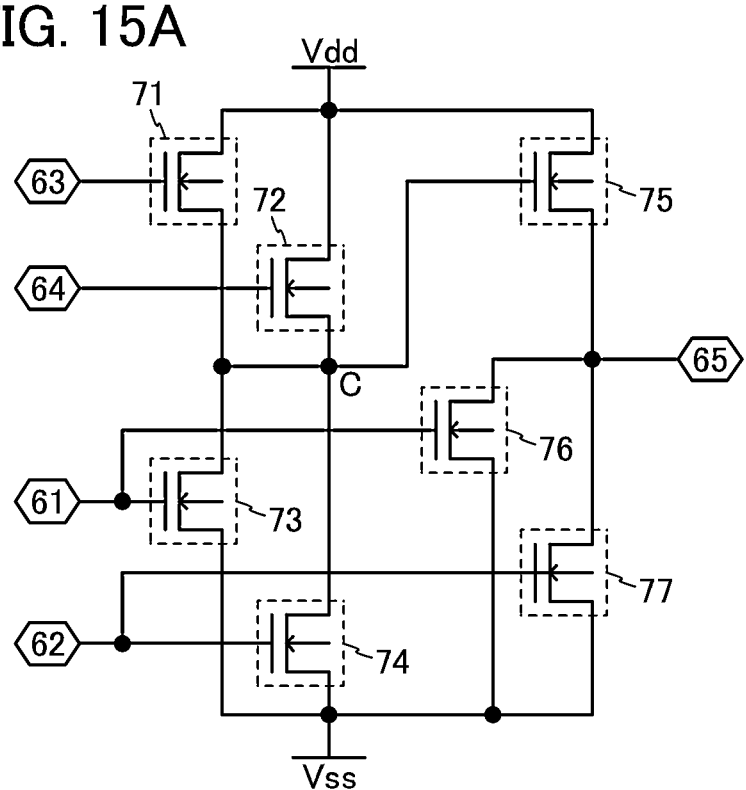
FIG. 15A illustrates a configuration example of an inverted pulse output circuit.

FIG. 15A illustrates a configuration example of the inverted pulse output circuit illustrated in FIG. 11 and FIG. 13B. The inverted pulse output circuit in FIG. 15A includes transistors 71 to 77.

One of a source and a drain of the transistor 71 is electrically connected to the high power supply potential line; and a gate of the transistor 71 is electrically connected to the terminal 63.

One of a source and a drain of the transistor 72 is electrically connected to the high power supply potential line; the other of the source and the drain of the transistor 72 is electrically connected to the other of the source and the drain of the transistor 71; and a gate of the transistor 72 is electrically connected to the terminal 64.

One of a source and a drain of the transistor 73 is electrically connected to the low power supply potential line; the other of the source and the drain of the transistor 73 is electrically connected to the other of the source and the drain of the transistor 71 and the other of the source and the drain of the transistor 72; and a gate of the transistor 73 is electrically connected to the terminal 61.

One of a source and a drain of the transistor 74 is electrically connected to the low power supply potential line; the other of the source and the drain of the transistor 74 is electrically connected to the other of the source and the drain of the transistor 71, the other of the source and the drain of the transistor 72, and the other of the source and the drain of the transistor 73; and a gate of the transistor 74 is electrically connected to the terminal 62.

One of a source and a drain of the transistor 75 is electrically connected to the high power supply potential line; the other of the source and the drain of the transistor 75 is electrically connected to the terminal 65; and a gate of the transistor 75 is electrically connected to the other of the source and the drain of the transistor 71, the other of the source and the drain of the transistor 72, the other of the source and the drain of the transistor 73, and the other of the source and the drain of the transistor 74.

One of a source and a drain of the transistor 76 is electrically connected to the low power supply potential line; the other of the source and the drain of the transistor 76 is electrically connected to the terminal 65; and a gate of the transistor 76 is electrically connected to the terminal 61.

One of a source and a drain of the transistor 77 is electrically connected to the low power supply potential line; the other of the source and the drain of the transistor 77 is electrically connected to the terminal 65; and a gate of the transistor 77 is electrically connected to the terminal 62.

Note that in the following description, a node where the other of the source and the drain of the transistor 71, the other of the source and the drain of the transistor 72, the other of the source and the drain of the transistor 73, the other of the source and the drain of the transistor 74, and the gate of the transistor 75 are electrically connected is referred to as a node C.

<Operation Example of Inverted Pulse Output Circuit>

Figure 15B:
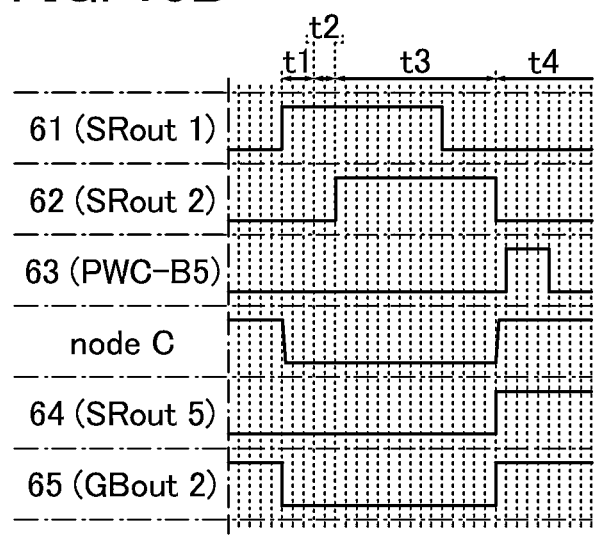
FIG. 15B shows an operation example thereof.

An operation example of the inverted pulse output circuit is described with reference to FIG. 15B. FIG. 15B shows signals input to the respective terminals of the second inverted pulse output circuit 20_2, potentials of signals output therefrom, and potentials of the node C in periods t1 to t4. The periods t1 to t4 in FIG. 15B correspond to the periods t1 to t4 in FIG. 14B. Note that in FIG. 15B, the signals input to the terminals are provided in parentheses. Further, in FIG. 15B, GBout represents a signal output to any of the inverted scan line of the inverted pulse output circuits.

In periods t1 to t3, a high-level potential (high power supply potential (Vdd)) is input to at least one of the terminal 61 and the terminal 62. Thus, the transistors 73 and 76 or the transistors 74 and 77 are turned on, so that the potential of the node C is decreased to a low-level potential (low power supply potential (Vss)). The transistor 75 is turned off accordingly. Thus, in the periods t1 to t3, the signal output from the terminal 65 is at the low-level potential (low power supply potential (Vss)), so that in the periods t1 to t3, the second inverted pulse output circuit 60_2 outputs the low-level potential (low power supply potential (Vss)) to the inverted scan line 7_2 in the second row in the pixel portion.

In the period t4, the low-level potential (low power supply potential (Vss)) is input to the terminal 61 and the terminal 62, and the high-level potential (high power supply potential (Vdd)) is input to the terminal 64. Accordingly, the transistors 73, 74, 76, and 77 are turned off, and the transistor 72 is turned on, so that the potential of the node C is raised to a high-level potential (a potential lower than the high power supply potential (Vdd) by the threshold voltage of the transistor 72), and the transistor 75 is turned on. Note that the transistor 72 is turned off when the potential of the node C is raised to the potential lower than the high power supply potential (Vdd) by the threshold voltage of the transistor 72. When the transistor 72 is turned off, the transistor 75 remains on. In this case, the potential of the node C is further raised even after the transistor 72 is turned off, owing to the capacitive coupling between the gate (node C) and the source of the transistor 75. Thus, the signal output from the terminal 65 is not lower than the high power supply potential (Vdd).

Accordingly, in the period t4, the signal output from the terminal 65 is at the high power supply potential (Vdd). That is, in the period t4, the second inverted pulse output circuit 60_2 outputs the high power supply potential (Vdd) to the inverted scan line 7_2 in the second row in the pixel portion.

<Configuration Example of Pixel>

Figure 16A:
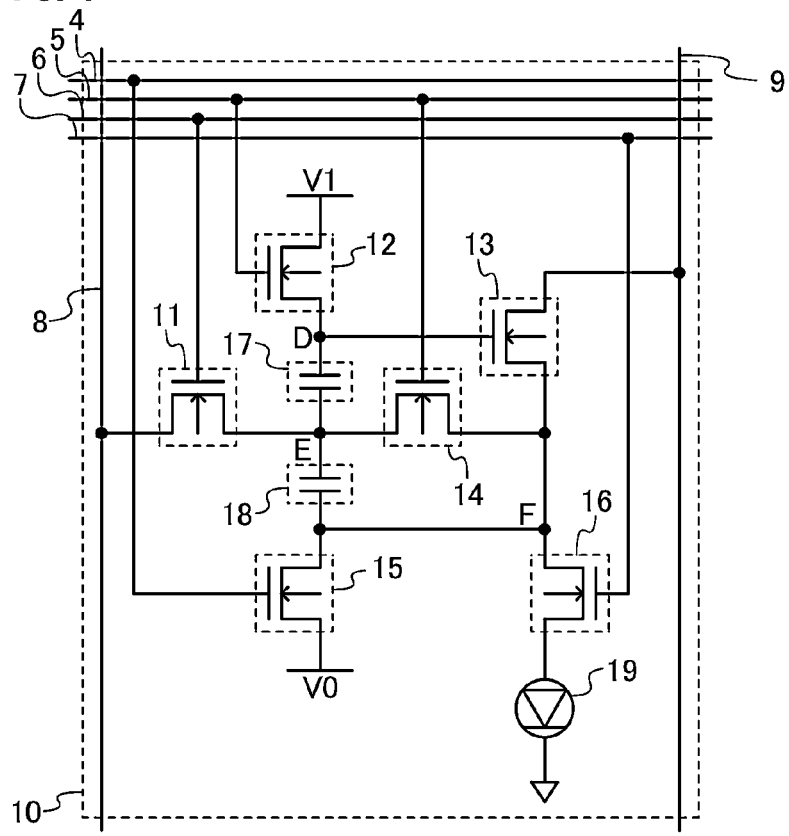
FIG. 16A illustrates a configuration example of a pixel.

FIG. 16A is a circuit diagram illustrating a configuration example of the pixel 10 in FIG. 10. Here, the case where an element in which an organic material emitting light owing to current excitation is provided between a pair of electrodes (hereinafter also referred to as organic electroluminescent (EL) element) is used for a display element is described.

The pixel 10 illustrated in FIG. 16A includes transistors 11 to 16, capacitors 17 and 18, and an organic EL element 19.

One of a source and a drain of the transistor 11 is electrically connected to the signal line 8; and a gate of the transistor 11 is electrically connected to the scan line 6.

One of a source and a drain of the transistor 12 is electrically connected to a wiring that supplies a potential V1; and a gate of the transistor 12 is electrically connected to the scan line 5. Here, assume that the potential V1 is lower than the high power supply potential (Vdd) and higher than the low power supply potential (Vss).

One of a source and a drain of the transistor 13 is electrically connected to the power supply line 9; and a gate of the transistor 13 is electrically connected to the other of the source and the drain of the transistor 12.

One of a source and a drain of the transistor 14 is electrically connected to the other of the source and the drain of the transistor 11; the other of the source and the drain of the transistor 14 is electrically connected to the other of the source and the drain of the transistor 13; and a gate of the transistor 14 is electrically connected to the scan line 5.

One of a source and a drain of the transistor 15 is electrically connected to a wiring that supplies a potential V0; the other of the source and the drain of the transistor 15 is electrically connected to the other of the source and the drain of the transistor 13 and the other of the source and the drain of the transistor 14; and a gate of the transistor 15 is electrically connected to the scan line 4. Here, assume that the potential V0 is lower than the potential V1 and higher than the low power supply potential (Vss).

One of a source and a drain of the transistor 16 is electrically connected to the other of the source and the drain of the transistor 13, the other of the source and the drain of the transistor 14, and the other of the source and the drain of the transistor 15; and a gate of the transistor 16 is electrically connected to the inverted scan line 7.

One electrode of the capacitor 17 is electrically connected to the other of the source and the drain of the transistor 12 and the gate of the transistor 13; and the other electrode of the capacitor 17 is electrically connected to the other of the source and the drain of the transistor 11 and the one of the source and the drain of the transistor 14.

One electrode of the capacitor 18 is electrically connected to the other of the source and the drain of the transistor 11, the one of the source and the drain of the transistor 14 and the other electrode of the capacitor 17; and the other electrode of the capacitor 18 is electrically connected to the other of the source and the drain of the transistor 13, the other of the source and the drain of the transistor 14, the other of the source and the drain of the transistor 15, and the one of the source and the drain of the transistor 16.

An anode of the organic EL element 19 is electrically connected to the other of the source and the drain of the transistor 16; a cathode of the organic EL element 19 is electrically connected to a wiring that supplies a common potential. Note that the common potential given to the wiring electrically connected to the one of the source and the drain of the transistor 12 may be different from the common potential given to the cathode of the organic EL element 19.

Here, assume that the potential supplied by the power supply line 9 is lower than the high power supply potential (Vdd) and higher than the potential V1, and the common potential is lower than the low power supply potential (Vss).

Hereinafter, a node where the other of the source and the drain of the transistor 12, the gate of the transistor 13, and the one electrode of the capacitor 17 are electrically connected is referred to as a node D. A node where the other of the source and the drain of the transistor 11, the one of the source and the drain of the transistor 14, the other electrode of the capacitor 17, and the one electrode of the capacitor 18 are electrically connected is referred to as a node E. A node where the other of the source and the drain of the transistor 13, the other of the source and the drain of the transistor 14, the other of the source and the drain of the transistor 15, the one of the source and the drain of the transistor 16, and the other electrode of the capacitor 18 are electrically connected is referred to as a node F.

Figure 17A:
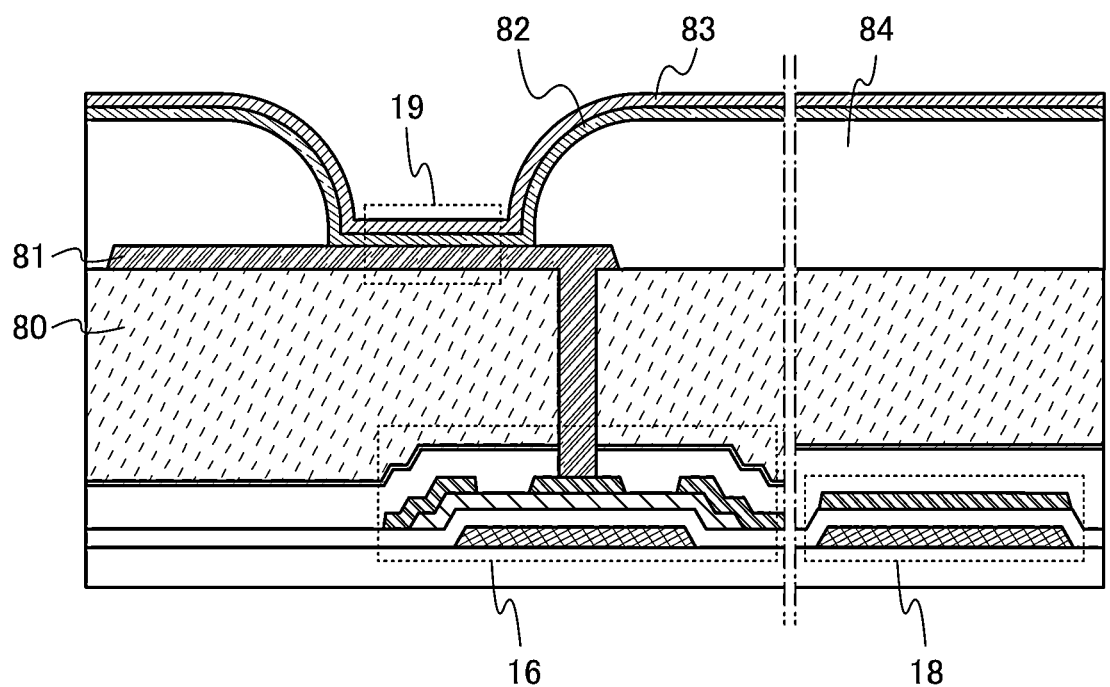
FIG. 17A is a cross-sectional view of part of a pixel of a display device using an organic EL element.

FIG. 17A illustrates part of a cross section of the pixel 10. Note that the transistors other than the transistor 16 are not illustrated for simplicity.

FIG. 17A illustrates an example where the transistor 16 and the capacitor 18 are provided in the same plane. With such a structure, one of capacitor electrodes, a dielectric layer, and the other of the capacitor electrodes, which are included in the capacitor 18, can be formed using the same layers and the same materials as the gate electrode, the gate insulating film, and the source electrode (drain electrode), which are included in the transistor 16, respectively.

When the transistor 16 and the capacitor 18 are provided in the same plane, the number of manufacturing steps of a display device can be reduced; thus, productivity can be increased.

Any of the transistors described in the above embodiments can be employed for the transistor 16. FIG. 17A shows an example where a transistor whose structure and manufacturing method are similar to those of FIGS. 1A and 1B is used.

A planarization insulating film 80 having an opening portion extended to the drain electrode of the transistor 16 is provided over the transistor 16 and the capacitor 18.

An anode 81 is provided over the planarization insulating film 80. The anode 81 is in contact with the drain electrode of the transistor 16 through the opening portion in the planarization insulating film 80.

A partition 84 having an opening portion extended to the anode 81 is provided over the anode 81.

A light-emitting layer 82 in contact with the anode 81 in the opening portion in the partition 84 is provided over the partition 84.

A cathode 83 is provided over the light-emitting layer 82.

A region where the anode 81, the light-emitting layer 82, and the cathode 83 overlap with one another functions as the organic EL element 19.

Note that the planarization insulating film 80 can be formed using any of the materials for the planarization insulating film 126.

Figure 17B:
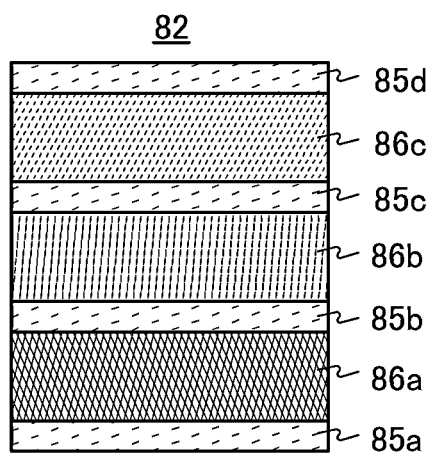
FIG. 17B is a cross-sectional view of a light-emitting layer in the pixel.

The light-emitting layer 82 is not limited to a single layer, and may be a stack of plural kinds of light-emitting materials. For example, a structure illustrated in FIG. 17B may be employed. FIG. 17B illustrates a structure in which an intermediate layer 85a, a light-emitting layer 86a, an intermediate layer 85b, a light-emitting layer 86b, an intermediate layer 85c, a light-emitting layer 86c, and an intermediate layer 85d are stacked in this order. In this case, when materials emitting light of appropriate colors are used for the light-emitting layer 86a, the light-emitting layer 86b, and the light-emitting layer 86c, the organic EL element 19 with a high color rending property or higher emission efficiency can be formed.

Plural kinds of light-emitting materials may be stacked to obtain white light. Although not illustrated in FIG. 17A, white light may be extracted through coloring layers.

Although the structure in which three light-emitting layers and four intermediate layers are provided is shown here, the number of light-emitting layers and the number of intermediate layers can be changed as appropriate without limitation thereto. For example, the light-emitting layer 82 can be formed with the intermediate layer 85a, the light-emitting layer 86a, the intermediate layer 85b, the light-emitting layer 86b, and the intermediate layer 85c. Alternatively, the light-emitting layer 82 may be formed with the intermediate layer 85a, the light-emitting layer 86a, the intermediate layer 85b, the light-emitting layer 86b, the light-emitting layer 86c, and the intermediate layer 85d; the intermediate layer 85c may be omitted.

Further, the intermediate layer can be formed using a stacked-layer structure including any of a hole-injection layer, a hole-transport layer, an electron-transport layer, an electron-injection layer, and the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The anode 81 may be formed using a conductive film having a transmitting property with respect to visible light. The phrase "having a transmitting property with respect to visible light" means that the average transmittance of light in a visible light region (for example, a wavelength range from 400 nm to 800 nm) is higher than or equal to 70%, particularly higher than or equal to 80%.

As the anode 81, for example, an oxide film such as an In—Zn—W-based oxide film, an In—Sn-based oxide film, an In—Zn-based oxide film, an In-based oxide film, a Zn-based oxide film, or a Sn-based oxide film may be used. The above oxide film may contain a minute amount of Al, Ga, Sb, F, or the like. Further, a metal thin film having a thickness small enough to transmit light (preferably, approximately 5 nm to 30 nm) can also be used. For example, a Ag film, a Mg film, or a Ag—Mg alloy film with a thickness of 5 nm may be used.

The anode 81 is preferably a film which efficiently reflects visible light. For example, a film containing lithium, aluminum, titanium, magnesium, lanthanum, silver, silicon, or nickel may be used as the anode 81.

The cathode 83 can be formed using any of the films for the anode 81. Note that when the anode 81 has a transmitting property with respect to visible light, it is preferable that the cathode 83 efficiently reflect visible light. When the anode 81 efficiently reflects visible light, it is preferable that the cathode 83 have a transmitting property with respect to visible light.

Positions of the anode 81 and the cathode 83 are not limited to the structure illustrated in FIG. 17A, and the anode 81 and the cathode 83 may be replaced with each other. It is preferable to use a material having a high work function for the electrode which functions as an anode, and a material having a low work function for the electrode which functions as a cathode. Note that in the case where a carrier generation layer is provided in contact with the anode, a variety of conductive materials can be used for the anode regardless of their work functions.

The partition 84 may be formed using any of the materials for the planarization insulating film 126.

The transistor 16 connected to the organic EL element 19 has less variation in electric characteristics, which enables an increase in display quality of the display device.

<Operation Example of Pixel>

Figure 16B:
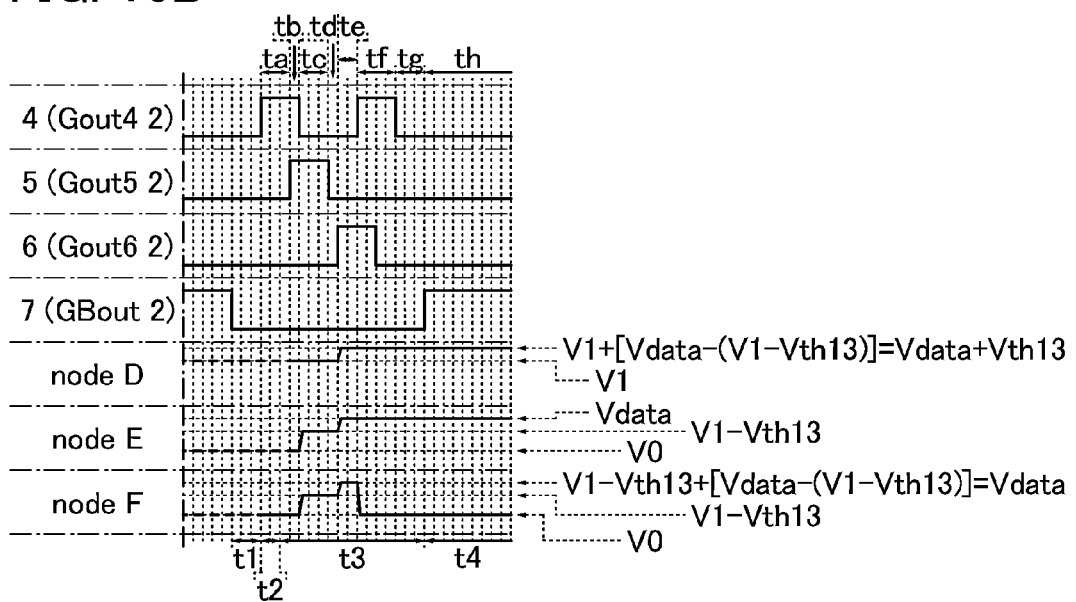
FIG. 16B shows an operation example thereof.

An operation example of the above pixel will be described with reference to FIGS. 16A and 16B. Specifically, an operation example of the pixel in periods ta to th included in the periods t1 to t4 in FIG. 14B and FIG. 15B will be described below with reference to FIGS. 16A and 16B. Note that FIG. 16B shows the potentials of the scan lines 4_2, 5_2, and 6_2 and the inverted scan line 72, which are provided in the second row in the pixel portion, and the nodes D to F. In FIG. 16B, signals input to the respective wirings are provided in parentheses.

In the period ta, the selection signal is input to the scan line 4_2 and is not input to the scan lines 5_2 and 6_2 and the inverted scan line 7_2. Thus, the transistor 15 is turned on and the transistors 11, 12, 14, and 16 are turned off. As a result, the potential of the node F becomes a potential V0.

In the period tb, the selection signal is input to the scan line 5_2. Accordingly, the transistors 12 and 14 are turned on, so that the node D and the node E become at a potential V1 and at a potential V0, respectively. In response to the change of the potential of the node D to the potential V1, the transistor 13 is turned on.

In the period tc, the input of the selection signal to the scan line 4_2 is stopped. Accordingly, the transistor 15 is turned off. Here, the transistor 13 remains in an on state until the voltage between the gate and the source becomes lower than or equal to the threshold voltage. In other words, the transistor 13 remains in an on state until the potentials of the nodes E and F (the source of the transistor 13) become lower than the potential of the node D (potential V1) by the threshold voltage of the transistor 13 (Vth13). Consequently, the potentials of the nodes E and F become the above values.

In the period td, the input of the selection signal to the scan line 5_2 is stopped. Accordingly, the transistors 12 and 14 are turned off.

In the period te, the selection signal is input to the scan line 6_2. Accordingly, the transistor 11 is turned on. Assume that the potential (Vdata) of an image signal is supplied to the signal line 8. Thus, the node E becomes at the potential (Vdata) of the image signal. In addition, the potentials of the nodes D and F are also changed owing to the potential of the node E. Specifically, the potential of the node D in a floating state is raised or lowered by the amount of change in potential of the node E (the difference between the potential (Vdata) of the image signal and the potential lower than the potential V1 by the threshold voltage of the transistor 13 (Vth13)) owing to the capacitive coupling between the node D and the node E through the capacitor 17 (the potential of the node D becomes V1+[Vdata−(V1−Vth13)]=Vdata+Vth13); and the potential of the node F in a floating state is raised or lowered by the amount of change in potential of the node E owing to the capacitive coupling between the node E and the node F through the capacitor 18 (the potential of the node F becomes V1−Vth13+[Vdata−(V1−Vth13)]=Vdata).

In the period tf, the selection signal is input to the scan line 4_2. Accordingly, the transistor 15 is turned on. Accordingly, the node F becomes at a potential V0.

In the period tg, the input of the selection signal to the scan line 4_2 is stopped. Accordingly, the transistor 15 is turned off.

In the period th, the selection signal is input to the inverted scan line 7_2. Thus, the transistor 16 is turned on. Accordingly, a current depending on the voltage between the gate and the source of the transistor 13 is supplied to the organic EL element 19. Here, the voltage corresponds to the difference between the potential of the node D (Vdata+Vth13) and the potential of the node F. In this case, the current supplied to the organic EL element 19 (the drain current in a saturated region of the transistor 13) is not dependent on the threshold voltage of the transistor 13.

Through the above operations, the pixels 10 display an image in accordance with the potential (Vdata) of the image signal. In the operation example of the pixel, current can be supplied to the organic EL element 19 without dependence on the threshold voltage of the transistor 13 provided in the pixel 10. Thus, even when the threshold voltages vary among the transistors 13 included in the plurality of pixels in the display device disclosed in this specification, it is possible to reduce a deterioration in display quality.

In the above-described display device, the operation of the inverted pulse output circuits is controlled by a plurality of kinds of signals. Thus, a flow-through current generated in the inverted pulse output circuits can be reduced. Further, signals used for the operation of the plurality of pulse output circuits are used as the plurality of kinds of signals. That is, the inverted pulse output circuits can be operated without generating a signal additionally.

<Example of Display Device Including Liquid Crystal Element>

In this embodiment, a display device including an organic EL element as the display element is described in detail; however, the display device is not limited thereto. For example, application of this embodiment to a display device including a liquid crystal element as the display element is readily conceived by those skilled in the art. As a specific example, a structure of a pixel which can be applied to a display device including a liquid crystal element will be described below.

Figure 18A:
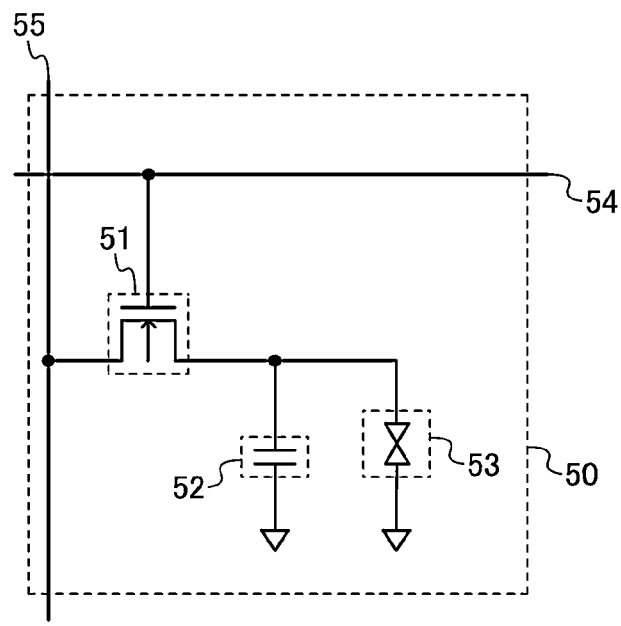
FIG. 18A is a circuit diagram of a pixel of a display device using a liquid crystal element.

FIG. 18A is a circuit diagram illustrating a structure example of the pixel of the display device including a liquid crystal element. A pixel 50 in FIG. 18A includes a transistor 51, a capacitor 52, and an element in which a liquid crystal material is filled between a pair of electrodes (hereinafter also referred to as a liquid crystal element) 53.

One of a source and a drain of the transistor 51 is electrically connected to a signal line 55, and a gate of the transistor 51 is electrically connected to a scan line 54.

One of electrodes of the capacitor 52 is electrically connected to the other of the source and the drain of the transistor 51, and the other of the electrodes of the capacitor 52 is electrically connected to a wiring for supplying a common potential.

One of electrodes of the liquid crystal element 53 is electrically connected to the other of the source and the drain of the transistor 51, and the other of the electrodes of the liquid crystal element 53 is electrically connected to a wiring for supplying a common potential. Note that the common potential supplied to the other of the electrodes of the liquid crystal element 53 may be different from the common potential supplied to the wiring electrically connected to the other of the electrodes of the capacitor 52.

Figure 18B:
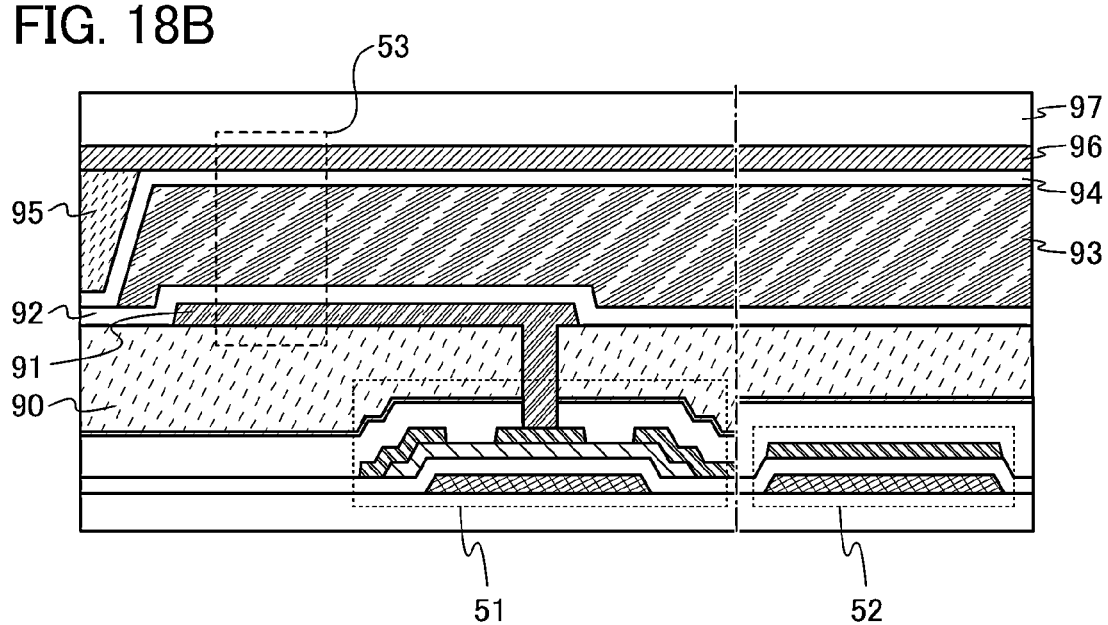
FIG. 18B is a cross-sectional view of the pixel.

FIG. 18B illustrates part of a cross section of the pixel 50.

FIG. 18B shows an example where the transistor 51 and the capacitor 52 are provided in the same plane. With such a structure, one of capacitor electrodes, a dielectric layer, and the other of the capacitor electrodes, which are included in the capacitor 52, can be formed using the same layers and the same materials as the gate electrode, the gate insulating film, and the source electrode (drain electrode), which are included in the transistor 51, respectively.

When the transistor 51 and the capacitor 52 are provided in the same plane, the number of manufacturing steps of a display device can be reduced; thus, productivity can be increased.

Any of the transistors described in the above embodiments can be applied to the transistor 51. FIG. 18B shows an example where a transistor whose structure and manufacturing method are similar to those of FIGS. 1A and 1B is used.

A planarization insulating film 90 having an opening portion extended to the drain electrode of the transistor 51 is provided over the transistor 51 and the capacitor 52.

An electrode 91 is provided over the planarization insulating film 90. The electrode 91 is in contact with the drain electrode of the transistor 51 through the opening portion in the planarization insulating film 90.

An insulating film 92 functioning as an alignment film is provided over the electrode 91.

A liquid crystal layer 93 is provided over the insulating film 92.

An insulating film 94 functioning as an alignment film is provided over the liquid crystal layer 93.

A spacer 95 is provided over the insulating film 94.

An electrode 96 is provided over the spacer 95 and the insulating film 94.

A substrate 97 is provided over the electrode 96.

Note that the planarization insulating film 90 can be formed using any of the materials for the planarization insulating film 126 described in Embodiment 2.

For the liquid crystal layer 93, a thermotropic liquid crystal, a low-molecular liquid crystal, a polymer liquid crystal, a polymer-dispersed liquid crystal, a ferroelectric liquid crystal, an anti-ferroelectric liquid crystal, or the like may be used. Such a liquid crystal material exhibits a cholesteric phase, a smectic phase, a cubic phase, a chiral nematic phase, an isotropic phase, or the like depending on conditions.

For the liquid crystal layer 93, a liquid crystal material exhibiting a blue phase may be used. In that case, the insulating films 92 and 94 functioning as the alignment films are not necessarily provided.

The electrode 91 may be formed using a conductive film having a transmitting property with respect to visible light.

As the electrode 91, for example, an oxide film such as an In—Zn—W-based oxide film, an In—Sn-based oxide film, an In—Zn-based oxide film, an In-based oxide film, a Zn-based oxide film, or a Sn-based oxide film may be used. The above oxide film may contain a minute amount of Al, Ga, Sb, F, or the like. Further, a metal thin film having a thickness small enough to transmit light (preferably, approximately 5 nm to 30 nm) can also be used.

The electrode 91 is preferably a film which efficiently reflects visible light. For example, a film containing aluminum, titanium, chromium, copper, molybdenum, silver, tantalum, or tungsten may be used as the electrode 91.

The electrode 96 can be formed using any of the films for the electrode 91. Note that when the electrode 91 has a transmitting property with respect to visible light, it is preferable that the electrode 96 efficiently reflect visible light. When the electrode 91 efficiently reflects visible light, it is preferable that the electrode 96 have a transmitting property with respect to visible light.

Positions of the electrode 91 and the electrode 96 are not limited to the structure illustrated in FIG. 18B, and the electrode 91 and the electrode 96 may be replaced with each other.

Each of the insulating films 92 and 94 may be formed using an organic compound material or an inorganic compound material.

The spacer 95 may be formed using an organic compound material or an inorganic compound material. Note that the spacer 95 can have a variety of shapes such as a columnar shape and a spherical shape.

The transistor 51 connected to the liquid crystal element 53 has less variation in electric characteristics, which enables an increase in display quality of the display device.

A region where the electrode 91, the insulating film 92, the liquid crystal layer 93, the insulating film 94, and the electrode 96 overlap with one another functions as the liquid crystal element 53.

For the substrate 97, a glass material, a resin material, a metal material, or the like may be used. The substrate 97 may be a flexible substrate.

The transistor 51 has less variation in electric characteristics, which enables an increase in display quality of the display device.

As described in this embodiment, any of the transistors described in the above embodiment can be used for part of a display device. Since the transistor has less variation in electric characteristics, display quality of the display device can be increased.

Embodiment 4

A semiconductor device disclosed in this specification can be applied to a variety of electronic devices (including game machines). Examples of electronic devices to which the present invention can be applied include a television set (also referred to as a television or a television receiver), a monitor of a computer, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 19A to 19C and FIGS. 20A to 20C.

Figure 19A:
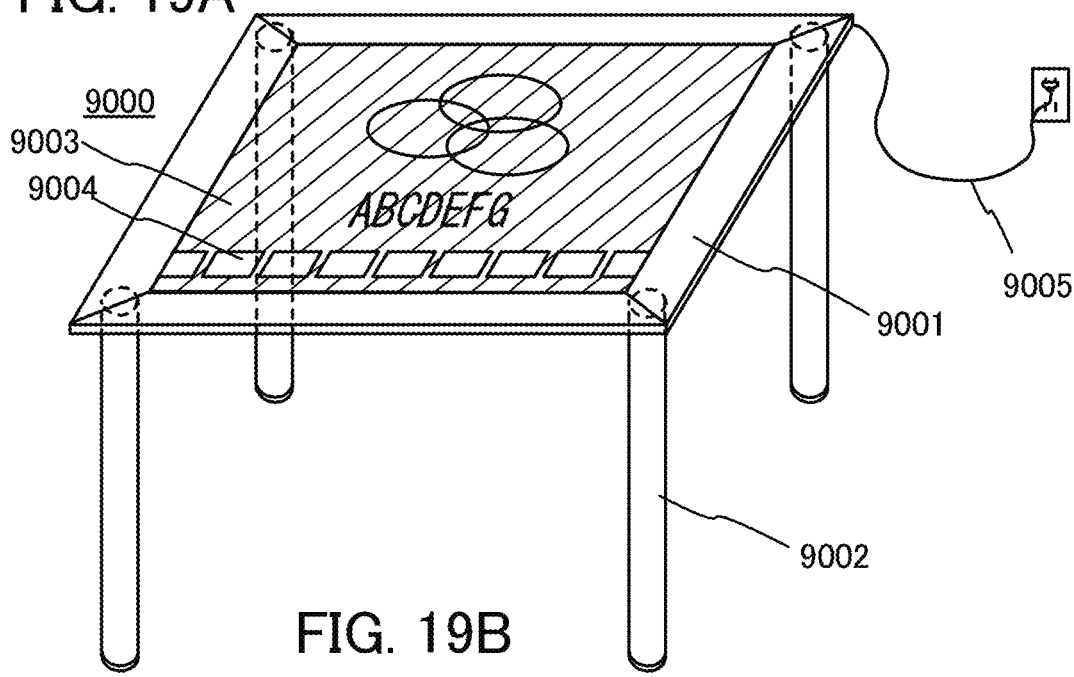
FIGS. 19A to 19C illustrate electronic devices.

FIG. 19A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used in the display portion 9003, so that the electronic device can have high reliability.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with use of the semiconductor device having an image sensor function, the display portion 9003 can have a touch input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 19B:
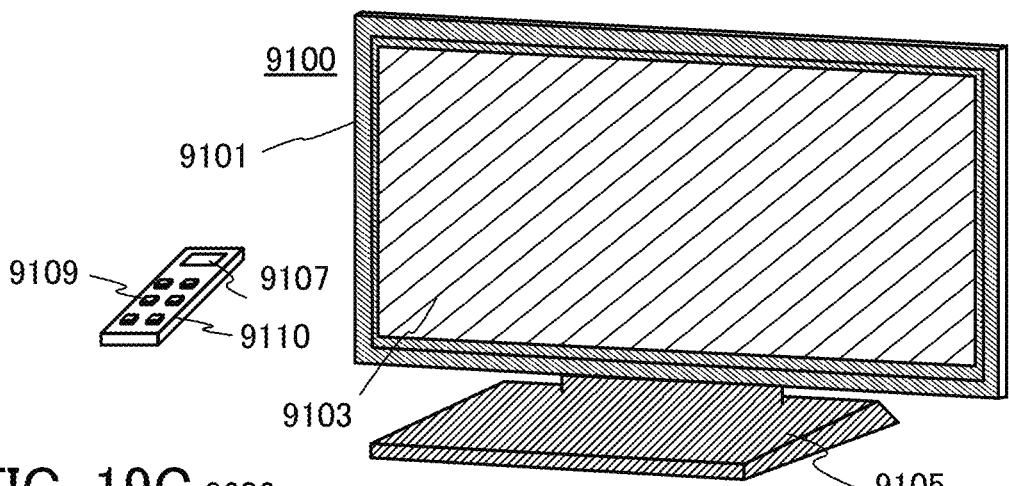

FIG. 19B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 19B is provided with a receiver, a modem, and the like. With use of the receiver, general television broadcasting can be received. Further, when the television set 9100 is connected to a communication network with or without wires via the modem, one-way (from a transmitter to a receiver) or two-way (between a transmitter and a receiver or between receivers) data communication can be performed.

The semiconductor device described in any of the above embodiments can be used in the display portions 9103 and 9107, so that the television set and the remote controller can have high reliability.

Figure 19C:
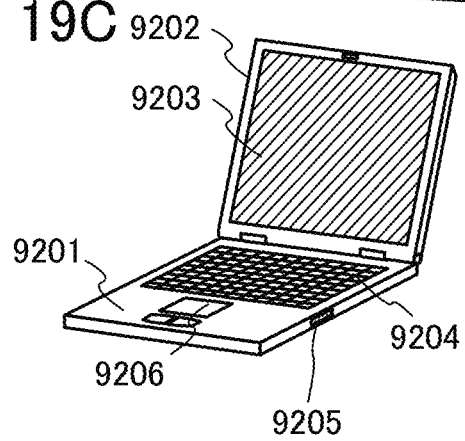

FIG. 19C illustrates a computer which includes a main body 9201, a housing 9202, a display portion 9203, a keyboard 9204, an external connection port 9205, a pointing device 9206, and the like.

The semiconductor device described in any of the above embodiments can be used in the display portion 9203, so that the computer can have high reliability.

Figure 20A:
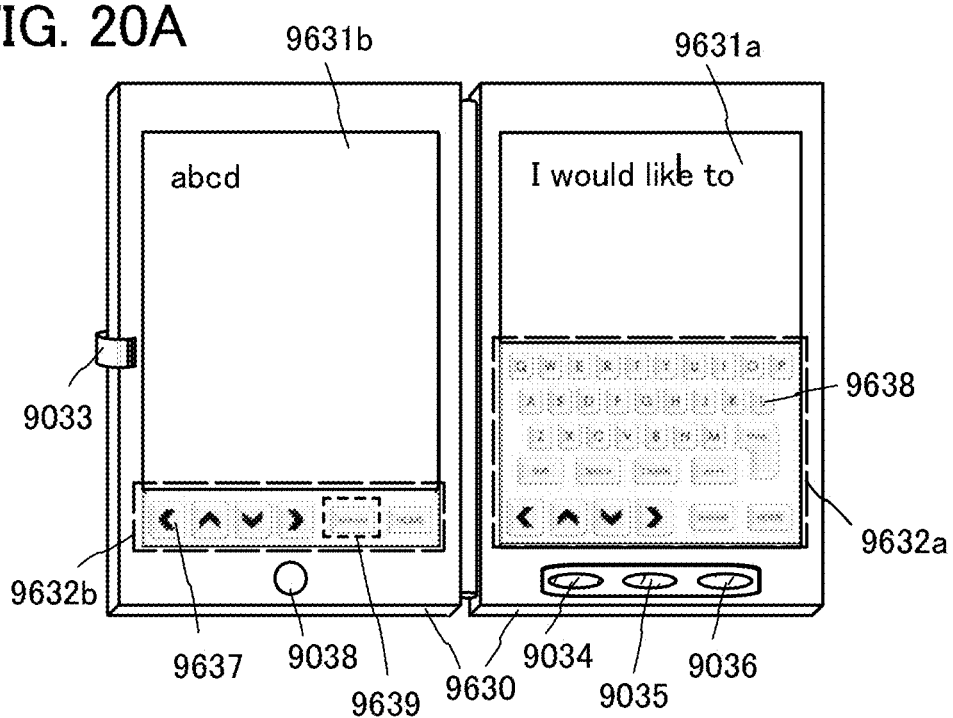
FIGS. 20A to 20C illustrate an electronic device.
Figure 20B:
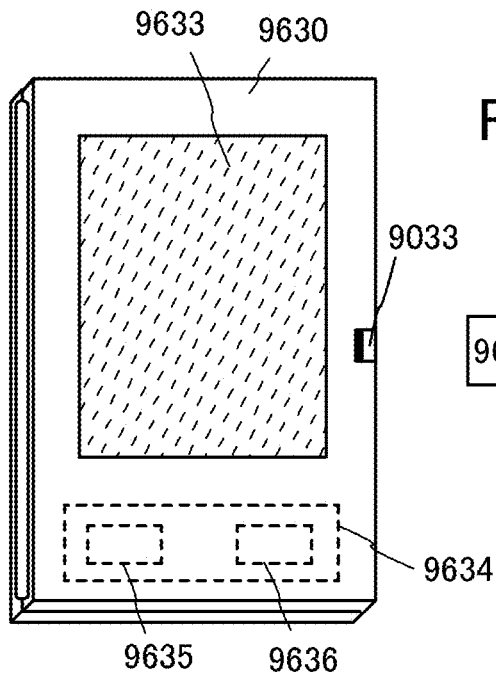

FIGS. 20A and 20B illustrate a tablet terminal that can be folded. In FIG. 20A, the tablet terminal is opened (unfolded) and includes a housing 9630, a display portion 9631 including a display portion 9631a and a display portion 9631b, a switch 9034 for switching display modes, a power switch 9035, a switch 9036 for switching to power-saving mode, a clip 9033, and an operation switch 9038.

The semiconductor device described in any of the above embodiments can be used in the display portion 9631a and the display portion 9631b, so that the tablet terminal can have high reliability.

Part of the display portion 9631a can be a touch panel region 9632a and data can be input when a displayed operation key 9638 is touched. Note that FIG. 20A shows, as an example, that half of the area of the display portion 9631a has only a display function and the other half of the area has a touch panel function. However, an embodiment of the present invention is not limited to this structure, and the whole display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display size in FIG. 20A, one embodiment of the present invention is not limited to this example. The display portion 9631a and the display portion 9631b may have different sizes or different display quality. For example, one of them may be a display panel that can display higher-definition images than the other.

FIG. 20B illustrates the tablet terminal which is folded, which includes the housing 9630, a solar cell 9633, a charge and discharge control circuit 9634, a battery 9635, and a DCDC converter 9636. Note that FIG. 20B shows an example of a structure of the charge and discharge control circuit 9634 that includes a battery 9635 and a DCDC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 20A and 20B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch panel, a display portion, an image signal processor, and the like. Note that the solar cell 9633 can be provided on one or both surfaces of the housing 9630, so that the battery 9635 can be charged efficiently. When a lithium ion battery is used as the battery 9635, there is an advantage of downsizing or the like.

Figure 20C:
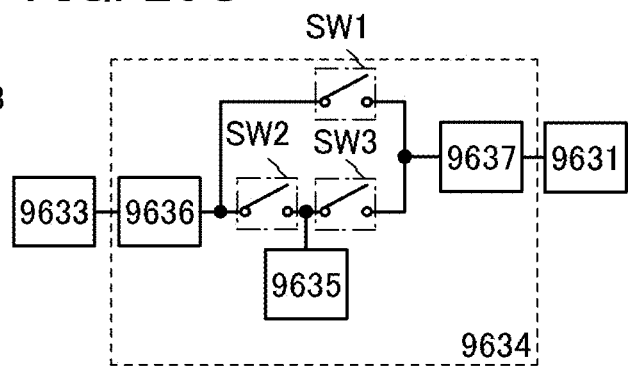

The structure and the operation of the charge and discharge control circuit 9634 illustrated in FIG. 20B will be described with reference to a block diagram in FIG. 20C. The solar cell 9633, the battery 9635, the DCDC converter 9636, a converter 9637, switches SW1 to SW3, and the display portion 9631 are illustrated in FIG. 20C, and the battery 9635, the DCDC converter 9636, the converter 9637, and the switches SW1 to SW3 correspond to the charge and discharge control circuit 9634 illustrated in FIG. 20B.

First, an example of the operation in the case where power is generated by the solar cell 9633 using external light is described. The voltage of power generated by the solar cell is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that the battery 9635 may be charged.

Note that the solar cell 9633 is described as an example of a power generation unit; however, without limitation thereon, the battery 9635 may be charged using another power generation unit such as a piezoelectric element or a thermoelectric conversion element (Peltier element). For example, the battery 9635 may be charged with a non-contact power transmission module which is capable of charging by transmitting and receiving power by wireless (without contact), or another charging unit may be used in combination.

The structures, methods, and the like described in this embodiment can be combined as appropriate with any of the structures, methods, and the like described in the other embodiments.

Example

In this example, electric characteristics of a transistor according to one embodiment of the present invention and those of a comparative transistor are evaluated. Results thereof will be described below.

Figure 21A:
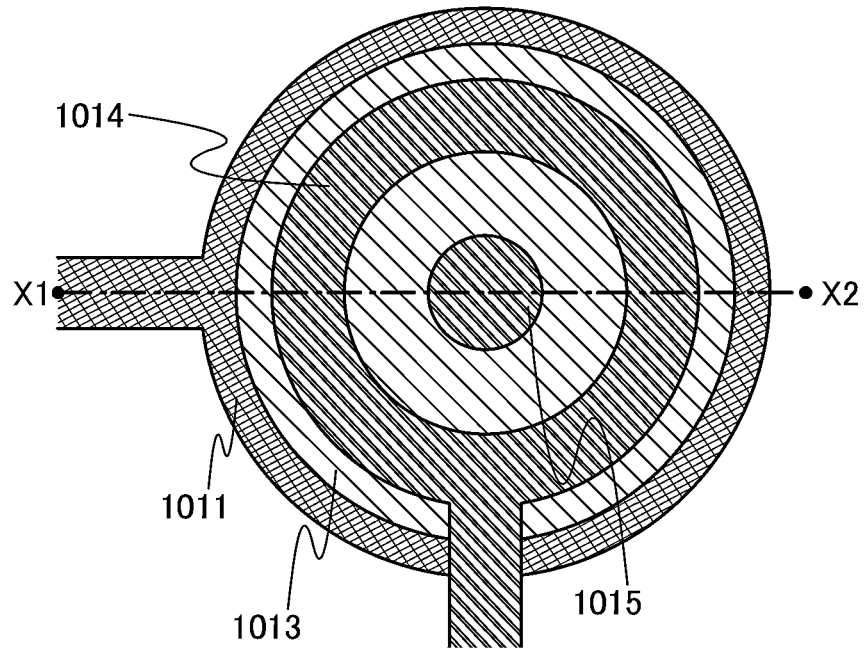
FIGS. 21A and 21B are a plan view and a cross-sectional view illustrating a transistor for Example.
Figure 21B:
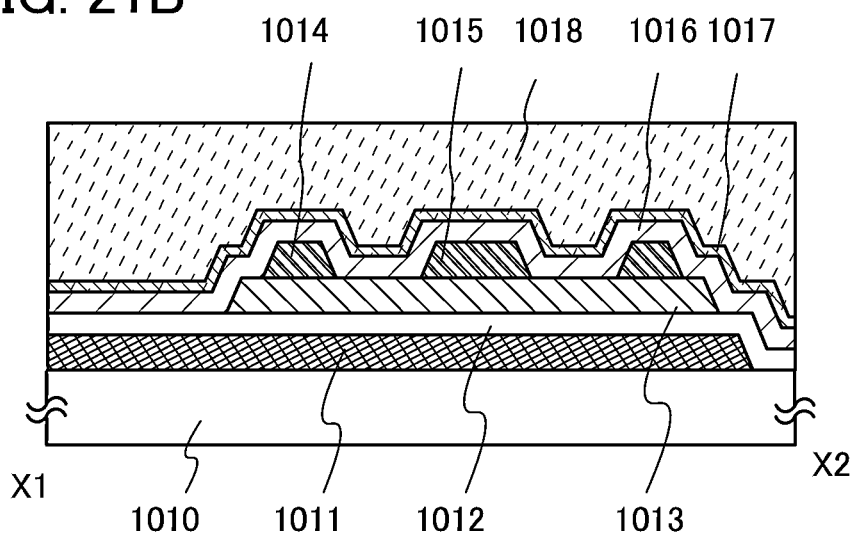
Figure 22A:
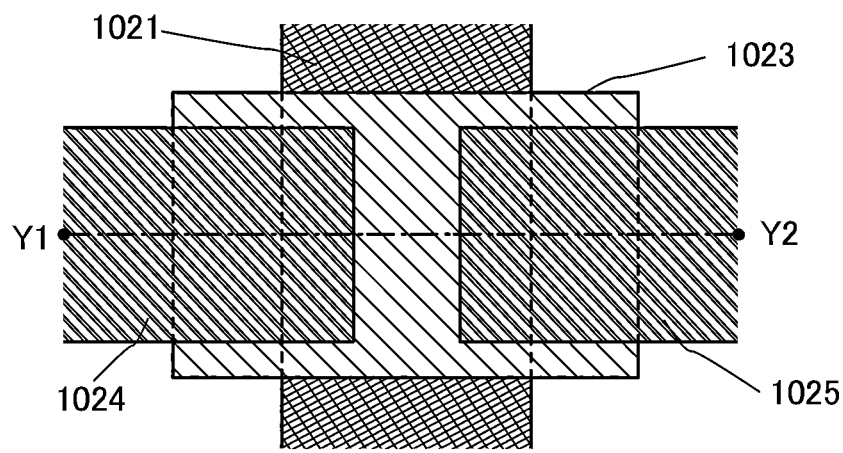
FIGS. 22A and 22B are a plan view and a cross-sectional view illustrating a transistor for Comparative Example.
Figure 22B:
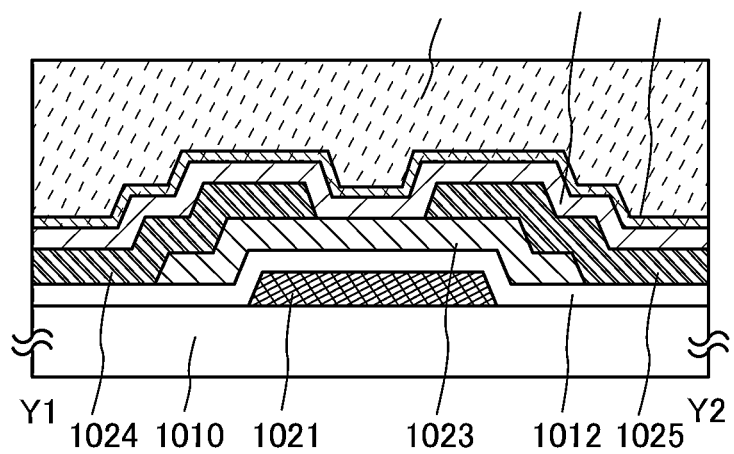

In this example, as one embodiment of the present invention, transistors 1100 illustrated in FIGS. 21A and 21B were manufactured under two conditions, and for comparison, transistors 1200 illustrated in FIGS. 22A and 22B were manufactured under the two conditions. FIG. 21A is a plan view of the transistor 1100, and FIG. 21B is a cross-sectional view taken along line X1-X2 in FIG. 21A. FIG. 22A is a plan view of the transistor 1200, and FIG. 22B is a cross-sectional view taken along line Y1-Y2 in FIG. 22A.

Manufacturing steps of the transistors 1100 and transistors 1200 are described below with reference to FIGS. 21A and 21B and FIGS. 22A and 22B. Note that the transistor 1100 and the transistor 1200 were formed over the same substrate.

Over a substrate 1010, a 100-nm-thick tungsten film was deposited by a sputtering method. By a photolithography step, resist masks were formed over the tungsten film, and the tungsten film was selectively etched, so that a gate electrode layer 1011 and a gate electrode layer 1021 were formed. After that, the resist masks were removed.

Next, a 50-nm-thick silicon nitride film (deposition conditions: $SiH_4/N_2$=50 sccm/5000 sccm; the deposition power, 150 W (RF); the deposition pressure, 40 Pa; and the substrate temperature, 350° C.) and a 200-nm-thick silicon oxynitride film (deposition conditions: $SiH_4/N_2O$=20 sccm/3000 sccm; the deposition power when the electrode area is 6000 cm², 100 W (RF); the deposition pressure, 40 Pa; and the substrate temperature, 350° C.) were deposited so as to cover the substrate 1010, the gate electrode layer 1011, and the gate electrode layer 1021, whereby a gate insulating film 1012 was formed.

Next, heat treatment was performed in a nitrogen atmosphere at 650° C. for 6 minutes. By the heat treatment, hydrogen, water, or the like included in the gate insulating film 1012 was removed.

Next, as an oxide semiconductor film, a 35-nm-thick IGZO film was deposited over the gate insulating film 1012 by a sputtering method using an oxide target where In:Ga:Zn=1:1:1 [atomic ratio]. The deposition conditions were as follows: the atmosphere was an atmosphere including argon and oxygen (argon/oxygen=50 sccm/50 sccm), the pressure was 0.6 Pa, the power was 5 kW, and the substrate temperature was 170° C.

Next, by a photolithography step, resist masks were formed over the oxide semiconductor film, and the oxide semiconductor film was selectively etched, so that an oxide semiconductor film 1013 was formed to overlap with the gate electrode layer 1011 and an oxide semiconductor film 1023 was formed to overlap with the gate electrode layer 1021. After that, the resist masks were removed.

Next, heat treatment was performed in a nitrogen atmosphere at 450° C. for 1 hour, and then heat treatment was further performed in a mixed atmosphere of nitrogen and oxygen at 450° C. for 1 hour.

Next, over the oxide semiconductor film 1013 and the oxide semiconductor film 1023, a 50-nm-thick tungsten film, a 400-nm-thick aluminum film, and a 100-nm-thick titanium film were deposited by a sputtering method.

Next, by a photolithography step, resist masks were formed over the titanium film, and the titanium film, the aluminum film, and the tungsten film were selectively etched, so that a source electrode layer 1014, a drain electrode layer 1015, a source electrode layer 1024, and a drain electrode layer 1025 were formed. After that, the resist masks were removed.

Next, heat treatment was performed in a mixed atmosphere of nitrogen and oxygen at 300° C. for 1 hour.

Next, a 30-nm-thick silicon oxynitride film was deposited by a PECVD method so as to cover the source electrode layer 1014, the drain electrode layer 1015, the source electrode layer 1024, the drain electrode layer 1025, and the like. The deposition conditions were as follows: $SiH_4/N_2$=20 sccm/3000 sccm; the deposition power was 100 W (RF); the deposition pressure when the electrode area was 6000 cm² was 200 Pa; and the substrate temperature was 350° C.

Next, oxygen was added to the silicon oxynitride film. This oxygen addition treatment was performed for 10 minutes with an ashing apparatus under the following conditions: the inductively coupled plasma (ICP) power was 0 W; the bias power was 4500 W; the pressure was 15.0 Pa; and the flow rate of an $O_2$ gas was 250 sccm.

Next, a 370-nm-thick silicon oxynitride film was further deposited over the above silicon oxynitride film by a PECVD method. The deposition conditions were as follows: $SiH_4/N_2$=230 sccm/4000 sccm; the deposition power when the electrode area was 6000 cm² was 150 W (RF); the deposition pressure was 200 Pa; and the substrate temperature was 220° C. As described above, the 30-nm-thick silicon oxynitride film to which oxygen was added and the 370-nm-thick silicon oxynitride film were stacked, whereby an insulating film 1016 was formed.

Next, heat treatment was performed in a mixed atmosphere of nitrogen and oxygen at 350° C. for 1 hour.

Then, in accordance with two conditions (Condition 1 and Condition 2) described below, the transistors 1100 and the transistors 1200 were manufactured. A difference between Condition 1 and Condition 2 is presence of an insulating film 1017.

Under Condition 1, after the heat treatment was performed, the silicon oxynitride film was coated with a 1.5-μm-thick acrylic resin, and the acrylic resin was baked in a nitrogen atmosphere at 250° C. for 1 hour. In such a manner, a planarization insulating film 1018 was formed.

Through the above steps, the transistor 1100 and the transistor 1200 were manufactured according to Condition 1.

Under Condition 2, after the heat treatment was performed, a 5-nm-thick aluminum film was deposited by a sputtering method, and then, oxygen was added to the aluminum film, whereby the aluminum film was oxidized to form an aluminum oxide film. This oxygen addition treatment was performed for 10 minutes with an ashing apparatus under the following conditions: the ICP power was 0 W; the bias power was 4500 W; the pressure was 15.0 Pa; and the flow rate of an $O_2$ gas was 250 sccm. In such a manner, the insulating film 1017 was formed.

Next, the insulating film 1017 (aluminum oxide film) was coated with a 1.5-μm-thick acrylic resin, and the acrylic resin was baked in a nitrogen atmosphere at 250° C. for 1 hour. In such a manner, the planarization insulating film 1018 was formed. Note that in order to evaluate electric characteristics, an opening portion through which a probe was in contact with the transistor was formed in the planarization insulating film 1018, the insulating film 1017, and the insulating film 1016.

Through the above steps, the transistor 1100 and the transistor 1200 were manufactured according to Condition 2.

Next, electric characteristics of the transistor 1100 and the transistor 1200 manufactured in accordance with Condition 1 or Condition 2 were evaluated. Note that in order to evaluate electric characteristics, an opening portion was provided in the planarization insulating film 1018, the insulating film 1017, and the insulating film 1016.

Figure 23A:
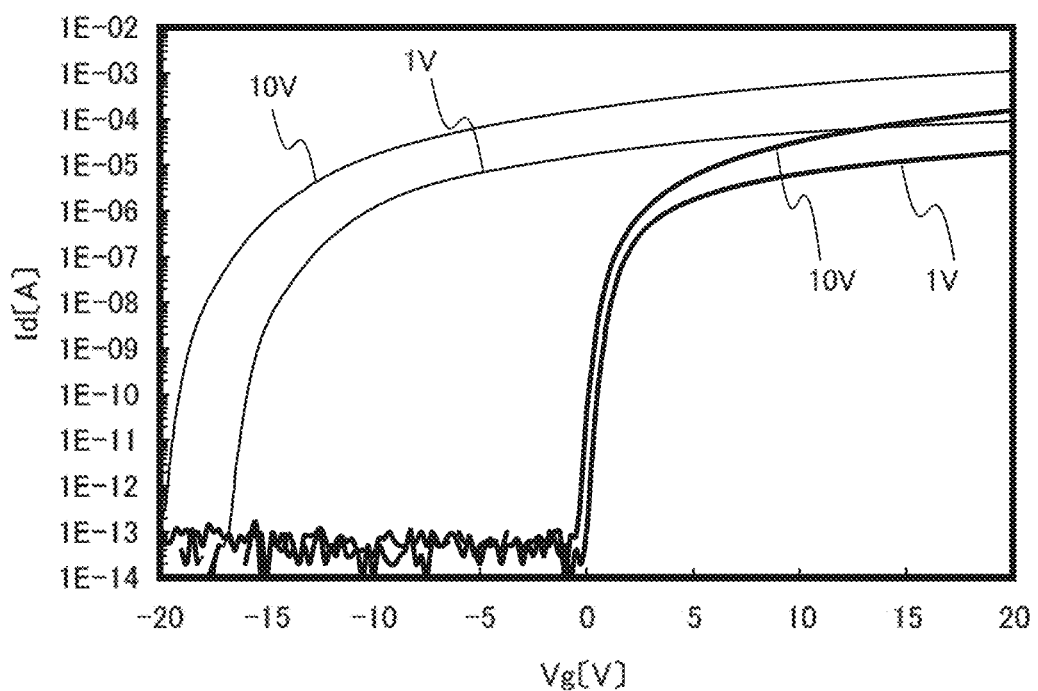
FIGS. 23A and 23B are graphs showing electric characteristics of transistors.
Figure 23B:
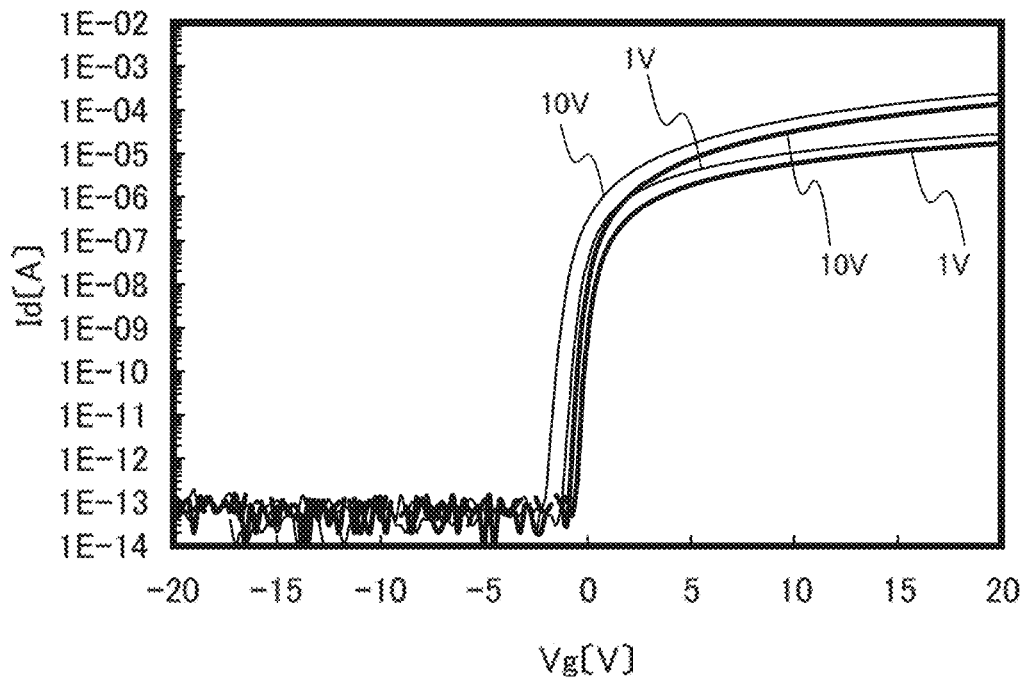

FIG. 23A shows results of measured Vg-Id characteristics of the transistor 1100 and the transistor 1200 manufactured in accordance with Condition 1, and FIG. 23B shows results of measured Vg-Id characteristics of the transistor 1100 and the transistor 1200 manufactured in accordance with Condition 2. In FIGS. 23A and 23B, bold lines represent characteristics of the transistors 1100, and thinner lines represent characteristics of the transistors 1200. The channel length L and the channel width W of the transistor 1100 were 4 μm and 41 μm, respectively. The channel length L and the channel width W of the transistor 1200 were 4 μm and 50 μm, respectively. In addition, the voltages Vd in measurement were +1 V and +10 V, and the voltage Vs was 0V.

In both cases where the transistor 1100 was manufactured in accordance with Condition 1 and where the transistor 1100 was manufactured in accordance with Condition 2, the threshold voltages were higher than 0 V, and thus normally-off electric characteristics were observed. On the other hand, while the threshold voltage of the transistor 1200 manufactured in accordance with Condition 2 was higher than 0 V, the threshold voltage of the transistor 1200 manufactured in accordance with Condition 1 was a negative value, and thus normally-on electric characteristics were observed.

In the transistor 1200 manufactured in accordance with Condition 1, the following are considered to be caused: removal of hydrogen and compensation for oxygen vacancies at the end portion of the oxide semiconductor film 1023 were insufficiently conducted; thus, the carrier density at the end portion of the oxide semiconductor film 1023 was increased. Accordingly, a low resistance region was considered to be formed at the end portion. Further, due to a structure in which the end portion of the oxide semiconductor film 1023 overlaps with the gate electrode layer 1021, a parasitic channel was considered to be formed with a threshold voltage of a negative value. As a result, as shown FIG. 23A, it is considered that the threshold voltage of the transistor 1200 is a negative value and has normally-on characteristics.

In the transistor 1200 manufactured in accordance with Condition 2, an aluminum oxide film was formed as the insulating film 1017 over the insulating film 1016. The aluminum oxide film is a film through which oxygen hardly passes. With use of the aluminum oxide film, oxygen added to the insulating film 1016 (silicon oxynitride film) can be prevented from being released and extracted to the outside of the aluminum oxide film. Thus, it is considered that oxygen added to the silicon oxynitride film can be supplied to the oxide semiconductor film 1023 and accordingly oxygen vacancies at the end portion of the oxide semiconductor film 1023 was able to be reduced. Therefore, a reduction in resistance at the end portion of the oxide semiconductor film 1023 was suppressed, and even when the end portion of the oxide semiconductor film 1023 overlaps with the gate electrode layer 1021, formation of a parasitic channel was probably suppressed. As a result, as shown in FIG. 23B, it is considered that such electric characteristics that the threshold voltage of the transistor 1200 is higher than 0 V, i.e., normally-off electric characteristics, were able to be obtained.

On the other hand, in the case of the transistor 1100, a region where the source electrode layer 1014 and the drain electrode layer 1015 face each other (channel region), does not overlap with the end portion of the oxide semiconductor film 1013. Thus, even when the resistance of the end portion of the oxide semiconductor film 1013 is reduced, a parasitic channel is not formed. As a result, as shown in FIGS. 23A and 23B, both of the transistors 1100 manufactured under Condition 1 and Condition 2 are considered to have the threshold voltage higher than 0 V and obtain normally-off electric characteristics.

From the above results, it is found that the parasitic channel formed at the end portion of the oxide semiconductor film is affected by the threshold voltage of the transistor.

In addition, the above results indicate that the transistor according to one embodiment of the present invention has better electric characteristics.

This application is based on Japanese Patent Application serial no. 2012-022457 filed with Japan Patent Office on Feb. 3, 2012, the entire contents of which are hereby incorporated by reference.

What is claimed is:

1. A semiconductor device comprising:
a gate electrode layer;
a gate insulating film over the gate electrode layer;
an oxide semiconductor film over the gate insulating film;
a first electrode layer being over the oxide semiconductor film and overlapping with the gate electrode layer; and
a second electrode layer covering an outer edge portion of the oxide semiconductor film,
wherein an outer edge portion of the first electrode layer is positioned on an inner side than an outer edge portion of the gate electrode layer,
wherein the second electrode layer has a multi-layered structure comprising a first layer, a second layer and a third layer,
wherein the first layer and the second layer directly contact each other at an inner edge portion and at an outer edge portion of the second electrode layer, and
wherein the third layer is entirely wrapped with the first layer and the second layer.

2. A semiconductor device comprising:
a gate electrode layer having an opening portion, the opening portion being surrounded with an inner edge portion of the gate electrode layer;
a gate insulating film over the gate electrode layer;
an oxide semiconductor film over the gate insulating film;
a first electrode layer being over the oxide semiconductor film and overlapping with the inner edge portion of the gate electrode layer; and
a second electrode layer covering an outer edge portion of the oxide semiconductor film,
wherein an outer edge portion of the first electrode layer is positioned on an inner side than an outer edge portion of the gate electrode layer,
wherein the second electrode layer has a multi-layered structure comprising a first layer, a second layer and a third layer,
wherein the first layer and the second layer directly contact each other at an inner edge portion and at an outer edge portion of the second electrode layer, and
wherein the third layer is entirely wrapped with the first layer and the second layer.

3. The semiconductor device according to claim 1, wherein a planar shape of the first electrode layer is a rectangle.

4. The semiconductor device according to claim 1, wherein the oxide semiconductor film contains indium, gallium, and zinc.

5. The semiconductor device according to claim 1, wherein the second electrode layer is thicker than the first electrode layer.

6. The semiconductor device according to claim 1, wherein a shape of an outer edge of the first electrode layer is the same as that of an inner edge of the second electrode layer.

7. The semiconductor device according to claim 1, wherein the gate electrode layer has an opening portion.

8. The semiconductor device according to claim 2, wherein a planar shape of the first electrode layer is a rectangle.

9. The semiconductor device according to claim 2, wherein the oxide semiconductor film contains indium, gallium, and zinc.

10. The semiconductor device according to claim 2, wherein the second electrode layer is thicker than the first electrode layer.

11. The semiconductor device according to claim 2, wherein a shape of an outer edge of the first electrode layer is the same as that of an inner edge of the second electrode layer.

12. The semiconductor device according to claim 1,
wherein the first electrode layer has a multi-layered structure comprising a fourth layer and a fifth layer, and
wherein an entire upper face of the fourth layer is directly contacted with an entire bottom face of the fifth layer.

13. The semiconductor device according to claim 2,
wherein the first electrode layer has a multi-layered structure comprising a fourth layer and a fifth layer, and
wherein an entire upper face of the fourth layer is directly contacted with an entire bottom face of the fifth layer.

* * * * *